US012635193B2

(12) United States Patent
Yao et al.

(10) Patent No.: US 12,635,193 B2
(45) Date of Patent: May 19, 2026

(54) SEMICONDUCTOR DEVICE AND METHOD OF FORMING SAME

(71) Applicant: Taiwan Semiconductor Manufacturing Co., Ltd., Hsinchu (TW)

(72) Inventors: Hsuan-Hsiao Yao, Hsinchu (TW); Po-Kai Hsiao, Yuanlin City (TW); Fan-Cheng Lin, Hsinchu (TW); Tsai-Yu Huang, Taoyuan City (TW); Huicheng Chang, Tainan City (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 892 days.

(21) Appl. No.: 17/751,367

(22) Filed: May 23, 2022

(65) Prior Publication Data

US 2023/0378261 A1     Nov. 23, 2023

(51) Int. Cl.
| | |
|---|---|
| *H10D 62/10* | (2025.01) |
| *H10D 30/01* | (2025.01) |
| *H10D 30/67* | (2025.01) |
| *H10D 64/01* | (2025.01) |
| *H10D 84/01* | (2026.01) |
| *H10D 84/03* | (2025.01) |

(52) U.S. Cl.
CPC ......... *H10D 62/118* (2025.01); *H10D 30/031* (2025.01); *H10D 30/6713* (2025.01); *H10D 30/6735* (2025.01); *H10D 30/6757* (2025.01); *H10D 64/017* (2025.01); *H10D 84/0128* (2025.01); *H10D 84/013* (2025.01); *H10D 84/0158* (2025.01); *H10D 84/038* (2025.01)

(58) Field of Classification Search
CPC .......................... H10D 62/118; H10D 30/6735
See application file for complete search history.

(56) References Cited

U.S. PATENT DOCUMENTS

| | | | |
|---|---|---|---|
| 5,464,792 A | * | 11/1995 | Tseng ................ H01L 21/28176 438/786 |
| 9,209,247 B2 | | 12/2015 | Colinge et al. |
| 9,236,267 B2 | | 1/2016 | De et al. |
| 9,412,817 B2 | | 8/2016 | Yang et al. |
| 9,412,828 B2 | | 8/2016 | Ching et al. |
| 9,472,618 B2 | | 10/2016 | Oxland |
| 9,502,265 B1 | | 11/2016 | Jiang et al. |
| 9,520,482 B1 | | 12/2016 | Chang et al. |

(Continued)

FOREIGN PATENT DOCUMENTS

| | | |
|---|---|---|
| TW | 202141802 A | 11/2021 |

*Primary Examiner* — Marlon T Fletcher
*Assistant Examiner* — Samuel Jonathan Smith
(74) *Attorney, Agent, or Firm* — Slater Matsil, LLP

(57) ABSTRACT

In an embodiment, a method of forming a semiconductor device includes: forming a first oxide layer over a semiconductor fin structure; performing a first nitridation process to convert the first oxide layer to an oxynitride layer; depositing a silicon-containing layer over the oxynitride layer; performing a first anneal on the silicon-containing layer, wherein after performing the first anneal, the oxynitride layer has a higher nitrogen atomic concentration at an interface with the semiconductor fin structure than in a bulk region of the oxynitride layer; and forming a dummy gate structure over the silicon-containing layer.

20 Claims, 65 Drawing Sheets

(56)          References Cited

U.S. PATENT DOCUMENTS

| | | | |
|---|---|---|---|
| 9,536,738 B2 | 1/2017 | Huang et al. | |
| 9,576,814 B2 | 2/2017 | Wu et al. | |
| 9,608,116 B2 | 3/2017 | Ching et al. | |
| 2019/0006485 A1* | 1/2019 | Kim | H10D 64/015 |
| 2019/0131382 A1* | 5/2019 | Lu | H10D 64/017 |
| 2020/0161574 A1 | 5/2020 | Vasen et al. | |
| 2021/0234018 A1 | 7/2021 | Xie et al. | |
| 2021/0328020 A1 | 10/2021 | Chung et al. | |
| 2022/0115498 A1 | 4/2022 | Chu et al. | |

* cited by examiner

SEMICONDUCTOR DEVICE AND METHOD OF FORMING SAME

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
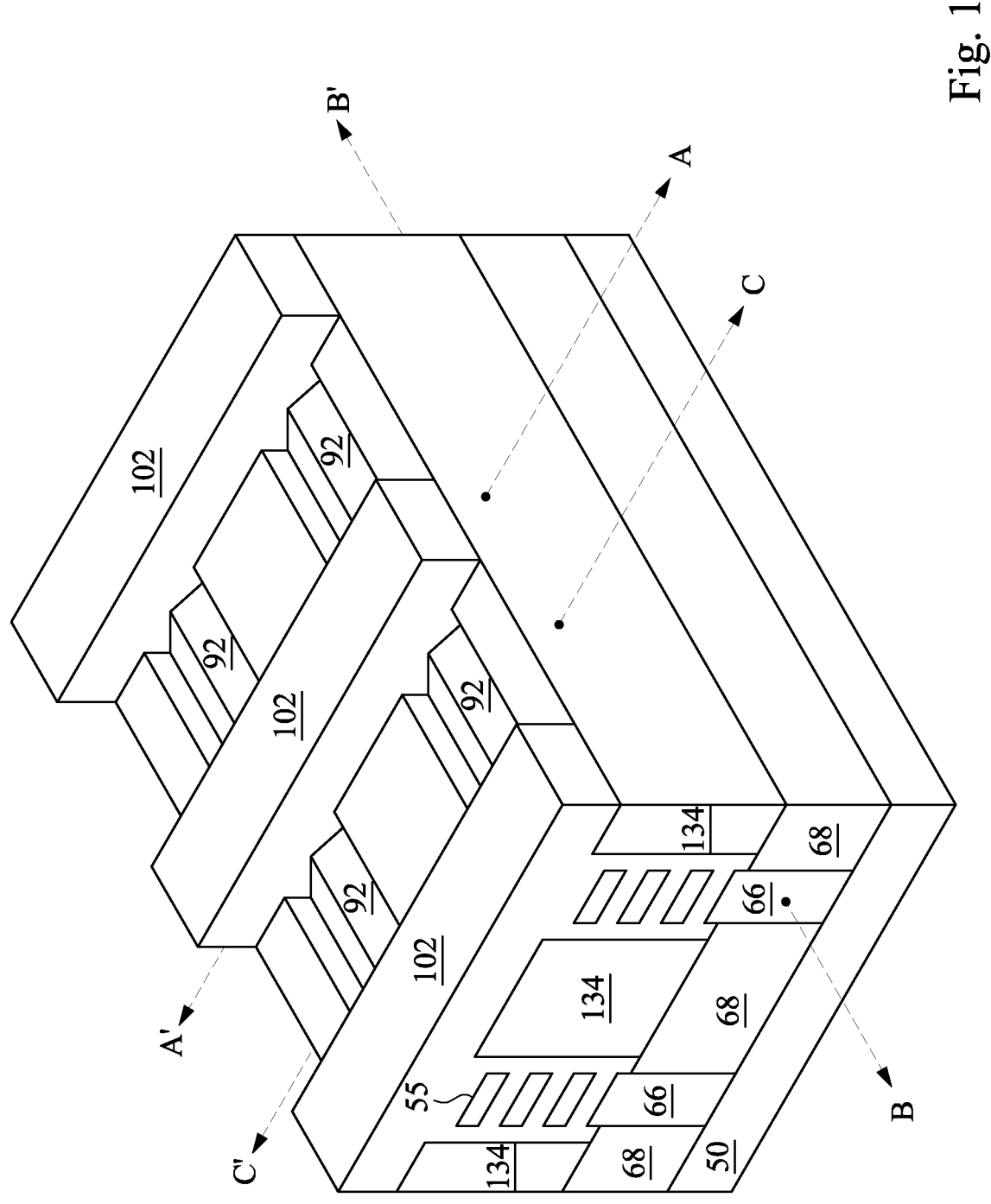
FIG. 1 illustrates an example of a nanostructure device, such as a field-effect transistor (nano-FET), in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments are described below in a particular context, for example, a die comprising nanostructure devices, such as nano-wire FETs, nano-sheet FETs, or other gate all-around (GAA) transistors. Various embodiments may be applied, however, to dies comprising other types of transistors (e.g., fin field effect transistors (FinFETs), planar transistors, or the like) in lieu of or in combination with the nanostructure devices. The disclosed embodiments include forming one or more diffusion barrier layers (e.g., nitrogen-containing layers) during the fabrication of nanostructure devices. For example, after forming fins comprising stacks of nanostructures (e.g., alternating layers of channel regions and sacrificial layers), a first diffusion barrier layer may be formed over and around sidewalls of the nanostructures. As a result, the first diffusion barrier layer will inhibit diffusion of elements, dopants, and impurities from subsequently formed adjacent layers and features into the sidewalls of the nanostructures, and vice versa. In addition, a second diffusion barrier layer may be formed at endpoints of the nanostructures before performing the steps of forming inner spacers and source/drain regions (e.g., a source region and/or a drain region) at those endpoints of the nanostructures. As a result, the second diffusion barrier layer will inhibit diffusion of elements, dopants, and impurities from the subsequently formed source/drain regions into the endpoints of the nano-structures, and vice versa. The transistors may be fabricated with improved yield, performance, and reliability, for example, due to having improved control over the composition and crystal structure of the channel regions. Advantages may be achieved in fabricating transistors with one or both of the diffusion barrier layers.

FIG. 1 illustrates an example of nanostructure devices (e.g., nanowire FETs, nanosheet FETs (Nano-FETs), or the like) in a three-dimensional view, in accordance with some embodiments. The nanostructure devices comprise nanostructures 55 (e.g., nanosheets, nanowire, or the like) over fins 66 on a substrate 50 (e.g., a semiconductor substrate), wherein the nanostructures 55 act as channel regions for the nanostructure devices. The nanostructure 55 may include p-type nanostructures, n-type nanostructures, or a combination thereof. Shallow trench isolation (STI) regions 68 are disposed between adjacent fins 66, which may protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring STI regions 68.

Gate dielectric layers 100 (not specifically illustrated) are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

Insulating fins 134, which may also be referred to as hybrid fins or dielectric fins, are disposed over the STI regions 68, and between adjacent epitaxial source/drain regions 92. The insulating fins 134 block epitaxial growth during the epitaxial source/drain regions 92 formation to prevent coalescing of adjacent epitaxial source/drain regions 92. For example, in some embodiments, the insulating fins 134 may be formed to separate the epitaxial source/drain regions 92 of adjacent transistors.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through epitaxial source/drain regions 92 of the nanostructure devices. Subsequent figures refer to these reference cross-sections for clarity.

Some embodiments discussed herein are discussed in the context of nanostructure devices formed using a gate-last process. In other embodiments, a gate-first process may be used. Also, some embodiments contemplate aspects used in planar devices, such as planar FETs or in fin field-effect transistors (FinFETs).

FIGS. 2 through 28C include cross-sectional views of intermediate stages in the manufacturing of nanostructure devices, in accordance with some embodiments. FIGS. 2 through 11, 12A, 13A, 14A, 15A, 16A, 17A, 18A, 19A, 20A, 21A, 22A, 23A, 24A, 25A, 26A, 27A, and 28A illustrate reference cross-section A-A' illustrated in FIG. 1. FIGS. 12B, 13B, 14B, 15B, 16B, 17B, 17D, 18B, 18D, 19B, 20B, 21B, 22B, 23B, 24B, 25B, 26B, 27B, and 28B illustrate reference cross-section B-B' illustrated in FIG. 1. FIGS. 12C, 13C, 14C, 15C, 16C, 17C, 18C, 19C, 20C, 21C, 22C, 23C, 24C, 25C, 26C, 27C, and 28C illustrate reference cross-section C-C' illustrated in FIG. 1.

Figure 2:
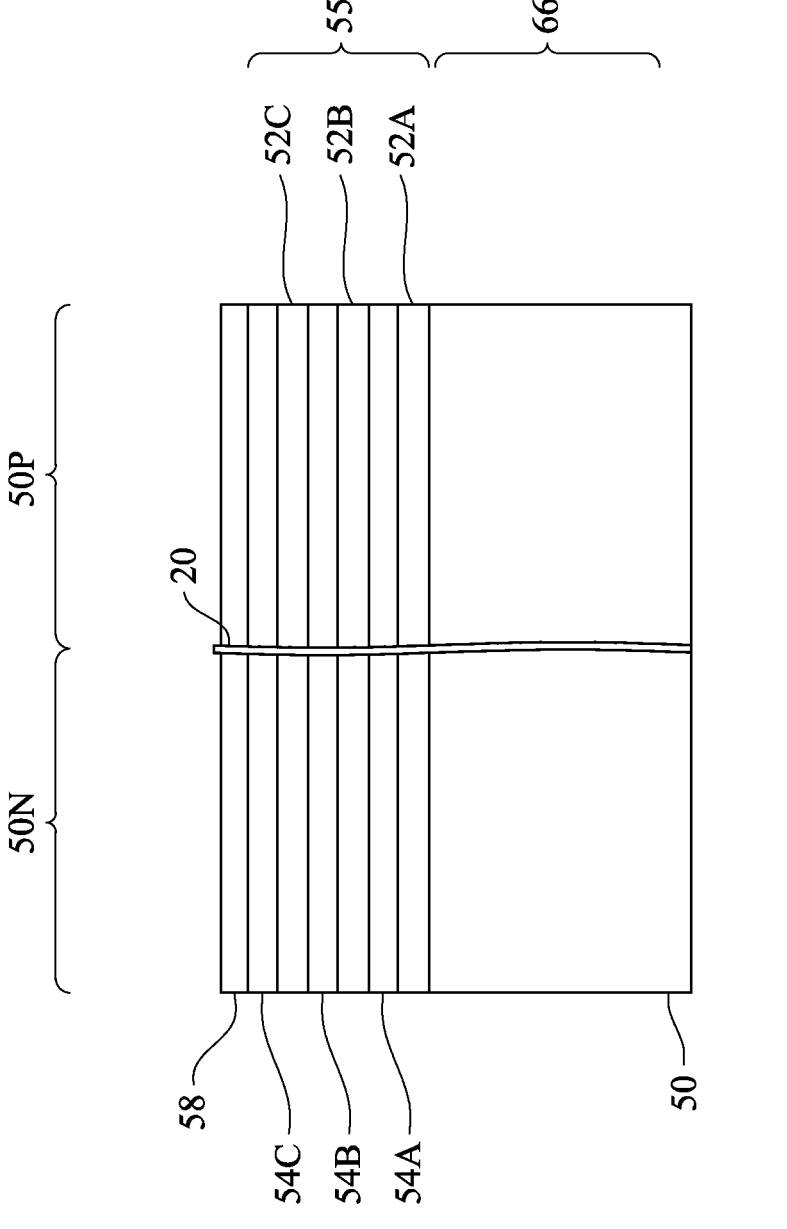
FIGS. 2, 3, 4, 5, 6, 7, 8, 9, 10, 11, 12A, 12B, 12C, 13A, 13B, 13C, 14A, 14B, 14C, 15A, 15B, 15C, 16A, 16B, 16C, 17A, 17B, 17C, 17D, 18A, 18B, 18C, 18D, 19A, 19B, 19C, 20A, 20B, 20C, 21A, 21B, 21C, 22A, 22B, 22C, 23A, 23B, 23C, 24A, 24B, 24C, 25A, 25B, 25C, 26A, 26B, 26C, 27A, 27B, 27C, and 27D are cross-sectional views of intermediate stages in the manufacturing of nanostructure devices, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nanostructure devices, and the p-type region 50P can be for forming p-type devices, such as PMOS transistors, e.g., p-type nanostructure devices. The n-type region 50N may be physically separated from the p-type region 50P (as illustrated by divider 20), and any number of device features (e.g., other active devices, doped regions, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nanostructure devices in the p-type region 50P. Also, the first semiconductor layers 51 will be removed and the second semiconductor layers 53 will be patterned to form channel regions of nanostructure devices in the n-type region 50N. Nevertheless, in some embodiments the first semiconductor layers 51 may be removed and the second semiconductor layers 53 may be patterned to form channel regions of nanostructure devices in the n-type region 50N, and the second semiconductor layers 53 may be removed and the first semiconductor layers 51 may be patterned to form channel regions of nanostructure devices in the p-type region 50P.

Figure 28A:
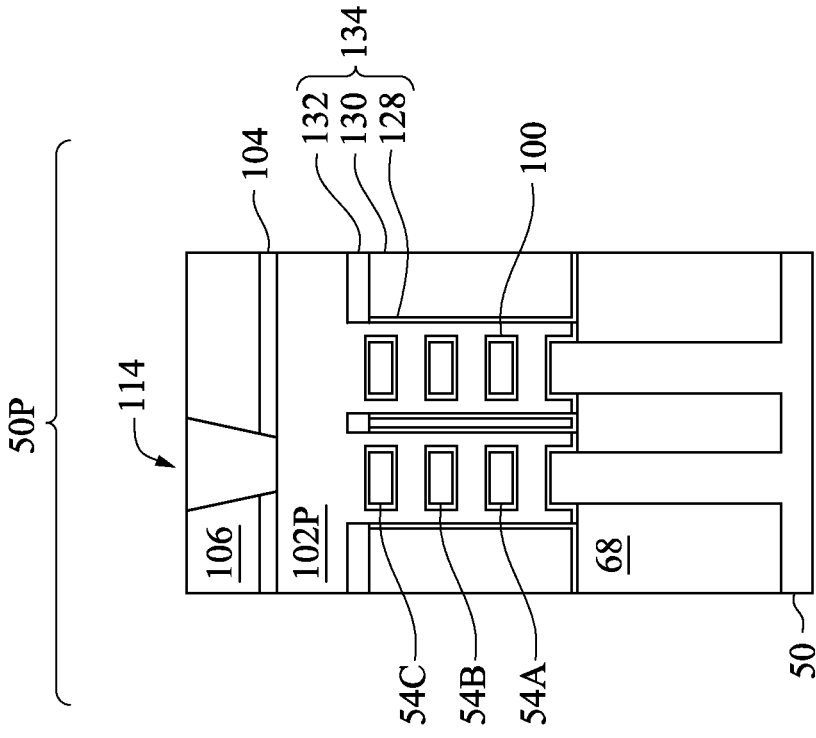
FIGS. 28A, 28B, and 28C are cross-sectional views of nanostructure devices, in accordance with some embodiments.
Figure 28A:
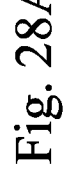
Figure 28A:
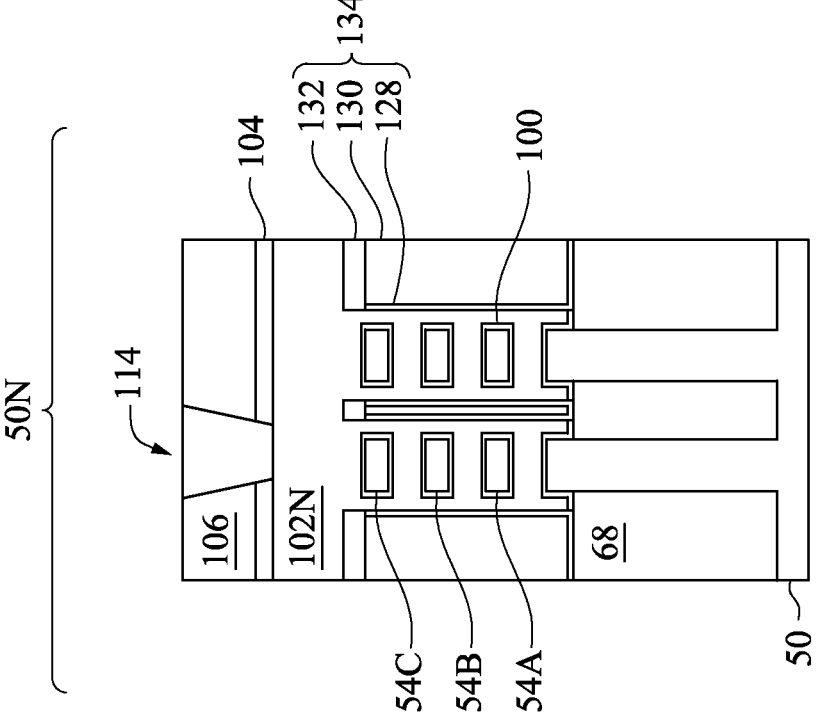
Figure 28B:
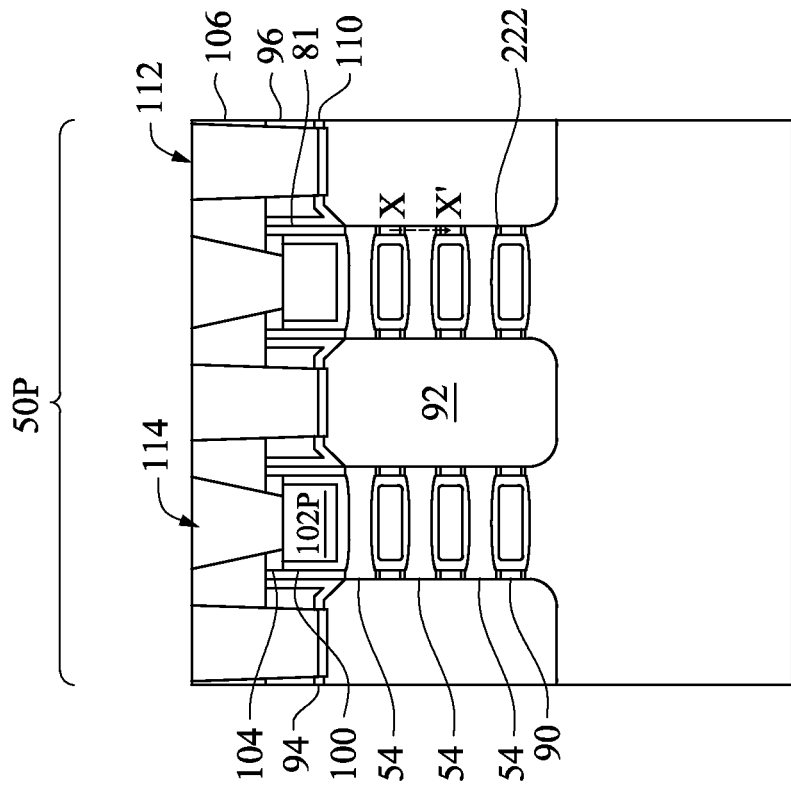
Figure 28B:
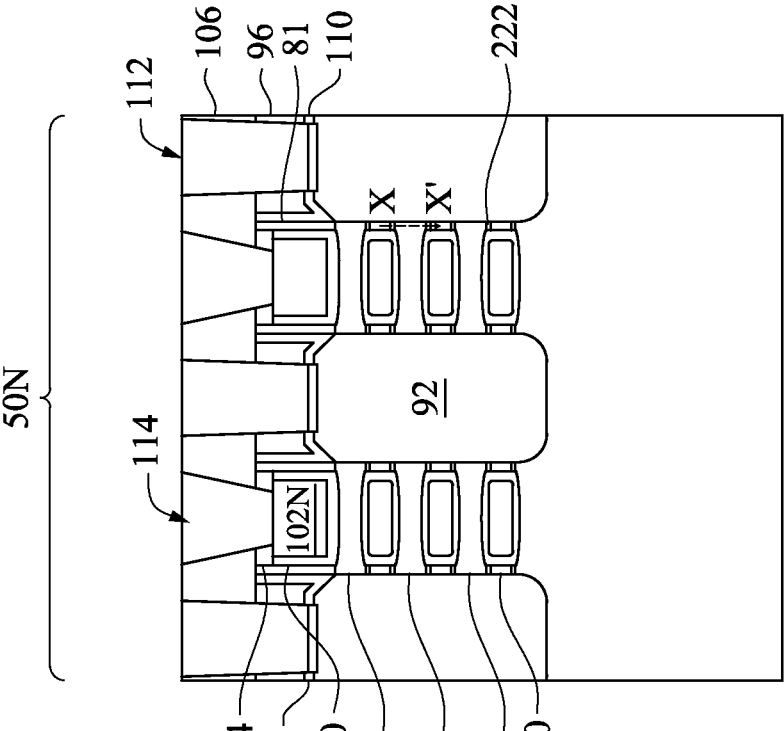
Figure 28C:
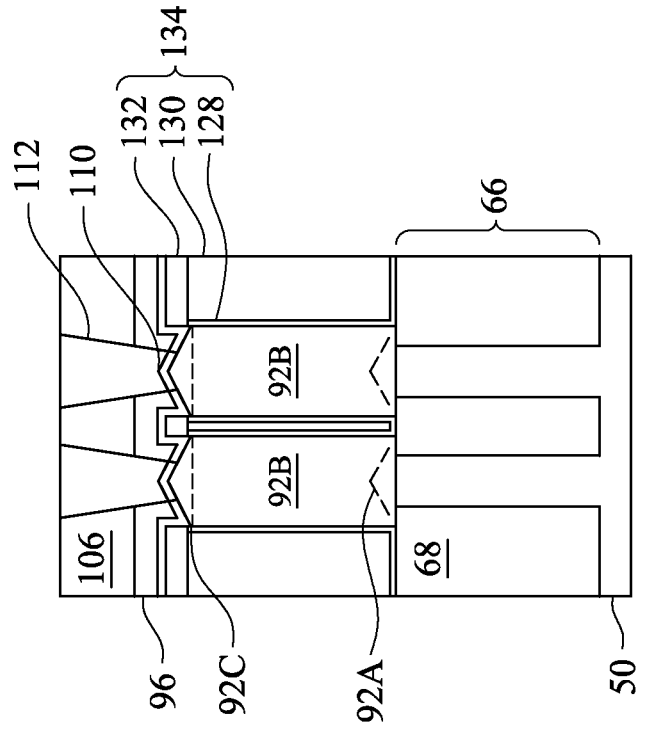

In still other embodiments, the first semiconductor layers 51 may be removed and the second semiconductor layers 53 may be patterned to form channel regions of nanostructure devices in both the n-type region 50N and the p-type region 50P. In other embodiments, the second semiconductor layers 53 may be removed and the first semiconductor layers 51 may be patterned to form channel regions of nano-FETs in both the n-type region 50N and the p-type region 50P. In such embodiments, the channel regions in both the n-type region 50N and the p-type region 50P may have a same material composition (e.g., silicon, or the another semiconductor material) and be formed simultaneously. FIGS. 28A-28C illustrate a structure resulting from such embodiments where the channel regions in both the p-type region 50P and the n-type region 50N comprise silicon, for example.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53, for example, forming a crystalline super-lattice. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. As such, each of the layers of the multi-layer stack 64 may be formed to follow the crystallinity of the underlying layers as well as the substrate 50. In various embodiments, the first semiconductor layers 51 may be formed of a first semiconductor material suitable for p-type nanostructure devices, such as silicon germanium (e.g., crystalline silicon germanium being part of the super-lattice), or the like, and the second semiconductor layers 53 may be formed of a second semiconductor material suitable for n-type nanostructure devices, such as silicon (e.g., crystalline silicon being part of the super-lattice form), silicon carbon, or the like. The multi-layer stack 64 is illustrated as having a bottommost semiconductor layer suitable for p-type nanostructure devices for illustrative purposes. In some embodiments, multi-layer stack 64 may be formed such that the bottommost layer is a semiconductor layer suitable for n-type nanostructure devices.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type nanostructure devices. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type nanostructure devices.

Figure 3:
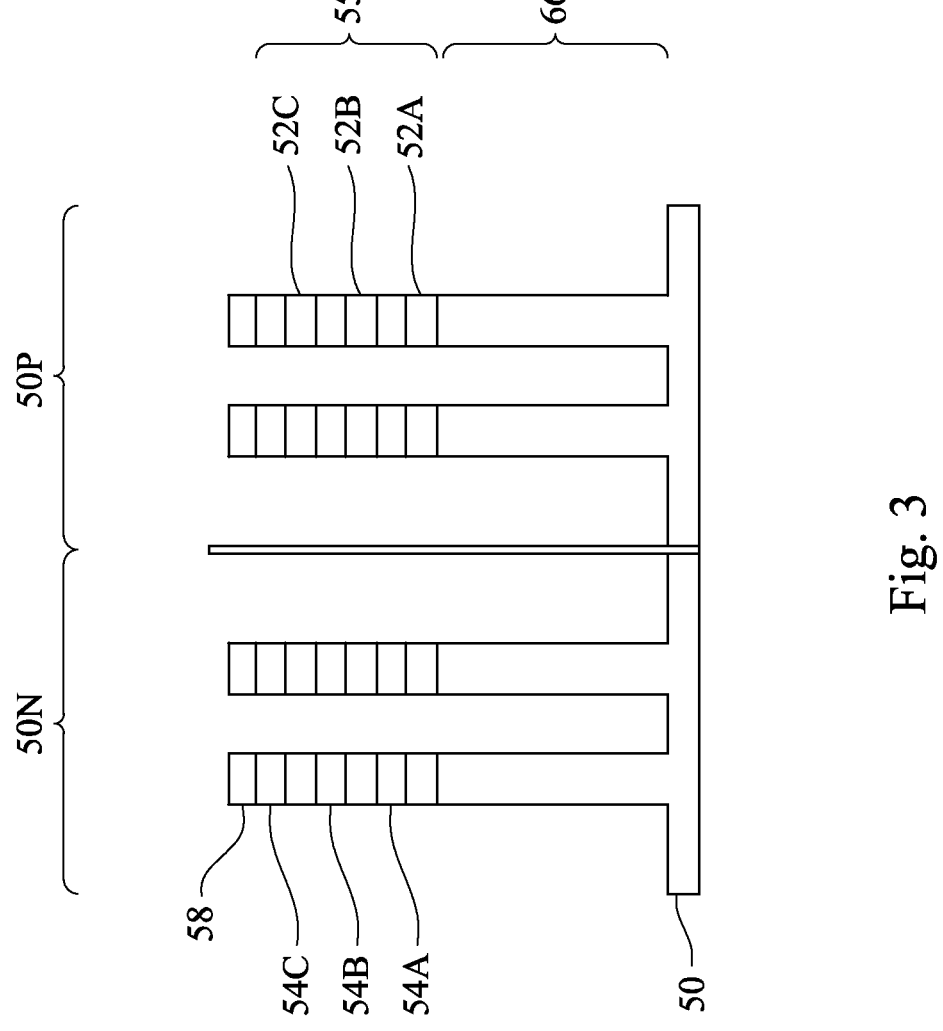

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as a mask 58 to pattern the fins 66 and the nanostructures 55.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
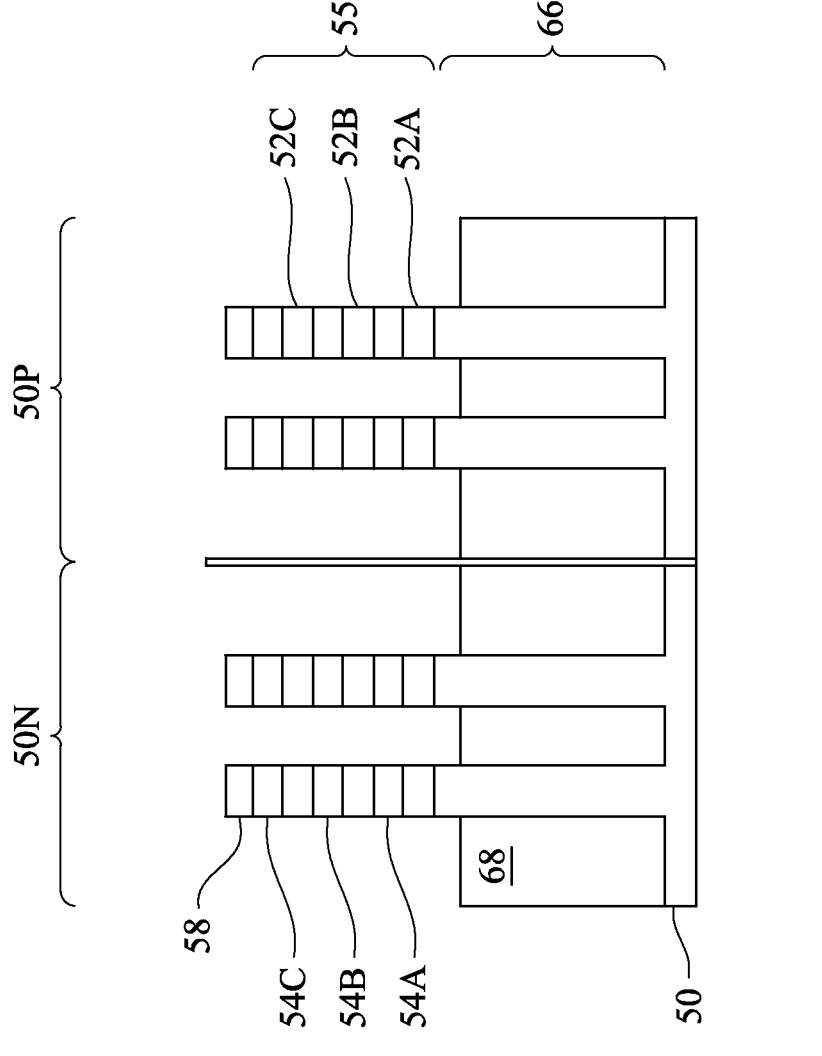

In FIG. 4, STI regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process may expose the mask 58 or remove the mask 58 to expose the nanostructures 55 such that top surfaces of the mask 58 or the nanostructures 55 and the insulation material are level after the planarization process is complete. In the illustrated embodiment, the mask 58 remains on the nanostructures 55.

The insulation material is then recessed to form the STI regions 68. The insulation material is recessed such that upper portions of the mask 58 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
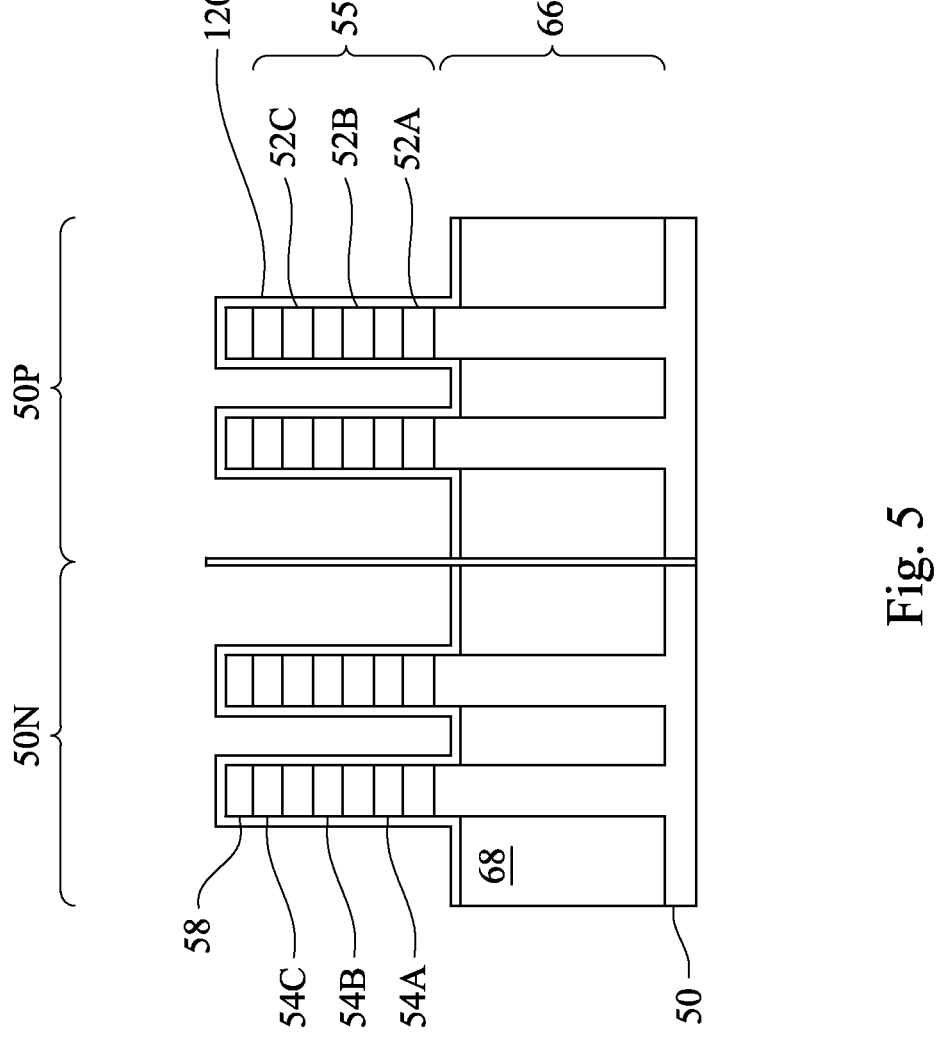
Figure 6:
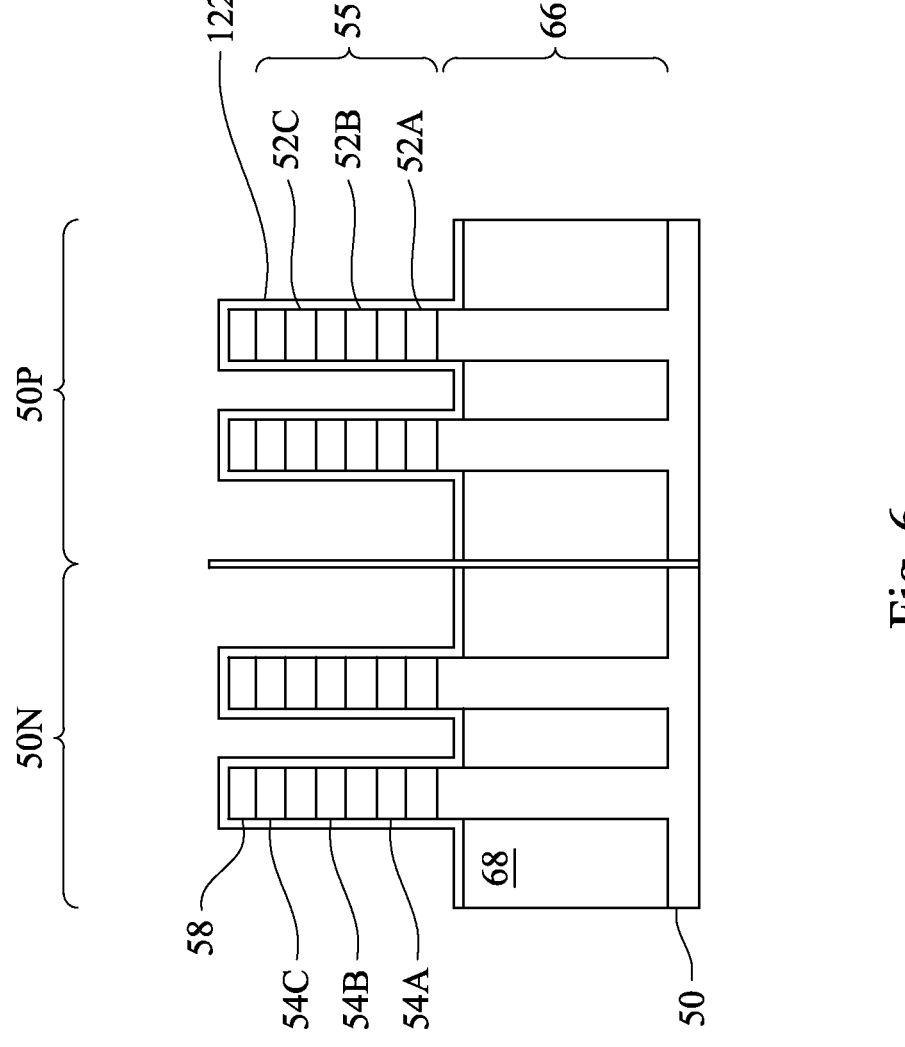

In FIGS. 5-6, a first diffusion barrier layer 122 is formed over the nanostructures 55. The first diffusion barrier layer 122 may protect the nanostructures 55 from oxidation and other effects of subsequent processes during fabrication of the semiconductor devices. Referring to FIG. 5, in accordance with some embodiments, a wet clean process is performed after recessing the insulation material to form the STI regions 68, resulting in an oxide layer 120 being formed over the structure as a chemical oxide. The oxide layer 120 forms over the nanostructures 55 and may also form over top surfaces of the STI regions 68. For example, the oxide layer 120 may be silicon oxide or the like. In some embodiments, the oxide layer 120 is formed by CVD, ALD, or a suitable method. The oxide layer 120 may form to a thickness ranging from 0.5 nm to 3 nm.

Referring to FIG. 6, in some embodiments, a first nitridation process is performed to convert the oxide layer 120 (e.g., silicon oxide) to the first diffusion barrier layer 122. As such, the first diffusion barrier layer 122 may be a nitride or an oxynitride (e.g., silicon oxynitride in the above example). For example, the first nitridation process may be a thermal nitridation performed at temperatures ranging from 700° C. to 1200° C. for a duration ranging from 0.2 ms to 300 s. In addition, the thermal nitridation may be performed in a nitrogen-containing ambient such as $NH_3$, NO, $N_2O$, $NO_2$, or the like. In some embodiments, the first nitridation process may be a plasma nitridation process performed at temperatures less than or equal to 700° C., such as ranging from room temperature (e.g., 20° C. to 25° C.) to 700° C. In addition, the plasma nitridation may be performed in an ambient or using precursors, such as $N_2$, $NH_3$, NO, $N_2O$, $NO_2$, or the like, with a carrier gas, such as argon or $N_2$.

Although not specifically illustrated, the first diffusion barrier layer 122 may include a bulk portion and a nitrogen-rich portion, wherein the nitrogen-rich portion is proximal to and along the nanostructures 55. The nitrogen-rich portion is formed by nitrogen from the first diffusion barrier layer 122 being attracted to and/or forming bonds (e.g., chemical bonds) with silicon and/or germanium atoms in the nanostructures 55 proximal to and along the first diffusion barrier layer 122. As a result, the first diffusion barrier layer 122 may have a concentration gradient of nitrogen through its thickness such that the nitrogen-rich portion adjacent the nanostructures 55 has a higher nitrogen concentration than the bulk portion distal from the nanostructures 55. In some embodiments, a portion of the first diffusion barrier layer 122 (e.g., a portion of the nitrogen-rich portion) may include the silicon and/or germanium atoms bonded to the nitrogen atoms in the nitrogen-rich portion.

The nitrogen in the first diffusion barrier layer 122 may reduce or prevent diffusion of various impurities or other elements to and from the first diffusion barrier layer 122. For example, the first diffusion barrier layer 122 may reduce or prevent germanium from out diffusing from the nanostructures 55 and thereby altering the performance characteristics of the nanostructures 55. Similarly, the first diffusion barrier layer 122 may reduce or limit germanium or other elements from diffusing into the nanostructures 55, which may also alter the performance characteristics of the nanostructures 55.

Figure 7:
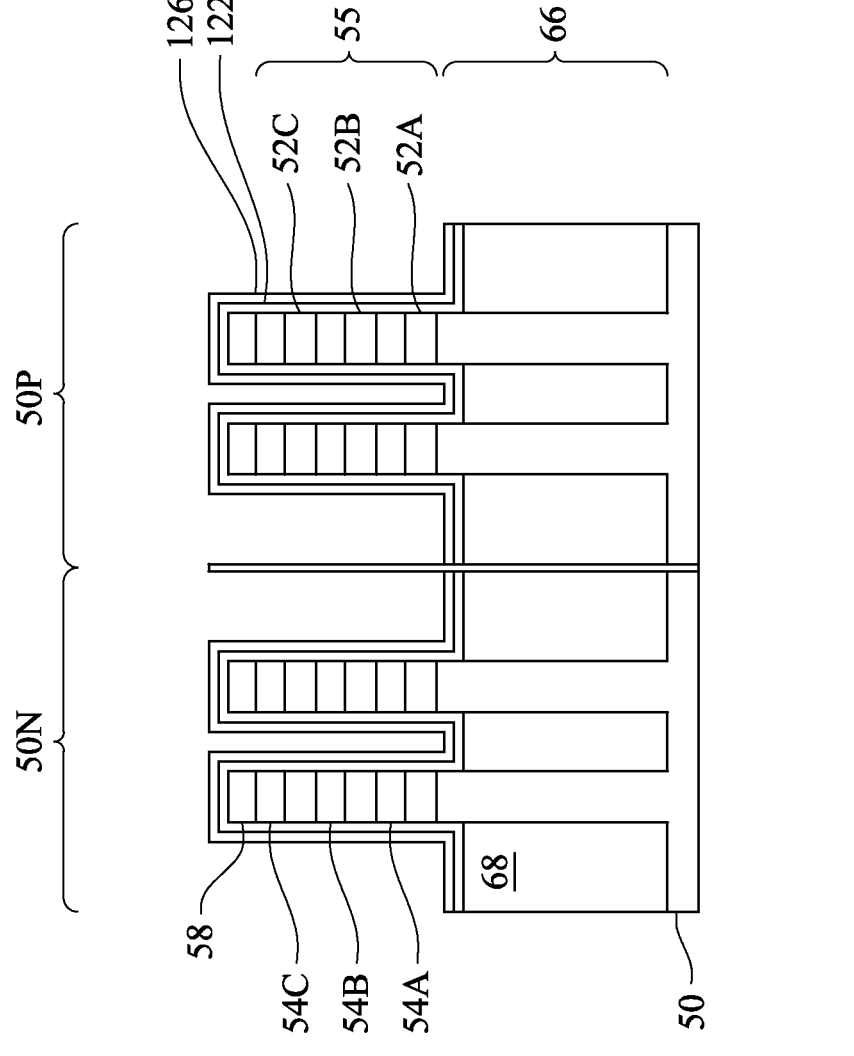

In FIG. 7, a first isolation layer 126 is formed over the first diffusion barrier layer 122. As discussed in greater detail below, the first isolation layer 126 and the first diffusion barrier layer 122 may be removed and replaced with a gate electrode. The first isolation layer 126 may be conformally deposited, for example, using CVD, ALD, the like, or a suitable method. For example, the first isolation layer 126 may be a silicon-containing layer, such as silicon germanium, silicon, silicon carbonitride, silicon oxide, the like, or a combination thereof.

In some embodiments, the first isolation layer 126 may be formed of a semiconductor material (e.g., one selected from the candidate semiconductor materials of the substrate 50) such as silicon germanium, which may be grown by a process such as vapor phase epitaxy (VPE) or molecular beam epitaxy (MBE), deposited by a process such as chemical vapor deposition (CVD) or atomic layer deposition (ALD), or the like. For example, the first isolation layer 126 may be formed of silicon or silicon germanium.

Figure 8:
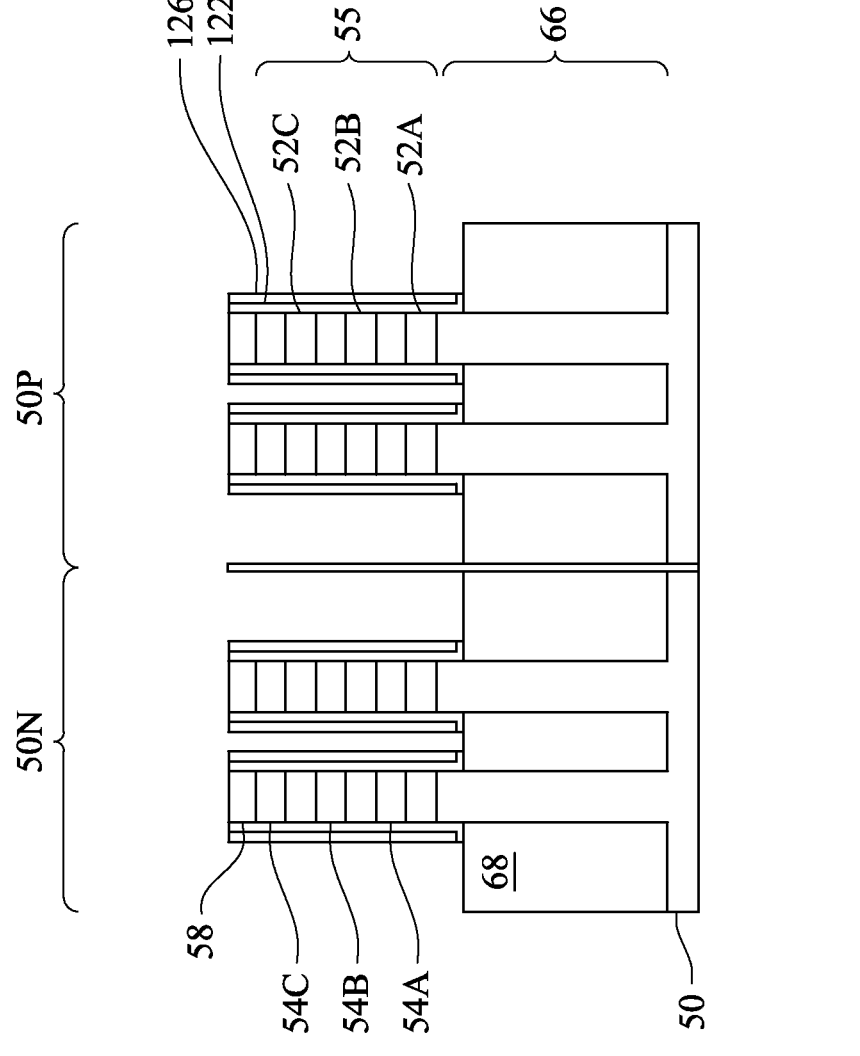

In FIG. 8, portions of the first isolation layer 126 is patterned and removed from top surfaces of the nanostructures 55 and the STI regions 68. The removal process may include an isotropic or anisotropic etching process and may be a wet etch or a dry etch, although any suitable etching process may be used. For example, the first isolation layer 126 may be etched using an anisotropic wet etch process. In some embodiments, portions of the first diffusion barrier layer 122 are patterned and removed with the first isolation layer 126. Remaining portions of the first isolation layer 126 and the first diffusion barrier layer 122 are disposed over the STI regions 68 and along sidewalls of the nanostructures 55, the fins 66, and the mask (if present). In some embodiments not specifically illustrated, the material of the first isolation layer 126 has a different etch rate (e.g., higher etch rate) than the material of the first diffusion barrier layer 122, such that the first diffusion barrier layer 122 may serve as an etch stop layer. As such, portions of the first diffusion barrier layer 122 may remain over the top surfaces of nanostructures 55 and/or the STI regions 68 after the removal process.

In some embodiments not specifically illustrated, exposed portions of the first diffusion barrier layer 122 may remain between adjacent nanostructures 55. For example, portions of the first diffusion barrier layer 122 may remain between the illustrated nanostructures 55 in the n-type region 50N and the p-type region 50P as a result of the density of the nanostructures 55 and the aspect ratio of the nanostructures 55.

Figure 9:
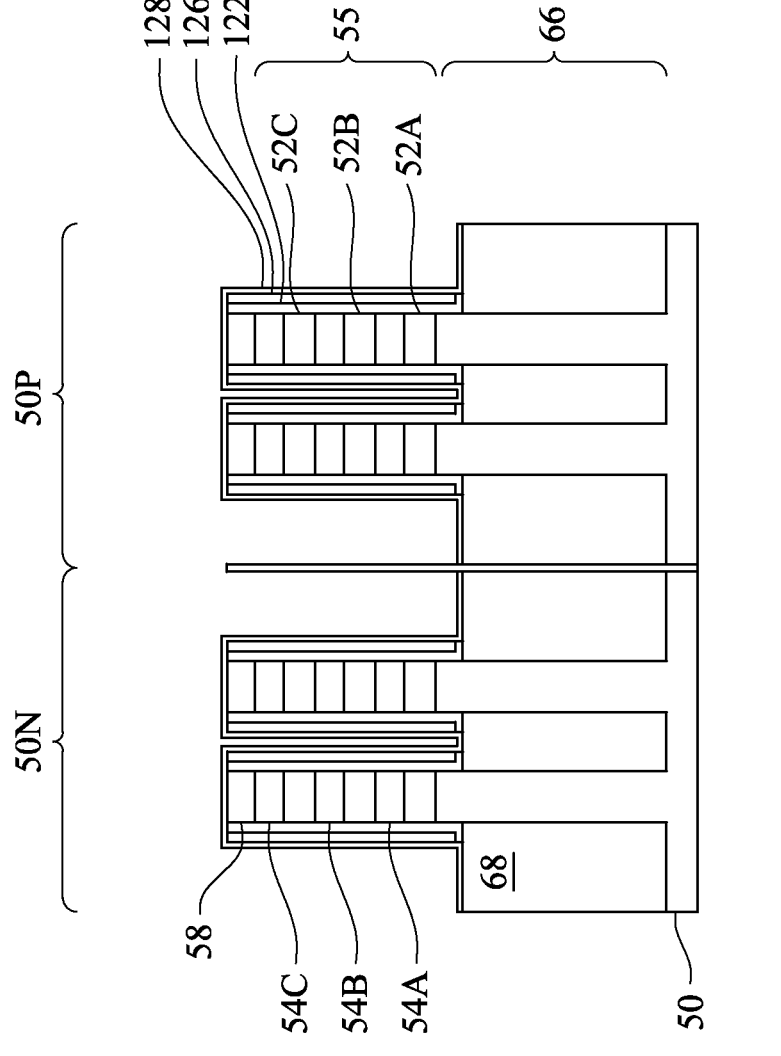

In FIG. 9, a second isolation layer 128 is formed over the first isolation layer 126. As discussed in greater detail below, a fill material (such as the fill material 130 discussed below with reference to FIG. 10) may be formed over the second isolation layer 128. The second isolation layer 128 may act as a liner layer, and the second isolation layer 128 and the subsequently formed fill material and capping layer may collectively form an insulating fin between the nanostructures 55. The second isolation layer 128 may be conformally deposited, for example, using CVD, ALD, PVD, the like, or a suitable method. Similarly, the second isolation layer 128 may be a silicon-containing layer, such as silicon germanium, silicon, silicon carbonitride, silicon oxide, the like, or a combination thereof. However, the second isolation layer 128 may be a different material than used for the first isolation layer 126. In some embodiments, the second isolation layer 128 may be formed of one or more dielectric material(s) having a high etch selectivity from the etching of the fins 66, the nanostructures 55, and the first isolation layer 126, for example, being a nitride such as silicon nitride, silicon carbonitride, silicon oxycarbonitride, or the like. The second isolation layer 128 may reduce oxidation of the first isolation layer 126 during the subsequent formation of a fill material 130, which may be useful for a subsequent removal of the first isolation layer 126. In some embodiments, the second isolation layer 128 is silicon carbonitride and formed by CVD.

Figure 10:
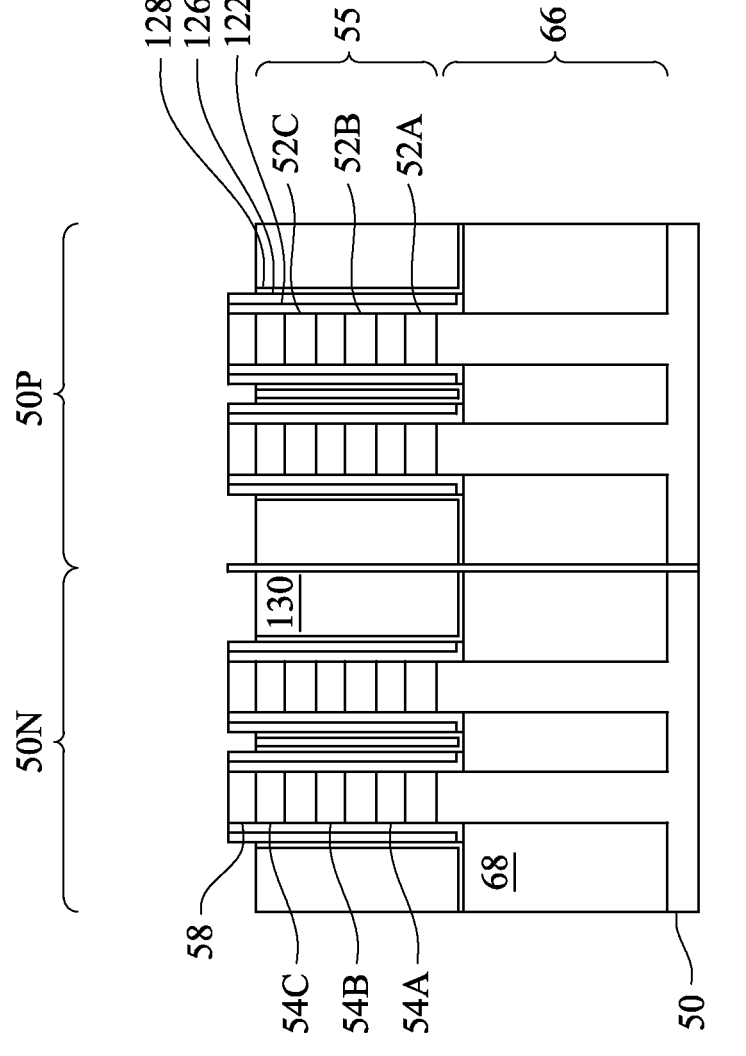

In FIG. 10, a fill material 130 is formed over the second isolation layer 128, filling the remaining area between the fins 66 and the nanostructures 55 that is not filled by the first isolation layer 126 or the second isolation layer 128. The fill material 130 may form the bulk of the lower portions of the insulating fins 134 to insulate subsequently formed source/drain regions from each other. The fill material 130 may be formed by an acceptable deposition process such as ALD, CVD, PVD, or the like. The fill material 130 may be formed of one or more dielectric material(s) having a high etch selectivity from the etching of the fins 66, the nanostructures 55, the first isolation layer 126, and the second isolation layer 128, for example, being an oxide such as silicon oxide, silicon oxynitride, silicon oxycarbonitride, silicon oxycarbide, the like, or combinations thereof.

Still referring to FIG. 10, upper portions of the second isolation layer 128 and the fill material 130 above top surfaces of the fins 66, the nanostructures 55, and the masks 58 may be removed using one or more acceptable planarization and/or etching processes. The etching process may be selective to the second isolation layer 128 and to the fill material 130 (e.g., selectively etches the second isolation layer 128 and the fill material 130 at a faster rate than the first isolation layer 126, the nanostructures 55, and/or the masks 58). In some embodiments, top surfaces of the second isolation layer 128 and the fill material 130 may be below top surfaces of the masks 58. In other embodiments not specifically illustrated, the fill material 130 may be recessed below top surfaces of the masks 58, while the second isolation layer 128 is maintained at a same level as the masks 58.

Figure 11:
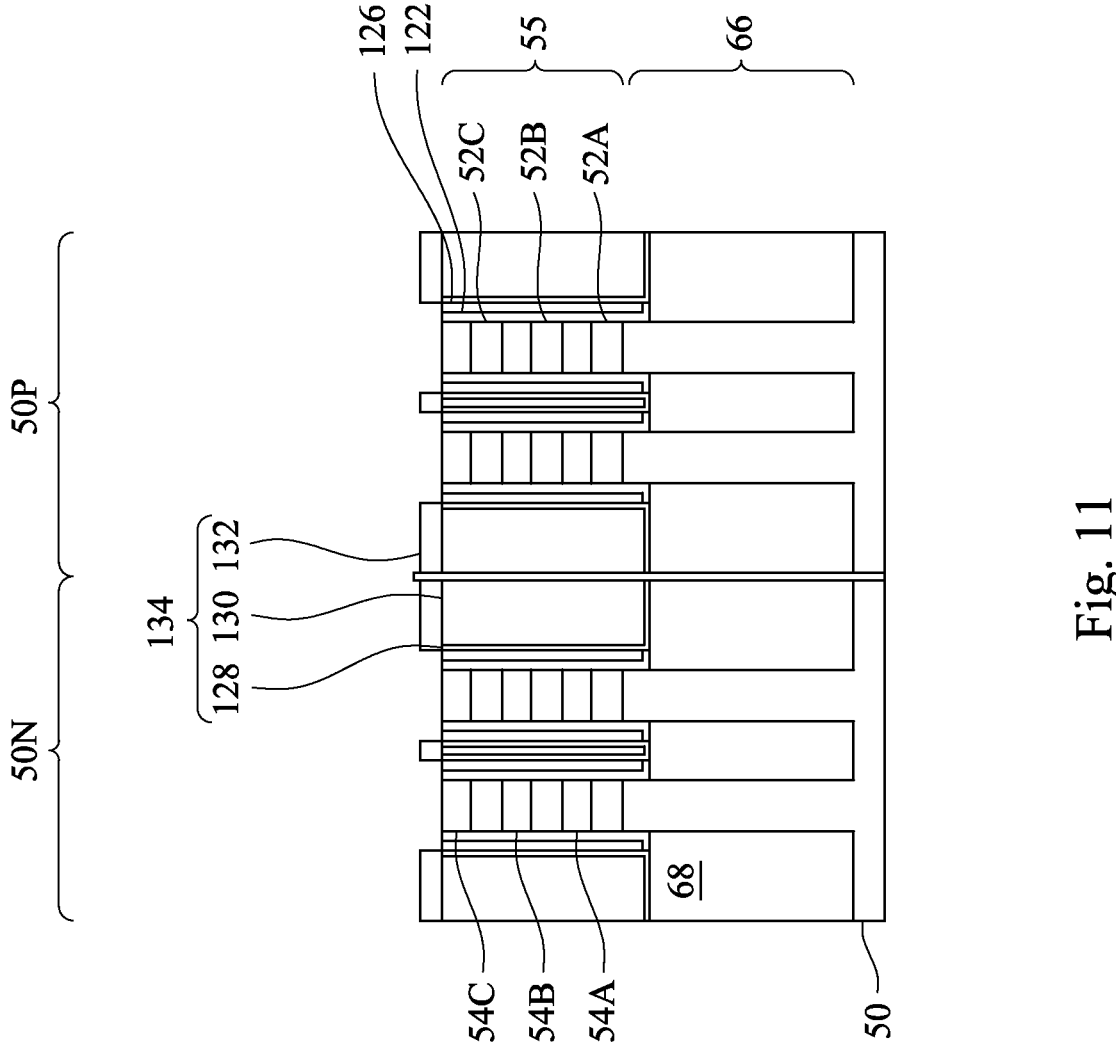

In FIG. 11, a dielectric capping layer 132 is formed over the fill material 130 and the second isolation layer 128. The combination of the second isolation layer 128, the fill material 130, and the dielectric capping layer 132 may be referred to as insulating fins 134. The dielectric capping layer 132 may be deposited to fill a remaining area over the second isolation layer 128, the fill material 130, the first diffusion barrier layer 122, and the first isolation layer 126, as well as between sidewalls of the masks 58. The dielectric capping layer 132 may be formed by an acceptable deposition process such as ALD, CVD, PVD, or the like. The dielectric capping layer 132 may be formed of one or more dielectric material(s) having a high etch selectivity from the etching of the fins 66, the nanostructures 55, the first isolation layer 126, the second isolation layer 128, and the fill material 130. For example, the dielectric capping layer 132 may comprise a high-k material such as hafnium oxide, zirconium oxide, zirconium aluminum oxide, hafnium aluminum oxide, hafnium silicon oxide, aluminum oxide, the like, or combinations thereof. In this way, the dielectric capping layer 132 may serve as a hard mask that protects the underlying second isolation layer 128 and the fill material 130 from over etch in subsequent processes.

The dielectric capping layer 132 may be formed to initially cover the nanostructures 55 and the masks 58 (see FIG. 10). Subsequently, a removal process is applied to remove excess material(s) of the dielectric capping layer 132. In some embodiments, a planarization process such as a CMP, an etch-back process, combinations thereof, or the like may be utilized. The planarization process exposes the masks 58 such that top surfaces of the first diffusion barrier layer 122, the first isolation layer 126, the second isolation layer 128, the dielectric capping layer 132, and the masks 58 are coplanar (within process variations). In some embodiments not specifically illustrated, portions of or the entirety of the masks 58 may also be removed by the planarization process.

Still referring to FIG. 11, portions of the masks 58 remaining after the planarization process may be removed using an etching process, for example, to expose a top surface of the nanostructures 55. The etching process may be a wet etch that selectively removes the mask 58 without significantly etching the insulating fins 134. The etching process may be anisotropic. Further, the etching process (or a separate, selective etching process) may also be applied to reduce a height of the diffusion barrier layer 122 and the first isolation layer 126 to a similar level (e.g., same within processing variations) as the stacked nanostructures 55. After the etching process(es), a topmost surface of the stacked nanostructures 55, the first diffusion barrier layer 122, and the first isolation layer 126 may be exposed and may be lower than a topmost surface of the insulating fins 134.

As a result, the insulating fins 134 are formed between and contacting the first isolation layer 126. As discussed above, the insulating fins 134 comprise the second isolation layer 128, the fill material 130, and the dielectric capping layer 132. The first isolation layer 126 and the first diffusion barrier layer 122 space the insulating fins 134 apart from the nanostructures 55, and a size of the insulating fins 134 may be adjusted by adjusting a thickness of the first isolation layer 126.

In accordance with some embodiments, a thermal treatment process is performed. The thermal treatment process may be an anneal at temperatures ranging from 700° C. to 900° C. or temperatures greater than 900° C., and the thermal treatment process may be performed in an ambient of $N_2$, $O_2$, the like, combinations thereof, or a suitable ambient environment. In some embodiments, the thermal treatment process is performed before forming the second isolation layer 128 or, optionally, before performing the removal portions of the first isolation layer 126 as described above (see FIG. 8). As a result, the thermal treatment process may be performed on the first isolation layer 126 but not on the second isolation layer 128.

During the thermal treatment process, elements, dopants, and impurities in the first and second isolation layers 126/128 and in the nanostructures 55 may tend to diffuse toward adjacent features. For example, germanium may diffuse from, e.g., the silicon germanium material of the first and/or second isolation layers 126/128, toward the nanostructures 55 due to the germanium being less stably bonded than silicon within the first and/or second isolation layers 126/128. Similarly, germanium at endpoints of the nanostructures 55 (e.g., the first nanostructures 52) may be less stably bonded than silicon in the crystalline super-lattice due to the endpoints of the nanostructures being partially amorphous. The nitridation of first diffusion barrier layer 122 inhibits (e.g., prevents or reduces) the germanium from diffusing from the first and/or second isolation layers 126/128 into the nanostructures 55. Similarly, the first diffusion barrier layer 122 inhibits germanium from diffusing from the nanostructures 55 into the first and/or second isolation layers 126/128.

The nitrogen-rich portion of the first diffusion barrier layer 122 may provide a more robust diffusion barrier than the bulk portion of the first diffusion barrier layer 122. As a result, germanium (or other elements, dopants, and impurities) may diffuse into the bulk portion of the first diffusion barrier layer 122 from the first and/or second isolation layers 126/128, while the nitrogen-rich portion of the first diffusion barrier layer 122 prevents or reduces germanium (or other elements, dopants, and impurities) from diffusing from the nanostructures 55 into the first diffusion barrier layer 122 or further. For example, following the thermal treatment process, the bulk portion of the first diffusion barrier layer 122 may have a germanium concentration ranging from 15 at. % to 30 at. %. As a result of the first diffusion barrier layer 122 inhibiting diffusion as described above, the nanostructures

55 (e.g., which will become channel regions) maintain sufficient hole mobility or electron mobility, thereby improving performance of the semiconductor devices. The first diffusion barrier layer 122 continues to serve as the above-described barrier through subsequent processing steps, including those that may include thermal treatments.

FIGS. 12A through 28C illustrate various additional steps in the manufacturing of the semiconductor devices, in accordance with various embodiments. The figures illustrate features in either the n-type regions 50N or the p-type regions 50P unless described or labeled otherwise.

Figure 12A:
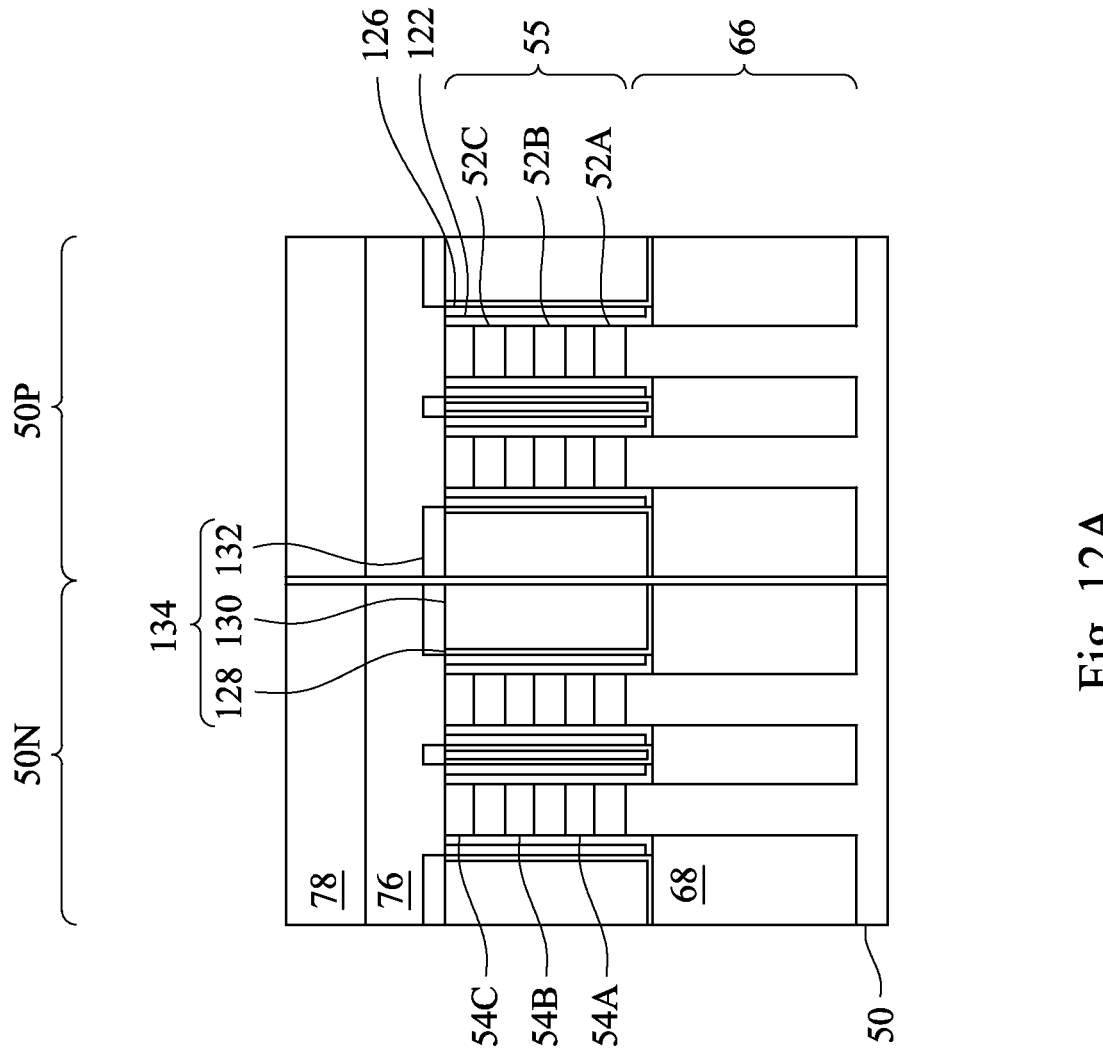
Figure 12B:
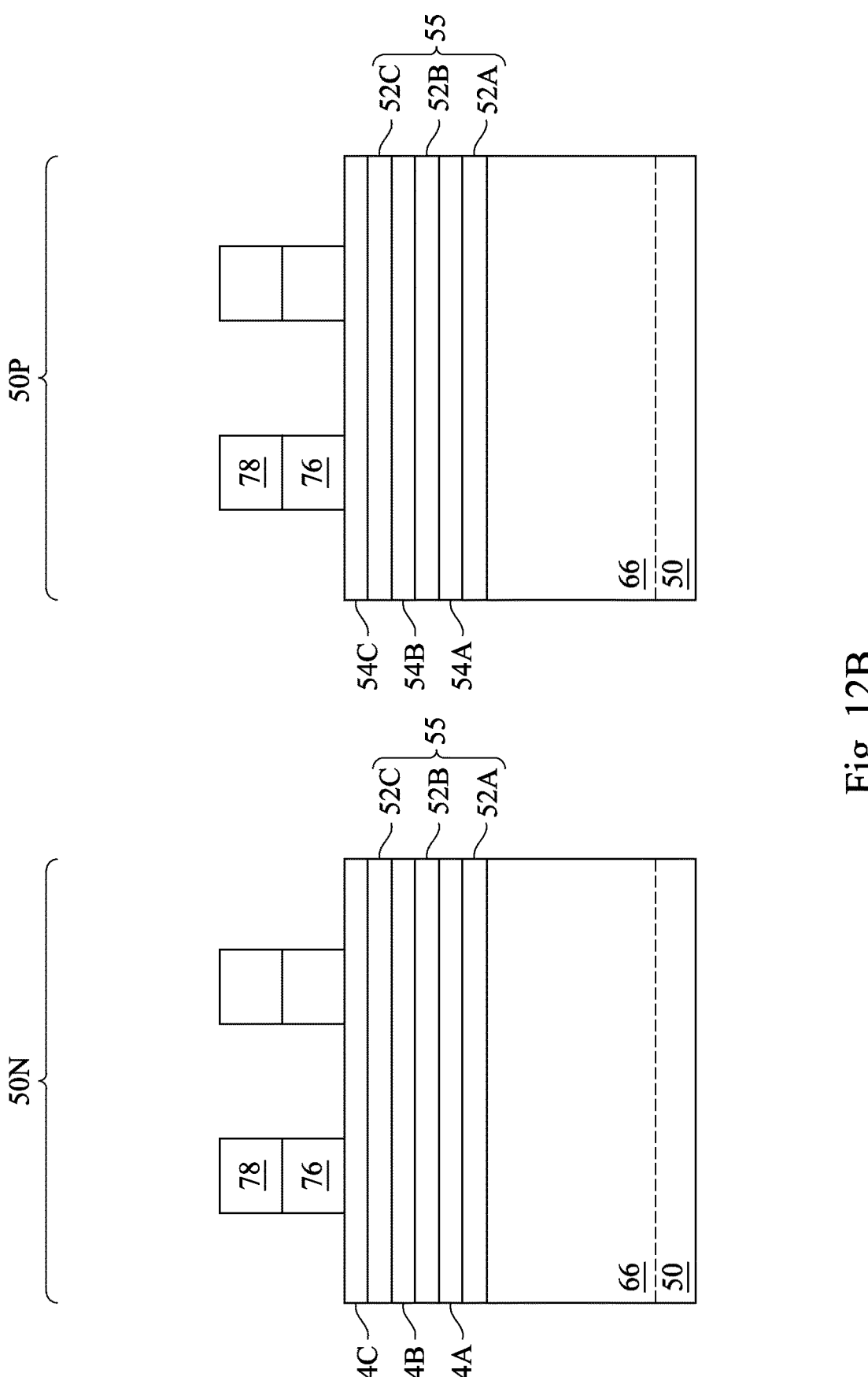
Figure 12C:
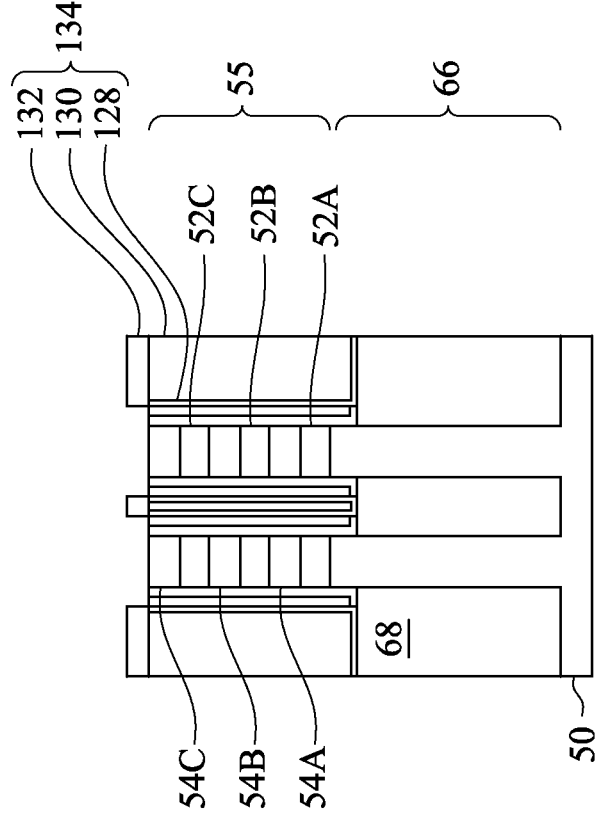

In FIGS. 12A-12C, a dummy gate structure (e.g., comprising a dummy gate 76 and a dummy mask 78) is formed over the nanostructures 55 and the insulating fins 134. The dummy gate 76 and the dummy mask 78 may be formed by depositing a dummy gate layer and a mask layer over the dummy gate layer. The mask layer and dummy gate layer are patterned to form the dummy gate 76 and the dummy mask 78 as illustrated in FIGS. 12A-12C. The dummy gate layer may be deposited and then planarized, such as by a CMP. The mask layer may then be deposited over the planarized dummy gate layer. The dummy gate layer may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer may be deposited by physical vapor deposition (PVD), CVD, sputter deposition, or other techniques for depositing the selected material. The dummy gate layer may be made of other materials that have a high etching selectivity from the etching of the insulating fins 134. The mask layer may include, for example, silicon nitride, silicon oxynitride, or the like. In this example, a single dummy gate layer and a single mask layer are formed across the n-type region 50N and the p-type region 50P.

The mask layer may be patterned using acceptable photolithography and etching techniques to form the dummy masks 78. The pattern of the dummy masks 78 then may be transferred to the dummy gate layer to form the dummy gates 76. As illustrated in FIG. 12C, the patterning may stop before removing exposed portions of the first isolation layer 126 and the first diffusion barrier layer 122 over the nanostructures 55. In some embodiments (not specifically illustrated), the pattern is further transferred to the first isolation layer 126 and the first diffusion barrier layer 122. The dummy gates 76 cover respective channel regions of the nanostructures 55 and the fins 66. The pattern of the dummy masks 78 may be used to physically separate each of the dummy gates 76 from adjacent dummy gates 76. The dummy gates 76 may also have a lengthwise direction substantially perpendicular to the lengthwise direction of respective fins 66. As discussed above, the dummy gate 76 and the dummy mask 78 may be collectively referred to as the "dummy gate structure."

In subsequent process steps discussed in greater detail below, these dummy gate structures may be replaced with a functional gate stack. Specifically, the first isolation layer 126 (and the first diffusion barrier layer 122) may be used as a temporary spacer during processing to delineate boundaries of the insulating fins 134. For example, the first isolation layer 126 and some of the nanostructures 55 (e.g., the first nanostructures 52) may be subsequently removed and replaced with gate structures that are wrapped around remaining others of the nanostructures 55 (e.g., the second nanostructures 54). In some embodiments, the first isolation layer 126 is formed of a material that has a high etch selectivity from the etching of the material of the remaining nanostructures 55 (e.g., the second nanostructures 54). For example, the first isolation layer 126 may be formed of the same semiconductor material as the first nanostructures 52 so that the first isolation layer 126 and the first nanostructures 52 may be removed in a single process step. Alternatively, the first isolation layer 126 may be formed of a different material than the first nanostructures 52.

In some embodiments (not specifically illustrated), the first nitridation process to convert the oxide layer 120 to the first diffusion barrier layer 122 is omitted, and the first isolation layer 126 and the second isolation layer 128 are formed over the oxide layer 120. In some embodiments, the insulating fins 134 are not formed as discussed above. For example, in some or all portions of the n-type region 50N and/or the p-type region 50P, the first diffusion barrier layer 122, the first isolation layer 126, and the second isolation layer 128 are formed, and formation of the fill material 130 and the dielectric capping layer 132 is omitted. In some or all portions of the n-type region 50N and/or the p-type region 50P, the first diffusion barrier layer 122, the second isolation layer 128, and the insulating fins 134 may not be formed at all.

Figure 13A:
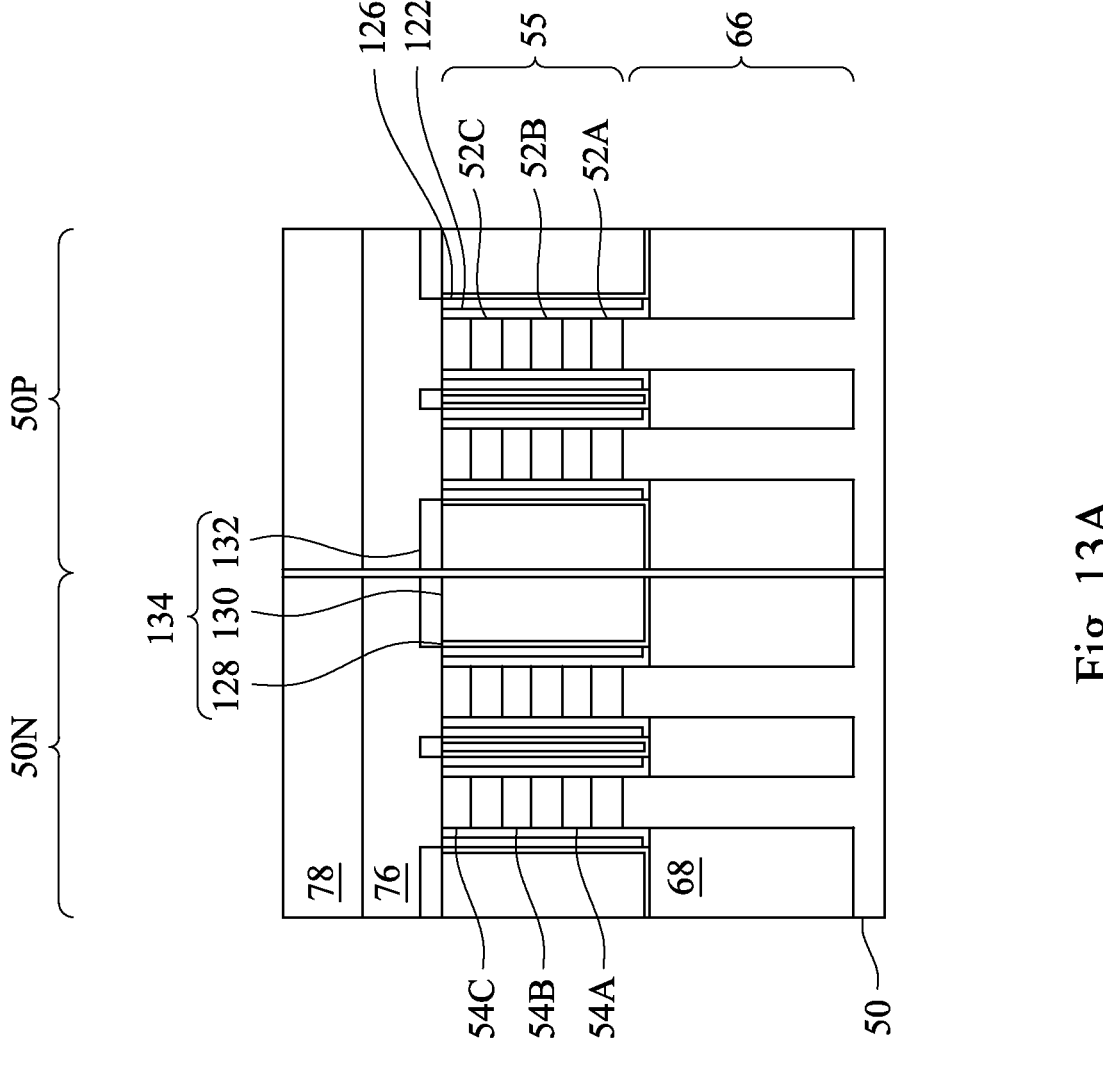
Figure 13B:
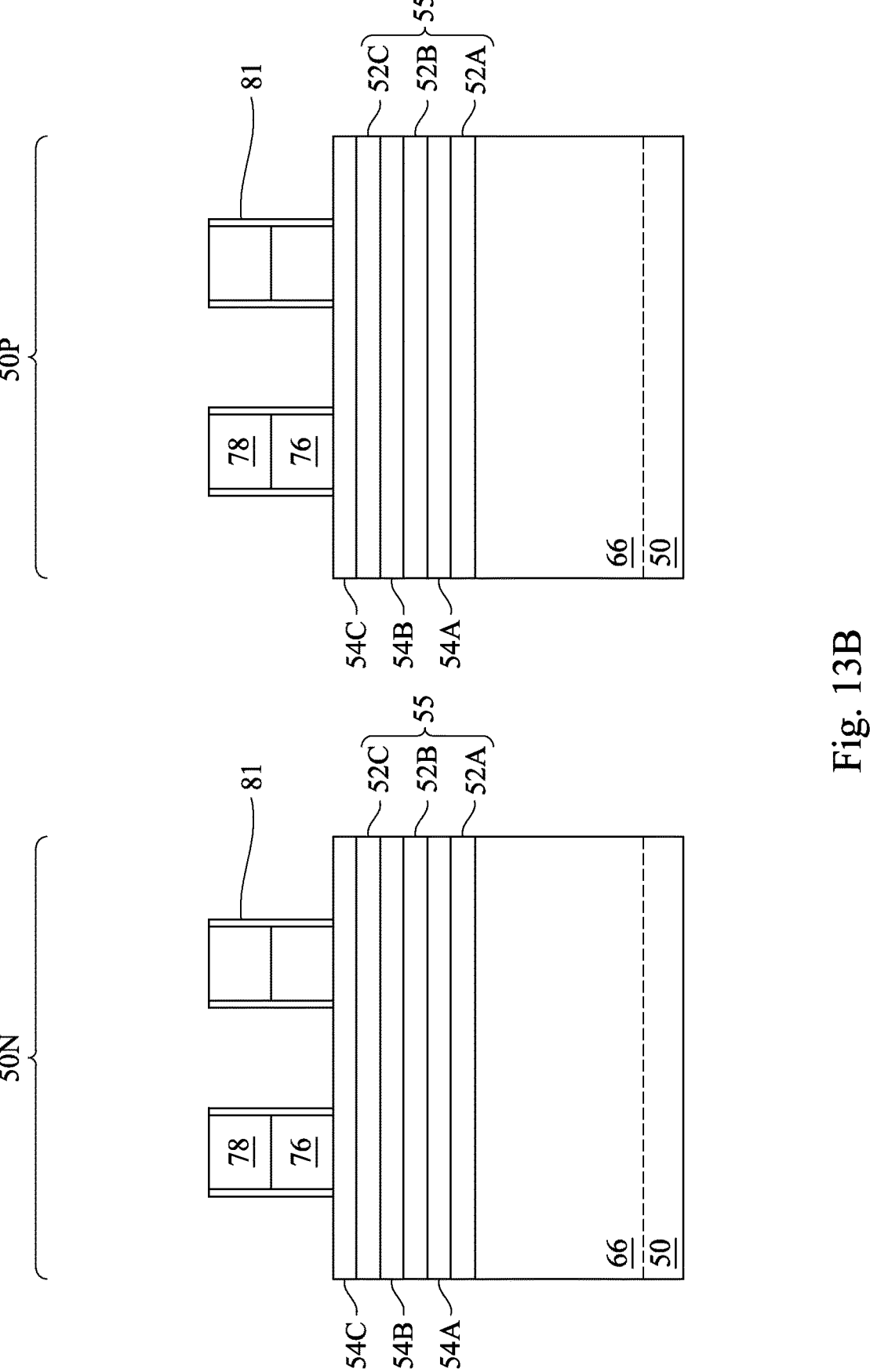
Figure 13C:
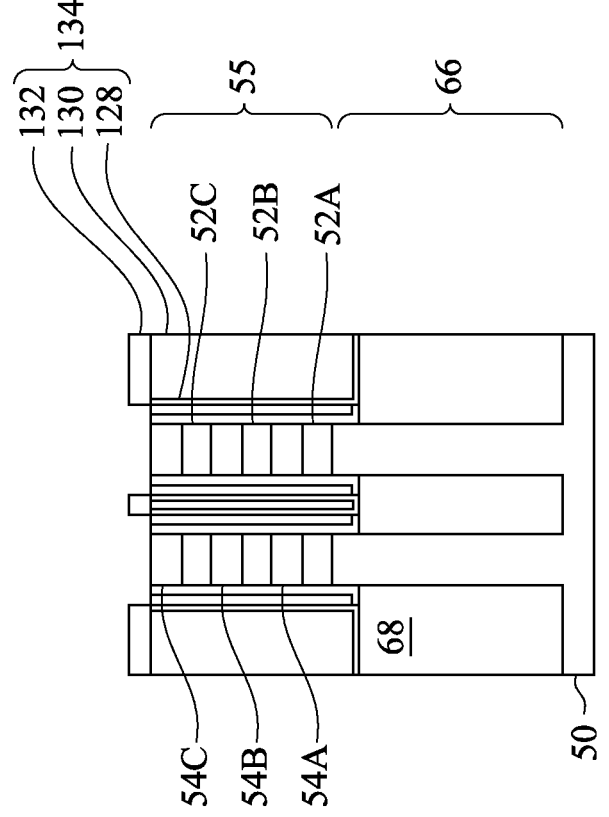

In FIGS. 13A-13C, one or more spacer layers are formed over the dummy gate structures and patterned to form gate spacers 81 adjacent the dummy gate structures. The gate spacers 81 facilitate in the formation of self-aligned source/drain regions. In some embodiments, the spacer layer may include a first spacer layer and a second spacer layer (not separately illustrated), and the spacer layers may be formed on top surfaces of the STI regions 68; top surfaces and sidewalls of the fins 66, the nanostructures 55, and the dummy masks 78; and sidewalls of the dummy gates 76. For example, the first spacer layer may be formed of silicon oxide, silicon nitride, silicon oxynitride, silicon oxycarbonitride, or the like, using techniques such as thermal oxidation or deposited by CVD, ALD, or the like, and the second spacer layers may be formed of a material having a different etch rate than the material of the first spacer layer, may be formed of silicon oxide, silicon nitride, silicon oxynitride, silicon oxycarbonitride, or the like, and may be deposited by CVD, ALD, or the like.

After the first spacer layer is formed and prior to forming the second spacer layer, implants for lightly-doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Before or after forming the LDD regions in the p-type region 50P, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The LDD regions may have a concentration of impurities in a range from about $1 \times 10^{15}$ atoms/cm$^3$ to about $1 \times 10^{19}$ atoms/cm$^3$. An anneal may be used to repair implant damage and to activate the implanted impurities.

Still referring to FIGS. 13A-13C, the spacer layer is etched to form gate spacers 81. In some embodiments, exposed portions of the first isolation layer 126 and the first diffusion barrier layer 122 (e.g., not covered by the dummy gates 76, the dummy masks 78, or the gate spacers 81) may remain substantially unetched during formation of the gate spacers 81. In some embodiments (not specifically illustrated), the exposed portions of the first isolation layer 126 and the first diffusion barrier layer 122 may be etched and removed from the fins 66 and nanostructures 55. As will be discussed in greater detail below, the gate spacers 81 act to self-align subsequently formed source drain regions, as well as to protect sidewalls of the fins 66 and/or nanostructures 55 during subsequent processing. The spacer layers (and the first isolation layer 126 and the first diffusion barrier layer 122) may be etched using a suitable etching process, such as an isotropic etching process (e.g., a wet etching process), an anisotropic etching process (e.g., a dry etching process), or the like. In some embodiments, the material of the second spacer layer has a different etch rate than the material of the first spacer layer, such that the first spacer layer may act as an etch stop layer when patterning the second spacer layer and such that the second spacer layer may act as a mask when patterning the first spacer layer. For example, the second spacer layer may be etched using an anisotropic etch process wherein the first spacer layer acts as an etch stop layer. Thereafter, the patterned second spacers act as a mask while etching exposed portions of the first spacer layer, thereby forming the gate spacers 81. As illustrated, the gate spacers 81 are disposed on sidewalls of the dummy masks 78 and the dummy gates 76.

It is noted that the above disclosure generally describes a process of forming spacers and LDD regions. Other processes and sequences may be used. For example, fewer or additional spacers may be utilized, different sequence of steps may be utilized (e.g., the gate spacers 81 may be patterned prior to depositing the second spacer layer 82), additional spacers may be formed and removed, and/or the like. Furthermore, the n-type and p-type devices may be formed using different structures and steps.

Figure 14A:
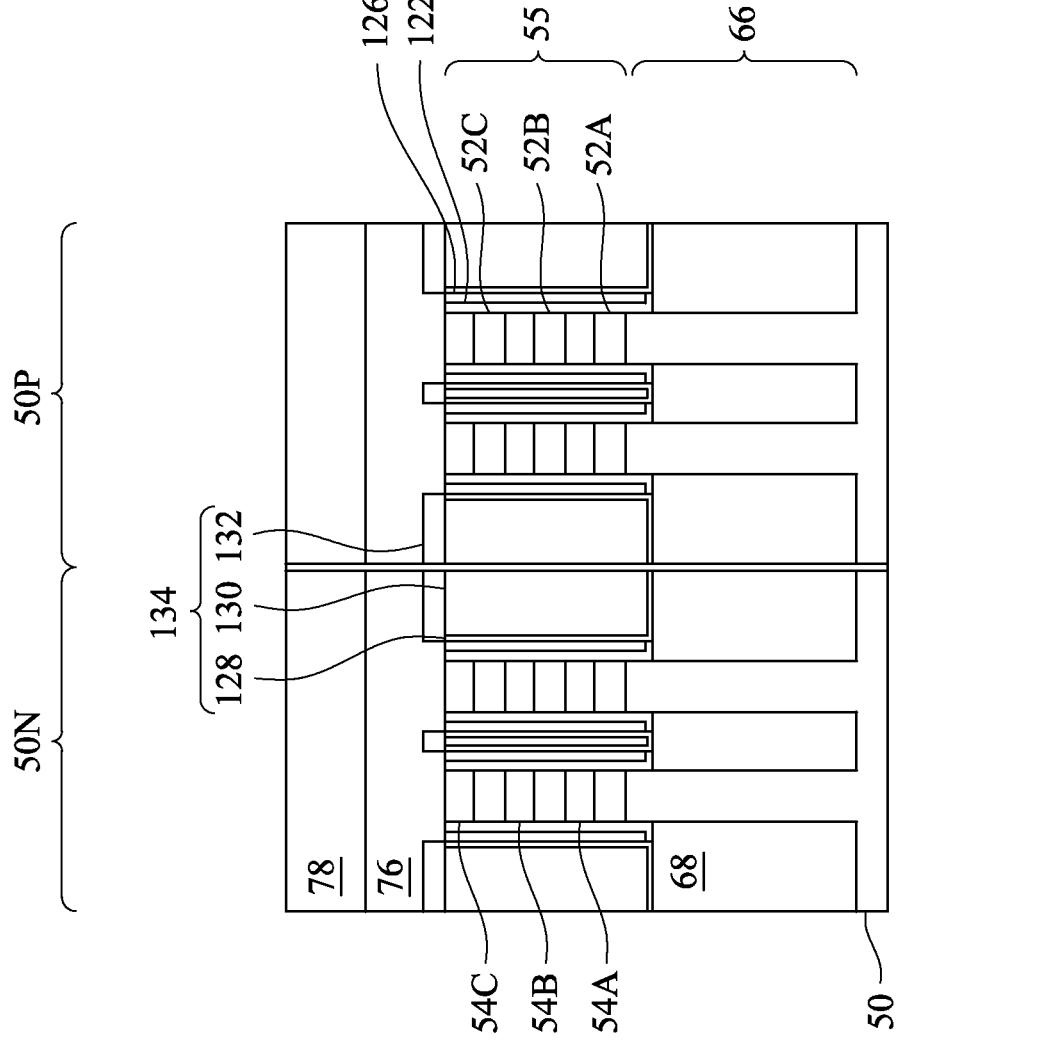
Figure 14B:
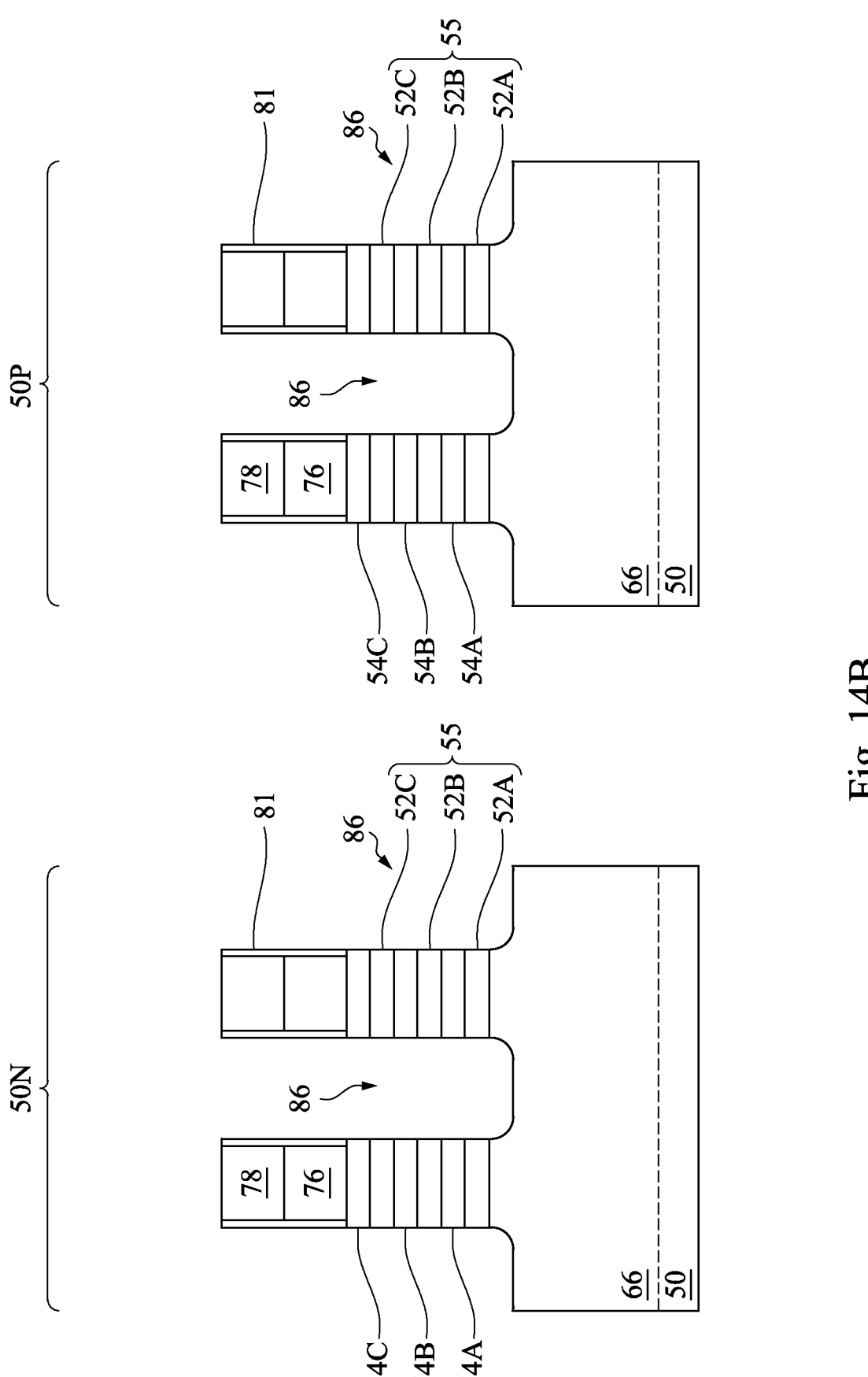
Figure 14C:
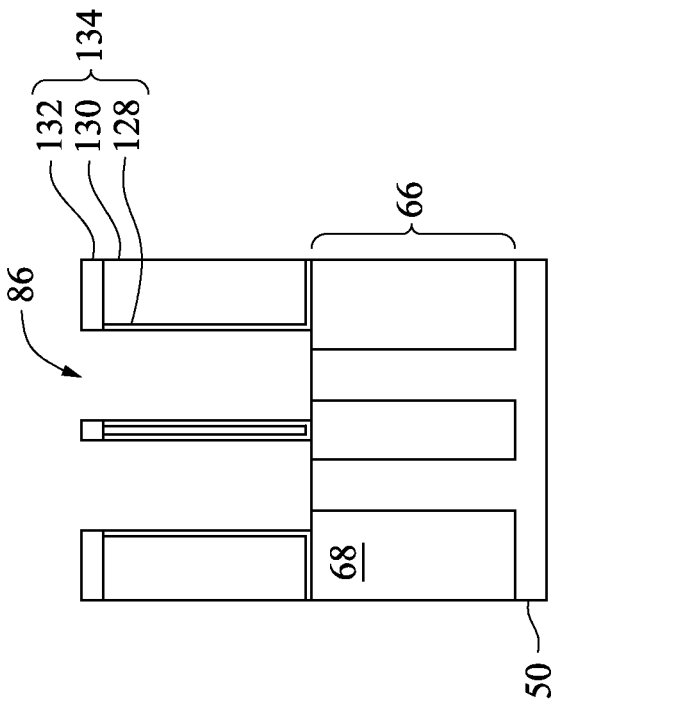

In FIGS. 14A-14C, first recesses 86 are formed, in accordance with some embodiments. If present, portions of the first diffusion barrier layer 122 and the first isolation layer 126 will be etched in the formation of the first recesses 86, thereby exposing the STI regions 68. The insulating fins 134 may compose sidewalls of the first recesses 86, for example, in the cross-section illustrated in FIG. 14C, and the nanostructures 55 and the substrate 50 may compose sidewalls of the first recesses 86, for example, in the cross-section illustrated in FIG. 14B. Epitaxial source/drain regions will be subsequently formed in the first recesses 86. The first recesses 86 may extend through the nanostructures 55 (e.g., the first nanostructures 52 and the second nanostructures 54) and into the fin 66 and/or the substrate 50. As illustrated in FIG. 14C, top surfaces of the STI regions 68 may be level with bottom surfaces of the first recesses 86. In various embodiments (not specifically illustrated), the fins 66 may be etched such that bottom surfaces of the first recesses 86 are disposed below the top surfaces of the STI regions 68, above the top surfaces of the STI regions 68, or the like. The first recesses 86 may be formed by etching the fins 66, the nanostructures 55 (and the first diffusion barrier layer 122 and the first isolation layer 126), and the substrate 50 using one or more etching processes, such as RIE, NBE, or the like. The gate spacers 81 and the dummy masks 78 serve as masks for portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figure 15A:
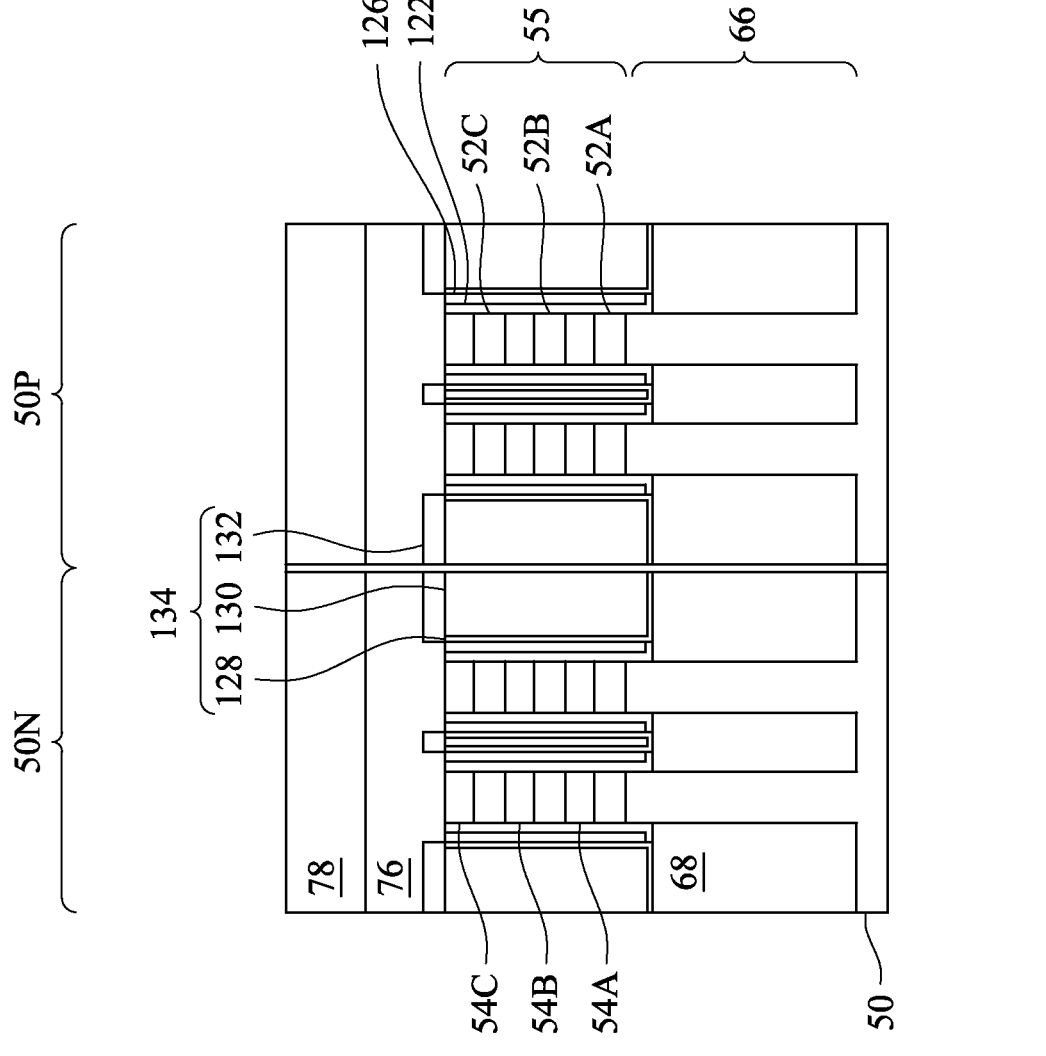
Figure 15B:
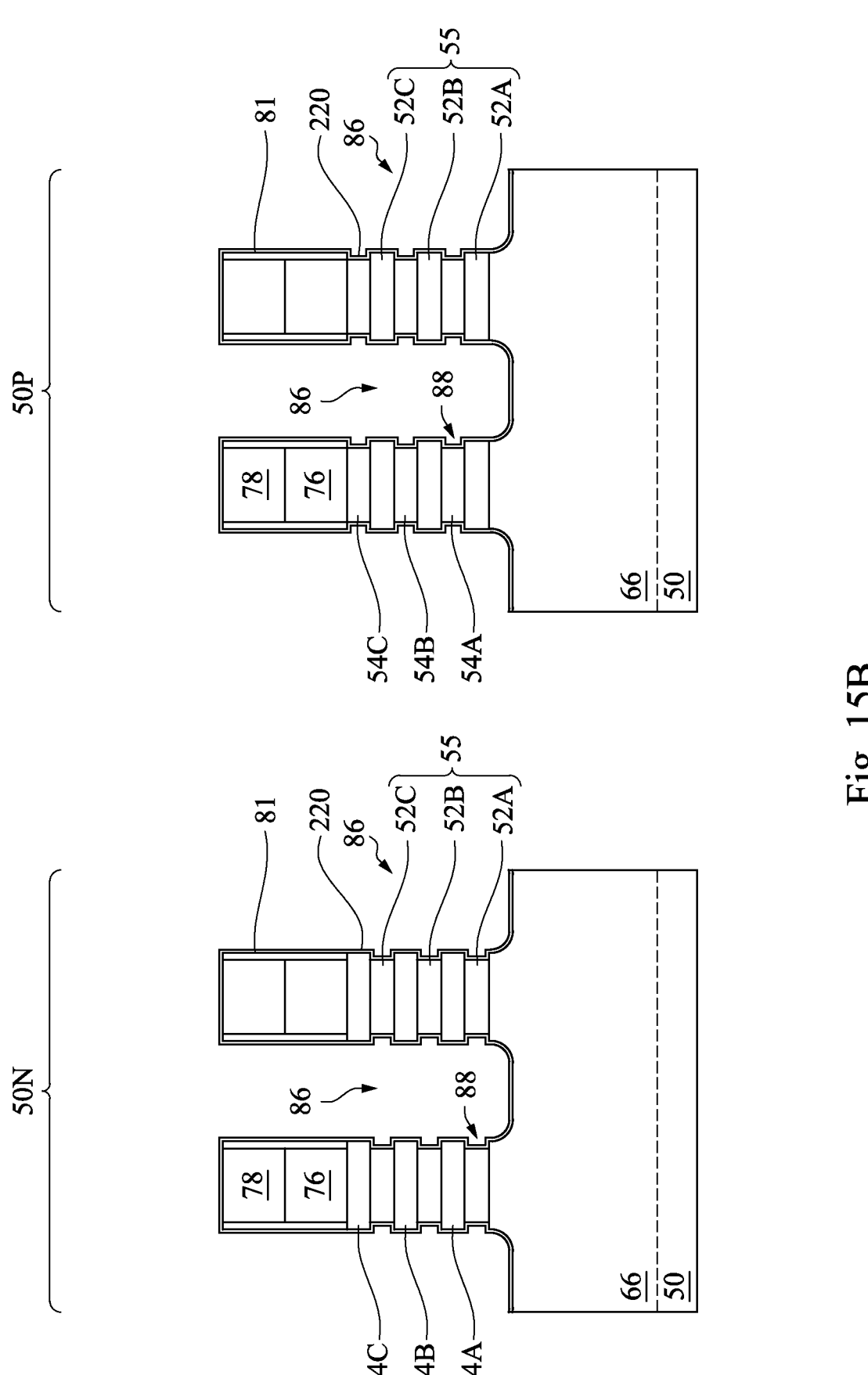
Figure 15C:
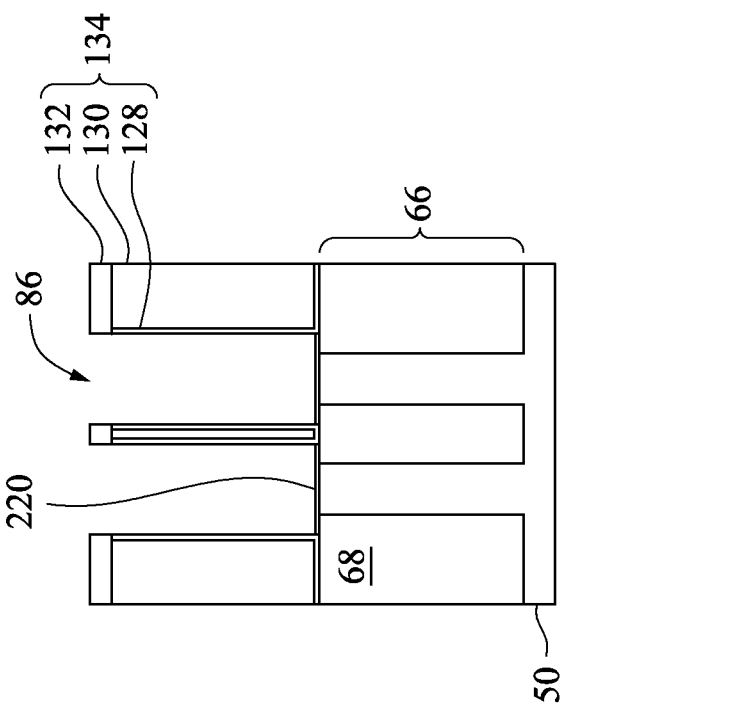

In FIGS. 15A-15C, portions of sidewalls of the layers of the nanostructures 55 formed of the first semiconductor materials (e.g., the first nanostructures 52) exposed by the first recesses 86 are etched to form sidewall recesses 88 in the n-type region 50N, and portions of sidewalls of the layers of the nanostructures 55 formed of the second semiconductor materials (e.g., the second nanostructures 54) exposed by the first recesses 86 are etched to form sidewall recesses 88 in the p-type region 50P. Although sidewalls of the first nanostructures 52 and the second nanostructures 54 in sidewall recesses 88 are illustrated as being straight in FIG. 15B, the sidewalls may be concave or convex. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P. In embodiments in which the first nanostructures 52 include, e.g., SiGe, and the second nanostructures 54 include, e.g., Si or SiC, a dry etch process with tetramethylammonium hydroxide (TMAH), ammonium hydroxide (NH₄OH), or the like may be used to etch sidewalls of the first nanostructures 52 in the n-type region 50N, and a wet or dry etch process with hydrogen fluoride, another fluorine-based etchant, or the like may be used to etch sidewalls of the second nanostructures 54 in the p-type region 50P.

As illustrated, in accordance with some embodiments, one or both of the etching processes may form an oxide layer 220, such as a chemical oxide, over the structure. The oxide layer 220 forms along the nanostructures 55, the substrate 50, and the STI regions 68, including within the first recesses 86 and the sidewall recesses 88. In some embodiments, the oxide layer 220 may also form over exposed surfaces of the dummy gate structures (e.g., the dummy masks 78 and/or the dummy gates 76) and/or the gate spacers 81. For example, the oxide layer 220 may be silicon oxide or the like. Although illustrated as continuous, the oxide layer 220 may form in discrete portions along the nanostructures 55. In some embodiments, the oxide layer 220 may be formed by CVD, ALD, or a suitable method after etching to form sidewall recesses 88.

Figure 16A:
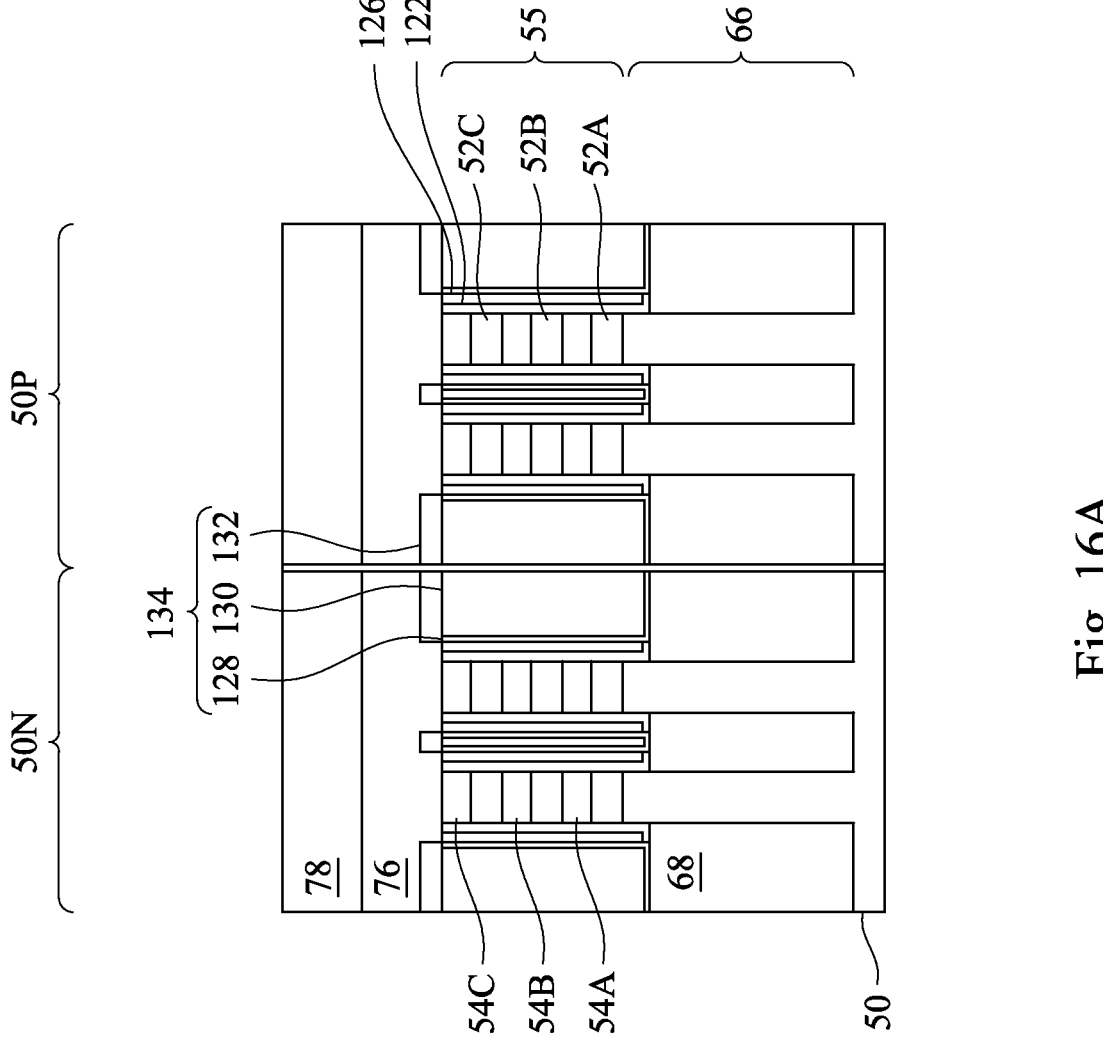
Figure 16B:
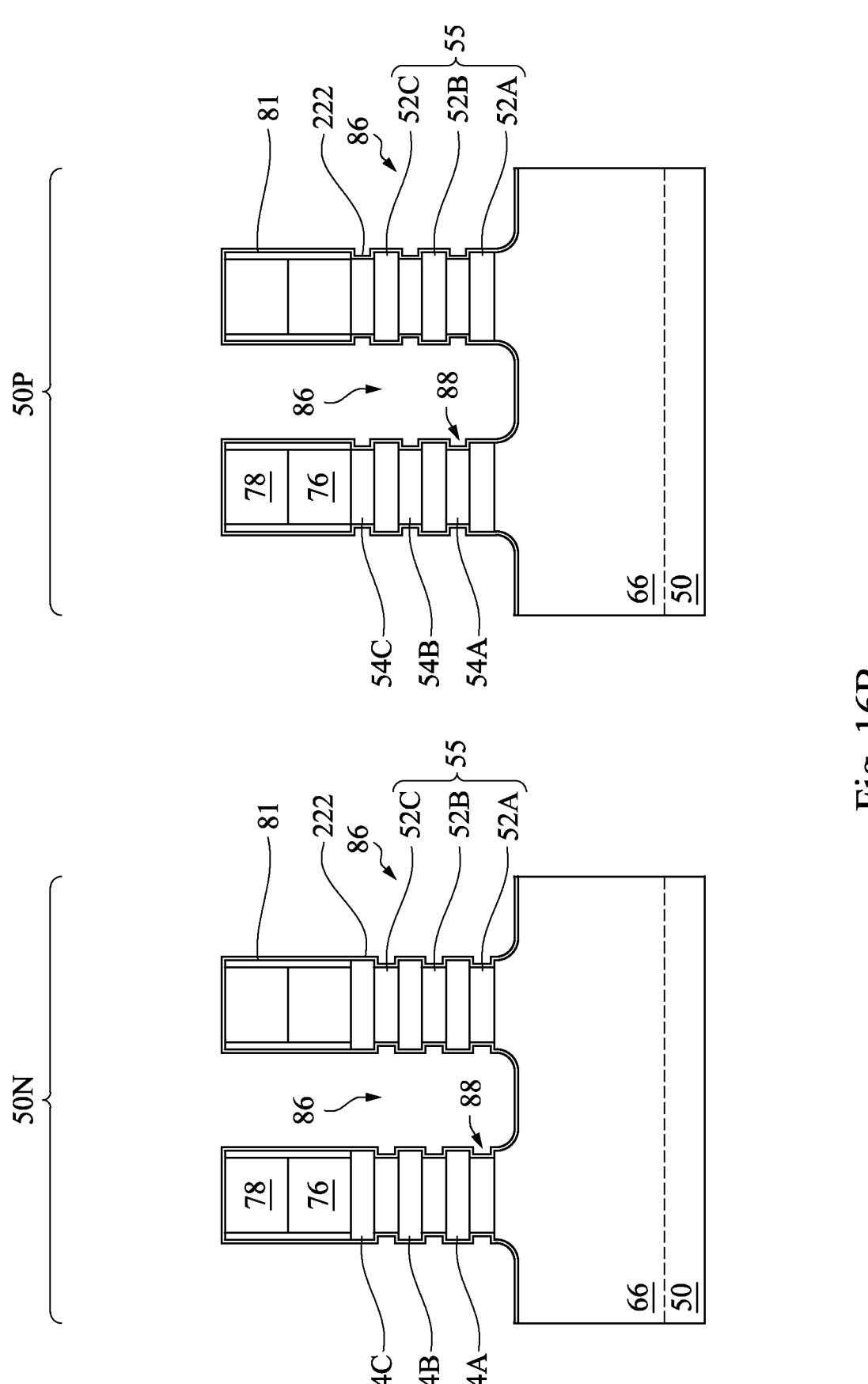
Figure 16C:
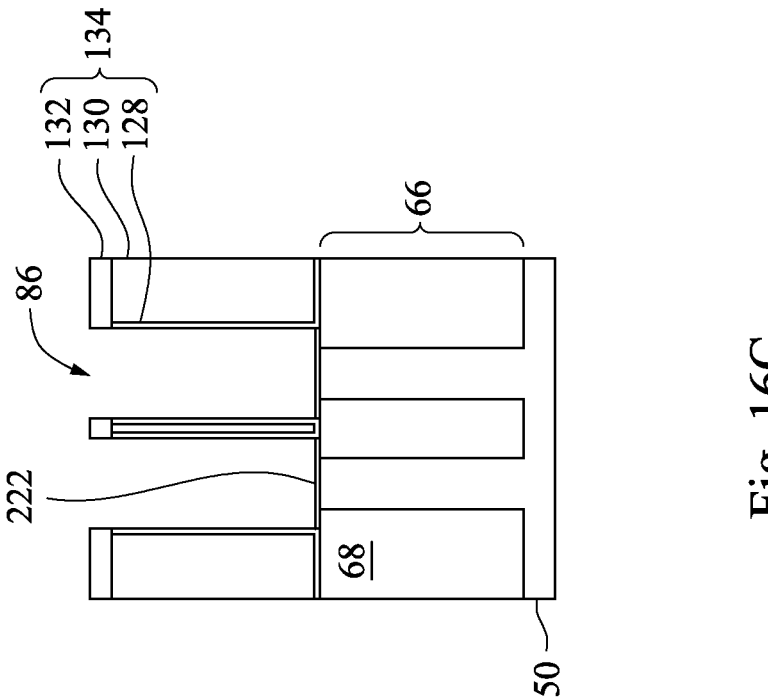

In FIGS. 16A-16C, in some embodiments, a second nitridation process is performed to convert the oxide layer 220 (e.g., silicon oxide) to a second diffusion barrier layer 222 (e.g., a second nitrogen-containing layer), similarly as described above in connection with the first nitridation process and the first diffusion barrier layer 122. As such, the second diffusion barrier layer 222 may be a nitride or an oxynitride, such as silicon oxynitride. For example, the second nitridation process may be a thermal nitridation performed at temperatures ranging from 700° C. to 1200° C. for a duration ranging from 0.2 ms to 300 s. In addition, the thermal nitridation may be performed in a nitrogen-containing ambient, such as NH₃, NO, N₂O, NO₂, or the like. In some embodiments, the second nitridation process may be a plasma nitridation process performed at temperatures less than or equal to 700° C., such as ranging from room temperature (e.g., 20° C. to 25° C.) to 700° C. In addition, the plasma nitridation process may be performed in an ambient or using precursors, such as NH₃, NO, N₂O, NO₂, or the like, with a carrier gas, such as argon or N₂.

Although not specifically illustrated, the second diffusion barrier layer 222 may include a bulk portion and a nitrogen-rich portion, wherein the nitrogen-rich portion is proximal to and along the nanostructures 55. The nitrogen-rich portion is formed by nitrogen from the second diffusion barrier layer 222 being attracted to and/or forming bonds (e.g., chemical bonds) with silicon and/or germanium atoms in the nanostructures 55 proximal to and along the second diffusion barrier layer 222. As a result, the second diffusion barrier layer 222 may have a concentration gradient of nitrogen through its thickness such that the nitrogen-rich portion has a higher nitrogen concentration adjacent the nanostructures 55 than the bulk portion distal from the nanostructures 55. In some embodiments, a portion of the second diffusion barrier layer 222 (e.g., a portion of the nitrogen-rich portion) may include silicon and/or germanium atoms bonded to the nitrogen atoms in the nitrogen-rich portion.

In accordance with some embodiments (not specifically illustrated), the oxide layer 220 (e.g., FIGS. 15A-15C) and subsequently formed second diffusion barrier layer 222 (e.g., FIGS. 16A-16C) may be formed over the nanostructures 55 in only one of the n-type region 50N and the p-type region 50P. For example, the p-type region 50P may be masked while laterally etching the nanostructures 55 (e.g., the first nanostructures 52) in the n-type region 50N. As a result, the oxide layer 220 may be formed over the nanostructures 55 in the n-type region 50N while the p-type region 50P is masked. In addition, the oxide layer 220 may not be formed over the nanostructures 55 in the p-type region 50P, such as while the n-type region 50N is masked. Conversely, the oxide layer 220 may be formed over the nanostructures 55 in the p-type region 50P while the n-type region 50N is masked. As such, the oxide layer 220 may not be formed over the nanostructures 55 in the n-type region 50N.

In FIGS. 17A-17D, inner spacers 90 are formed in the sidewall recesses 88 over the nanostructures 55 and the second diffusion barrier layer 222. The inner spacers 90 act as isolation features between subsequently formed source/drain regions and a gate structure. As will be discussed in greater detail below, source/drain regions will be formed in the first recesses 86, while the first nanostructures 52 in the n-type region 50N and the second nanostructures 54 in the p-type region 50P will be replaced with corresponding gate structures.

The inner spacers 90 may be formed by depositing an inner spacer layer (not separately illustrated) over the structures using a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the inner spacers 90. In addition, the anisotropic etch may remove portions of the second diffusion barrier layer 222. Although outer sidewalls of the inner spacers 90 are illustrated as being flush with sidewalls of the second nanostructures 54 in the n-type region 50N and flush with the sidewalls of the first nanostructures 52 in the p-type region 50P, the outer sidewalls of the inner spacers 90 may extend beyond or be recessed from sidewalls of the second nanostructures 54 and/or the first nanostructures 52, respectively.

Figure 17A:
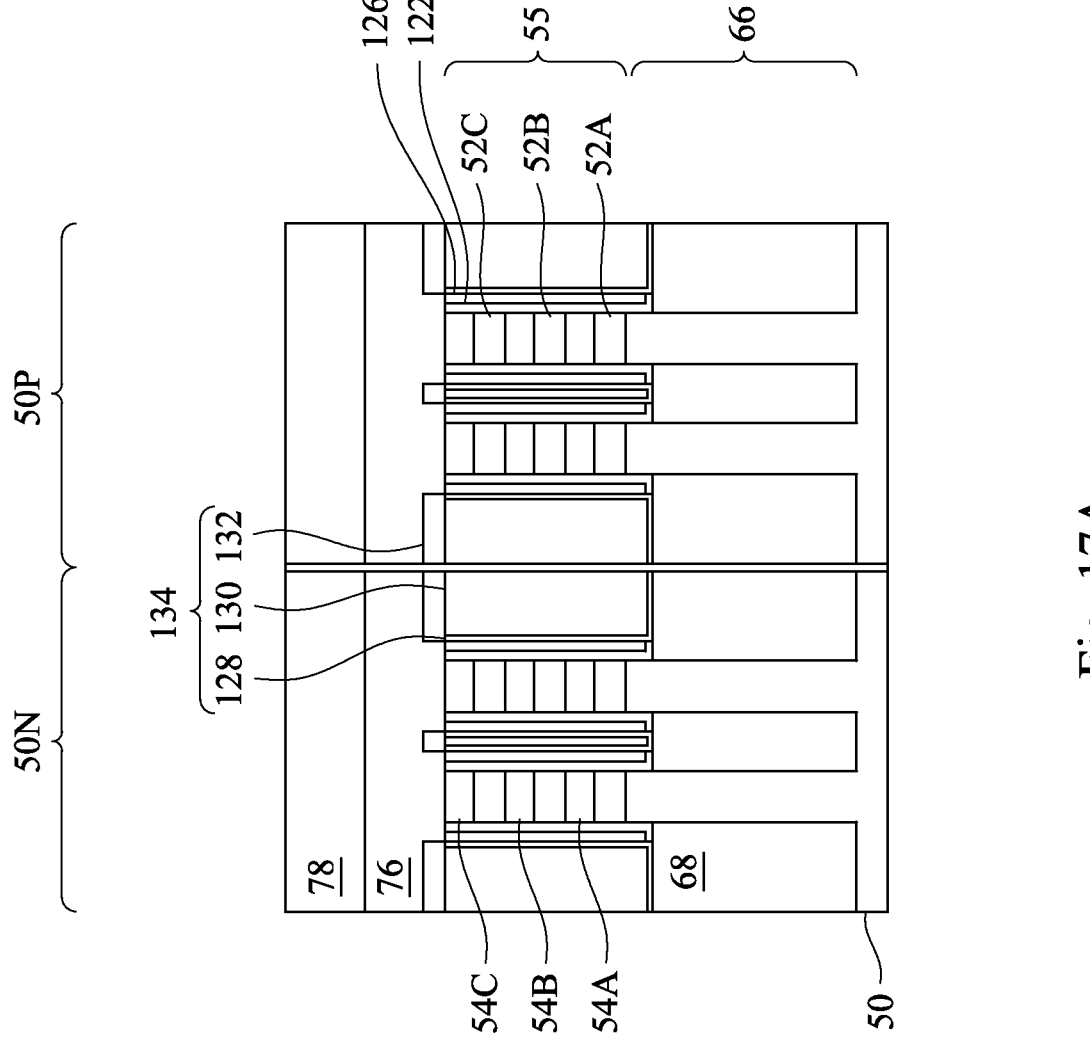
Figure 17B:
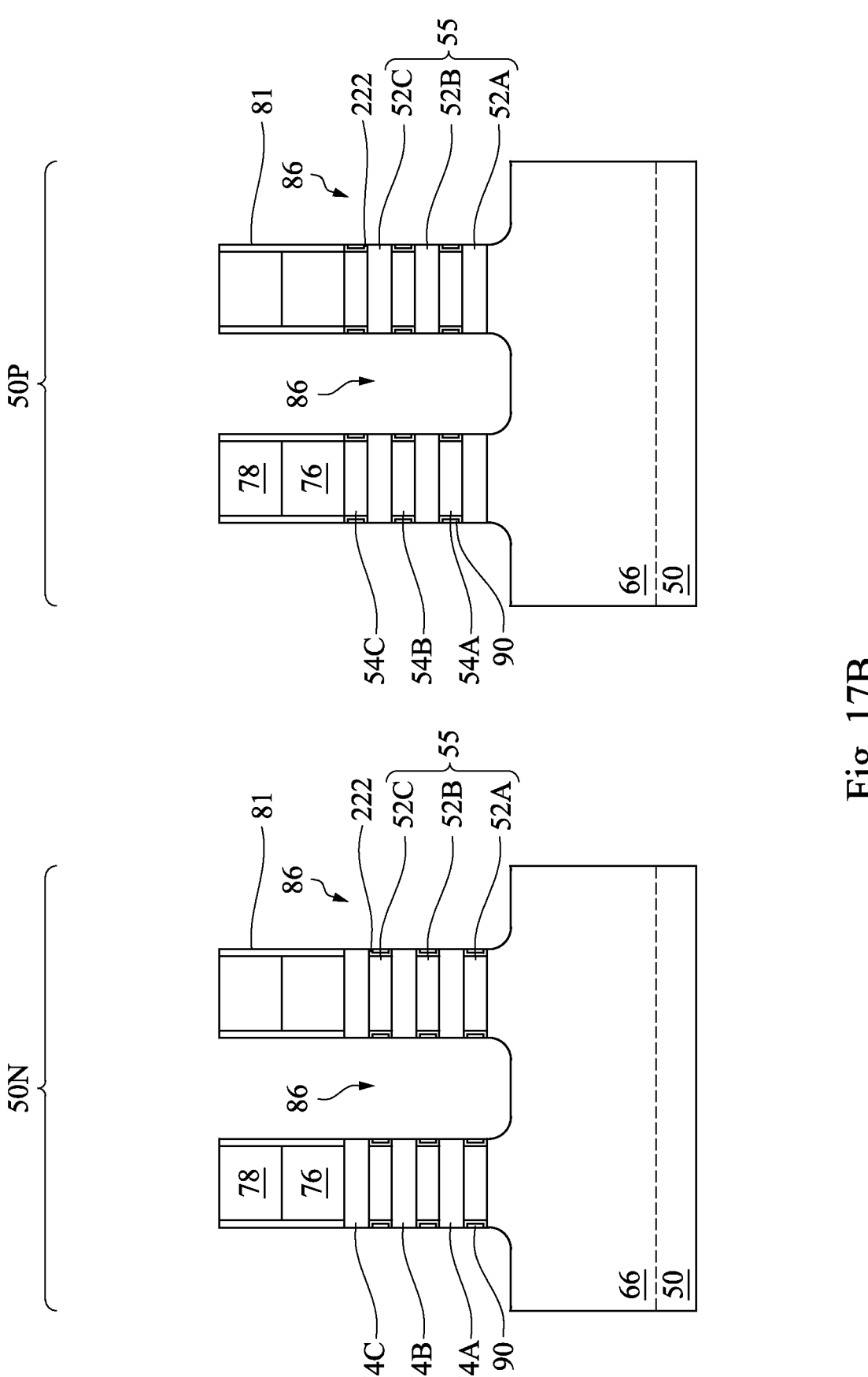
Figure 17C:
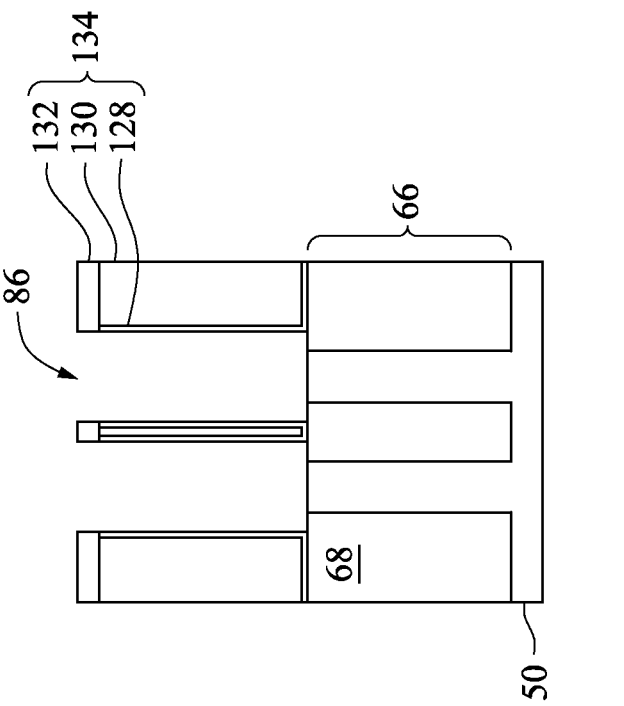
Figure 17D:
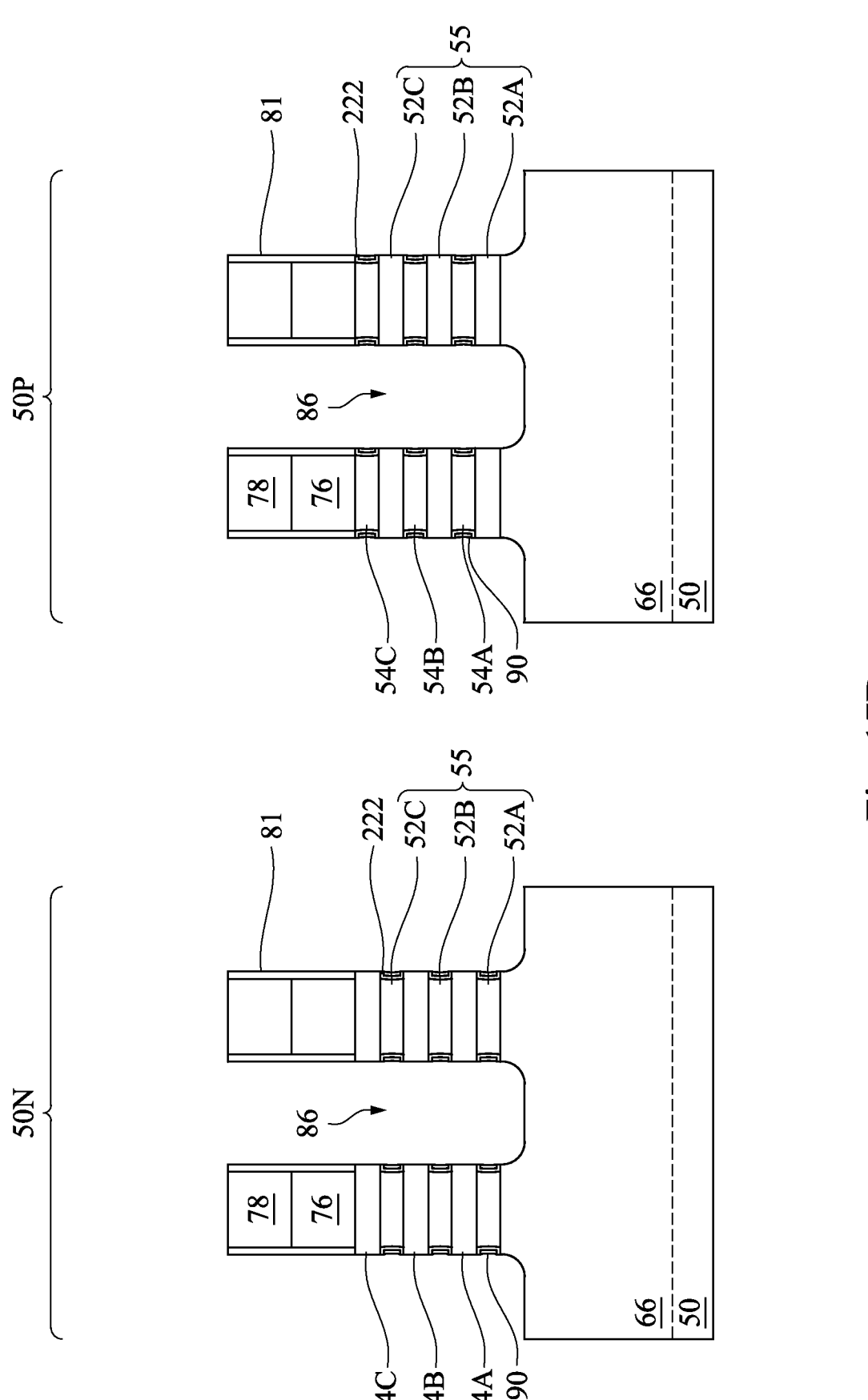

Moreover, although the outer sidewalls of the inner spacers 90 are illustrated as being straight in FIG. 17B, the outer sidewalls of the inner spacers 90 may be concave or convex. As an example, FIG. 17D illustrates an embodiment in which sidewalls of the first nanostructures 52 are concave, outer sidewalls of the second diffusion barrier layer 222 are concave, outer sidewalls of the inner spacers 90 are concave, and the inner spacers 90 are recessed from sidewalls of the second nanostructures 54 in the n-type region 50N. Also illustrated are embodiments in which sidewalls of the second nanostructures 54 are concave, outer sidewalls of the second diffusion barrier layer 222 are concave, outer sidewalls of the inner spacers 90 are concave, and the inner spacers 90 are recessed from sidewalls of the first nanostructures 52 in the p-type region 50P. The inner spacer layer may be etched by an anisotropic etching process, such as RIE, NBE, or the like. The inner spacers 90 may be used to prevent damage to subsequently formed source/drain regions (e.g., epitaxial source/drain regions 92, as discussed below with respect to FIGS. 18A-18D) by subsequent etching processes, such as etching processes used to form gate structures.

In FIGS. 18A-18D, epitaxial source/drain regions 92 are formed in the first recesses 86. In some embodiments, the epitaxial source/drain regions 92 may exert stress on the second nanostructures 54 in the n-type region 50N and on the first nanostructures 52 in the p-type region 50P, thereby improving performance. As illustrated, the epitaxial source/drain regions 92 are formed in the first recesses 86 such that each dummy gate 76 is disposed between respective neighboring pairs of the epitaxial source/drain regions 92. In some embodiments, the gate spacers 81 are used to separate the epitaxial source/drain regions 92 from the dummy gates 76, and the inner spacers 90 and the second diffusion barrier layer 222 are used to separate the epitaxial source/drain regions 92 from the nanostructures 55 by an appropriate lateral distance so that the epitaxial source/drain regions 92 do not short out with subsequently formed gates of the resulting nanostructure devices.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nanostructure devices. For example, if the second nanostructures 54 are silicon, the epitaxial source/drain regions 92 may include materials exerting a tensile stress on the second nanostructures 54 (e.g., forming a tensile strain therein), such as silicon, silicon carbide, phosphorous doped silicon, phosphorous doped silicon carbide, phosphorous doped silicon germanium, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nanostructure devices. For example, if the first nanostructures 52 are silicon germanium, the epitaxial source/drain regions 92 may comprise materials exerting a compressive stress on the first nanostructures 52 (e.g., forming a compressive strain therein), such as silicon-germanium, boron doped silicon germanium, germanium, germanium tin, or the like. The epitaxial source/drain regions 92 may also have surfaces raised from respective surfaces of the nanostructures 55 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1 \times 10^{19}$ atoms/cm$^3$ and about $1 \times 10^{21}$ atoms/cm$^3$. The n-type and/or p-type impurities for source/drain regions may be any of the impurities previously discussed. In some embodiments, the epitaxial source/drain regions 92 may be in situ doped during growth.

Figure 18A:
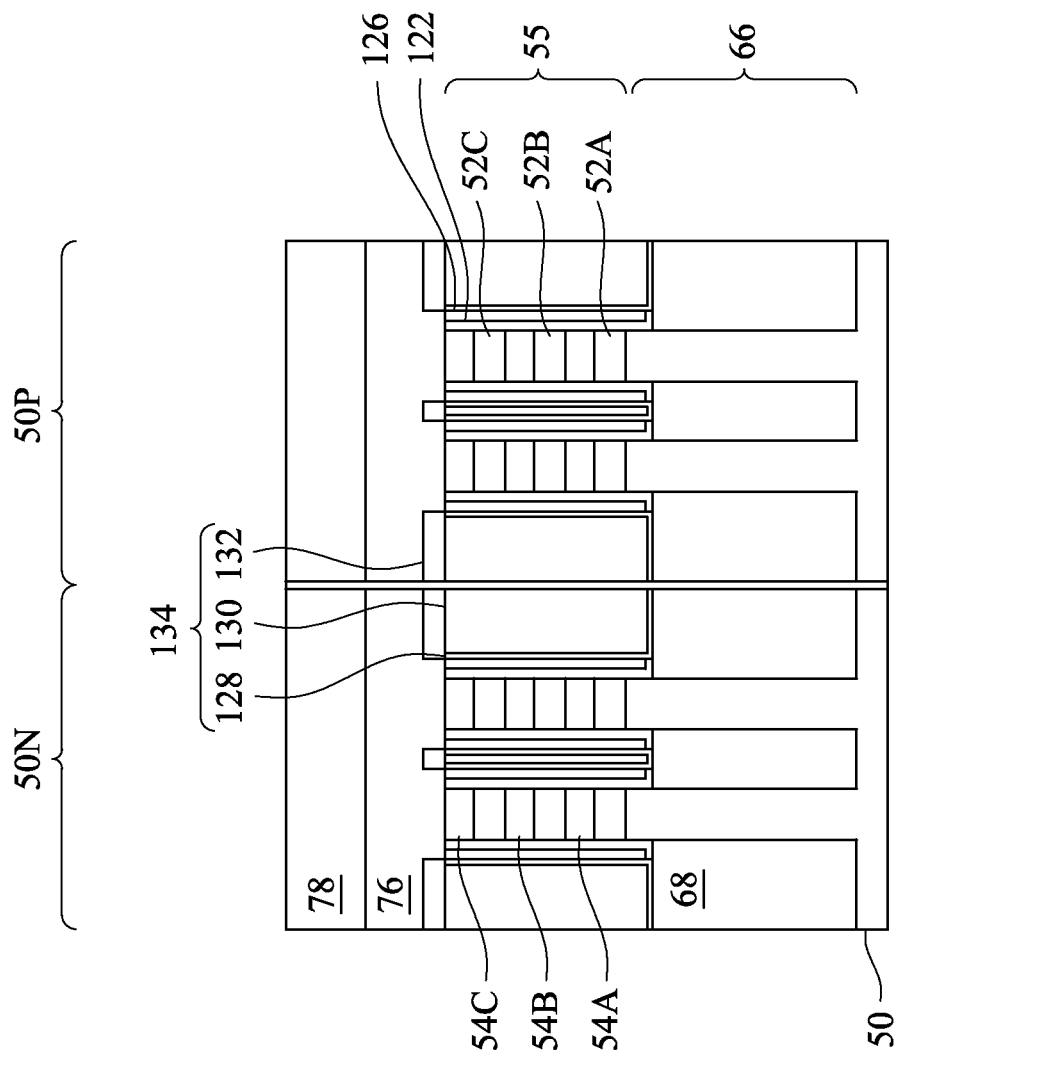
Figure 18B:
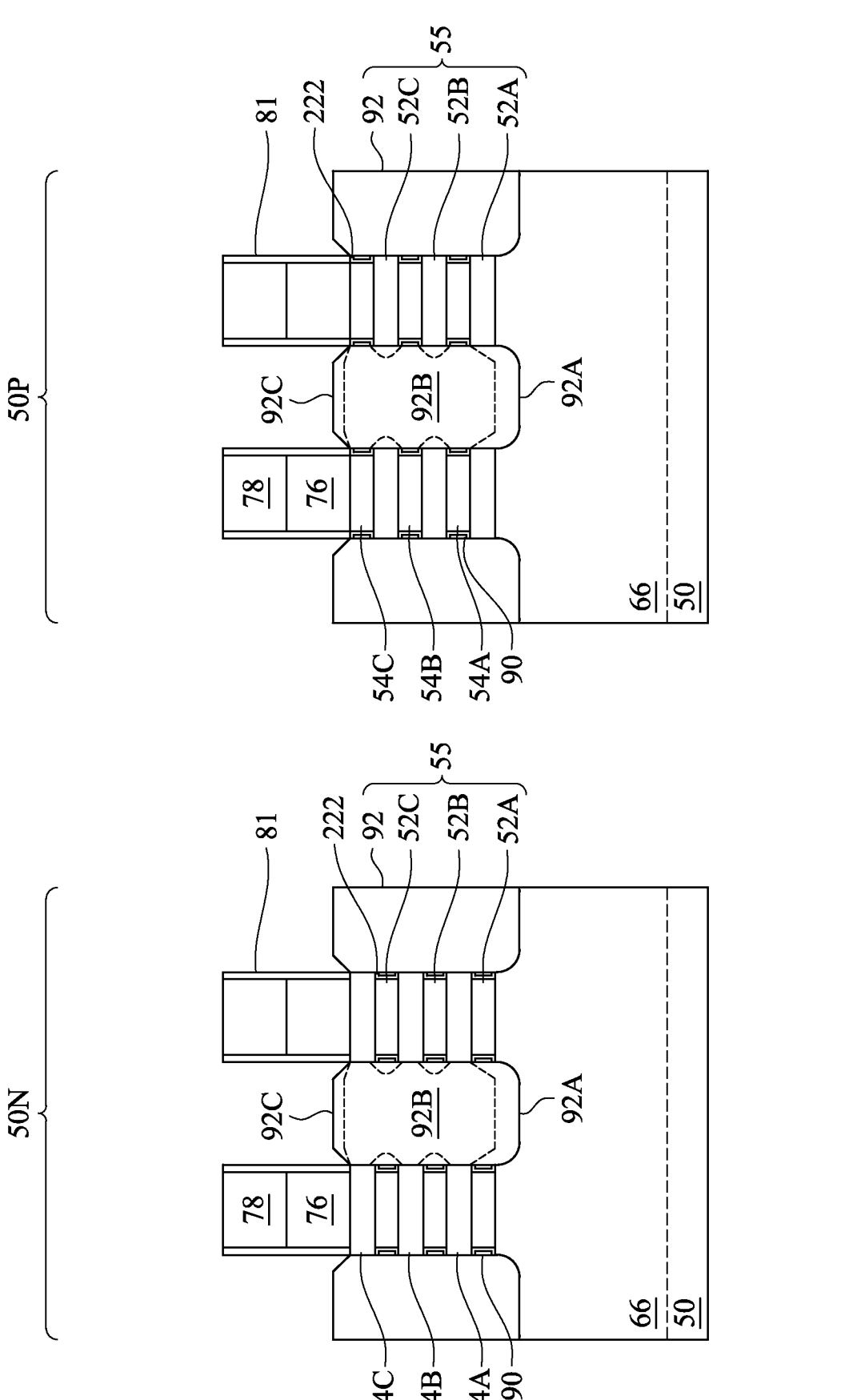
Figure 18C:
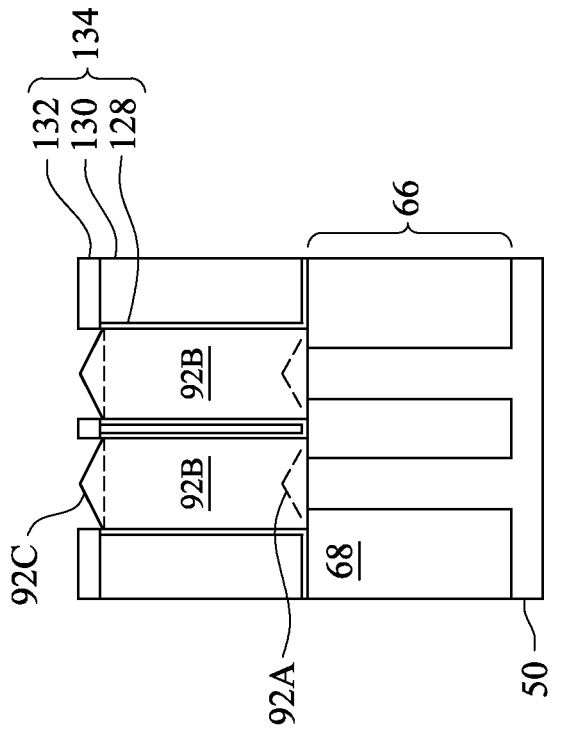

As a result of the epitaxy processes used to form the epitaxial source/drain regions 92, upper surfaces of the epitaxial source/drain regions 92 have facets which expand laterally outward beyond sidewalls of the fins 66 and the nanostructures 55. However, the insulating fins 134 block the lateral epitaxial growth. Therefore, adjacent epitaxial source/drain regions 92 remain separated after the epitaxy process is completed as illustrated by FIG. 18C. The epitaxial source/drain regions 92 contact the sidewalls of the insulating fins 134. In the illustrated embodiment, the epitaxial source/drain regions 92 are grown so that the upper surfaces of the epitaxial source/drain regions 92 are disposed below the top surfaces of the insulating fins 134. In various embodiments, the upper surfaces of the epitaxial source/drain regions 92 are disposed above the top surfaces of the insulating fins 134; the upper surfaces of the epitaxial source/drain regions 92 have portions disposed above and below the top surfaces of the insulating fins 134; or the like. For example, the insulating fins 134 may insulate and physically separate the epitaxial source/drain regions 92 of adjacent transistors.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited in discrete portions adjacent to the nanostructures 55 and the substrate 50, the second semiconductor material layer 92B may be deposited over the first semiconductor material layer 92A and merge into a continuous layer, and the third semiconductor material layer 92C may be deposited over the second semiconductor material layer 92B.

Figure 18D:
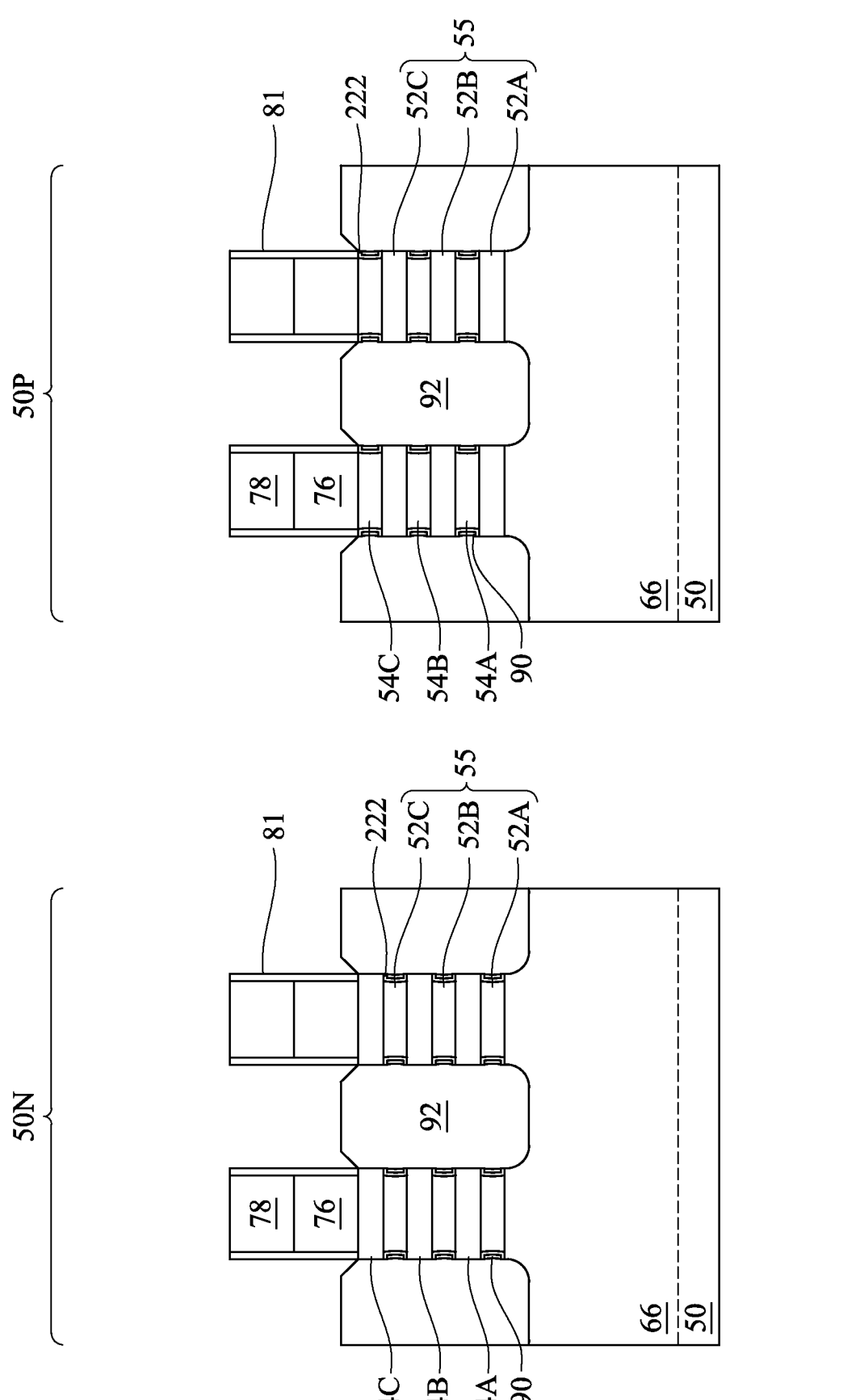

FIG. 18D illustrates an embodiment in which sidewalls of the first nanostructures 52 in the n-type region 50N and sidewalls of the second nanostructures 54 in the p-type region 50P are concave, outer sidewalls of the second diffusion barrier layer 222, outer sidewalls of the inner spacers 90 are concave, and the inner spacers 90 are recessed from sidewalls of the second nanostructures 54 and the first nanostructures 52, respectively. As illustrated in FIG. 18D, the epitaxial source/drain regions 92 may be formed in contact with the inner spacers 90 and may extend past sidewalls of the second nanostructures 54 in the n-type region 50N and past sidewalls of the first nanostructures 52 in the p-type region 50P.

As discussed above, after being epitaxially grown, the epitaxial source/drain regions 92 are annealed, for example, at a temperature greater than or equal to 900° C., such as greater than or equal to 1000° C. During the anneal, elements, dopants, and impurities in the epitaxial source/drain regions 92 and in the nanostructures 55 may tend to diffuse toward adjacent features. For example, germanium (if present) may diffuse from the epitaxial source/drain regions 92 toward the nanostructures 55 due to the germanium being less stably bonded than silicon within the epitaxial source/drain regions 92. Similarly, germanium at endpoints of the nanostructures 55 (e.g., the first nanostructures 52) may be less stably bonded than silicon in the crystalline super-lattice due to the endpoints being partially amorphous. The second diffusion barrier layer 222 inhibits (e.g., prevents or reduces) the germanium from diffusing from the epitaxial source/drain regions 92 into the nanostructures 55. Similarly, the second diffusion barrier layer 222 inhibits, for example, germanium from diffusing from the nanostructures 55 into the epitaxial source/drain regions 92.

The nitrogen-rich portion of the second diffusion barrier layer 222 may provide a more robust diffusion barrier than the bulk portion of the second diffusion barrier layer 222. As a result, germanium (or other elements, dopants, and impurities) may diffuse more easily into the bulk portion of the second diffusion barrier layer 222 from the epitaxial source/drain regions 92, while the nitrogen-rich portion of the second diffusion barrier layer 222 prevents or reduces germanium (or other elements, dopants, and impurities) from diffusing between the nanostructures 55 (e.g., the first nanostructures 52) and the epitaxial source/drain regions 92. In some embodiments, the second diffusion barrier layer 222 prevents any germanium from diffusing between the nanostructures 55 and the epitaxial source/drain regions 92. For example, following the anneal, the bulk portion of the second diffusion barrier layer 222 may have a germanium concentration ranging from 15 at. % to 30 at. %. As a result of the second diffusion barrier layer 222 inhibiting diffusion as described above, the epitaxial source/drain regions 92 maintain the desired composition, thereby improving performance of the semiconductor devices. The second diffusion barrier layer 222 continues to serve as the above-described barrier through subsequent processing steps, including those that may include thermal treatments.

Figure 19A:
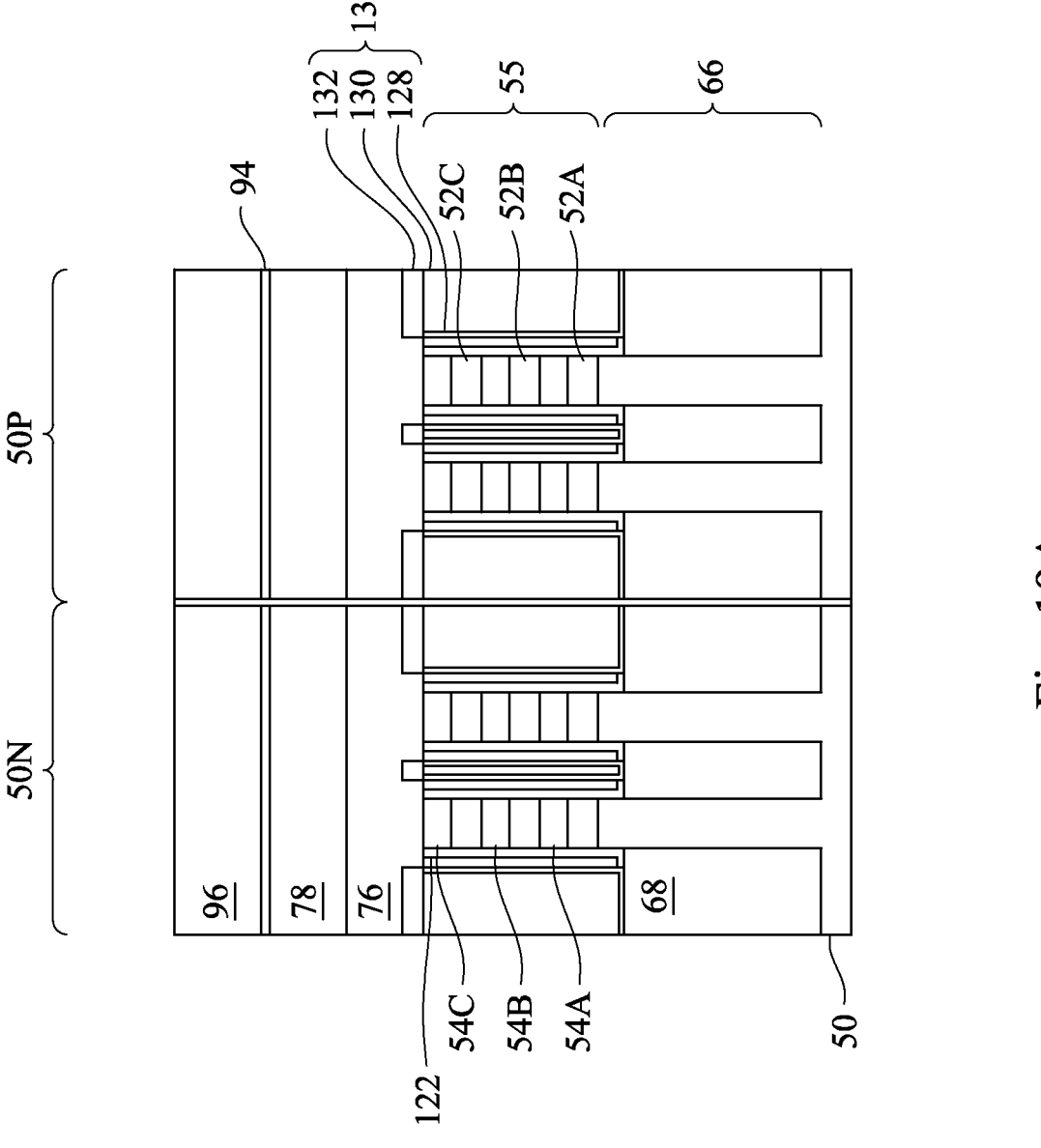
Figure 19B:
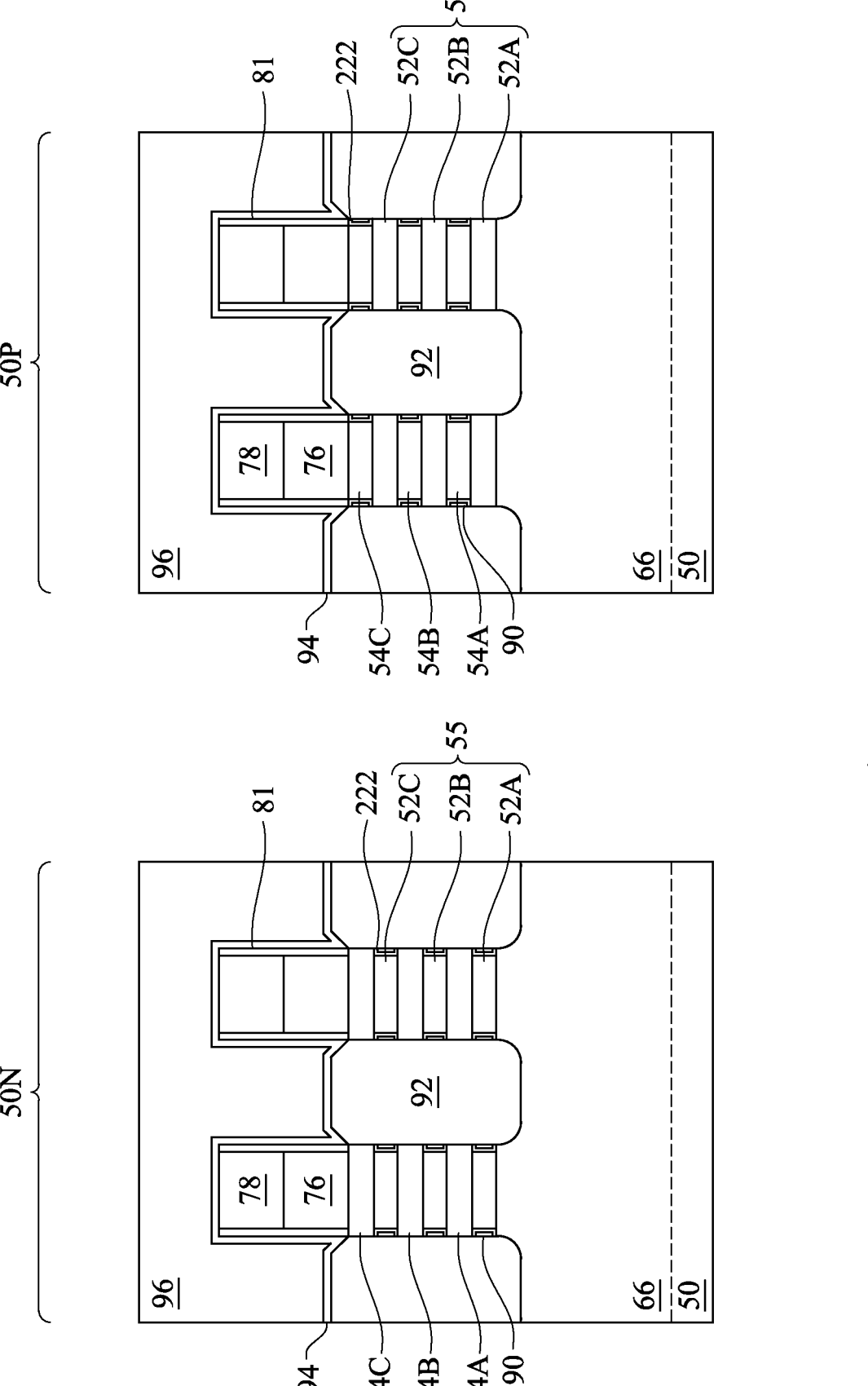
Figure 19C:
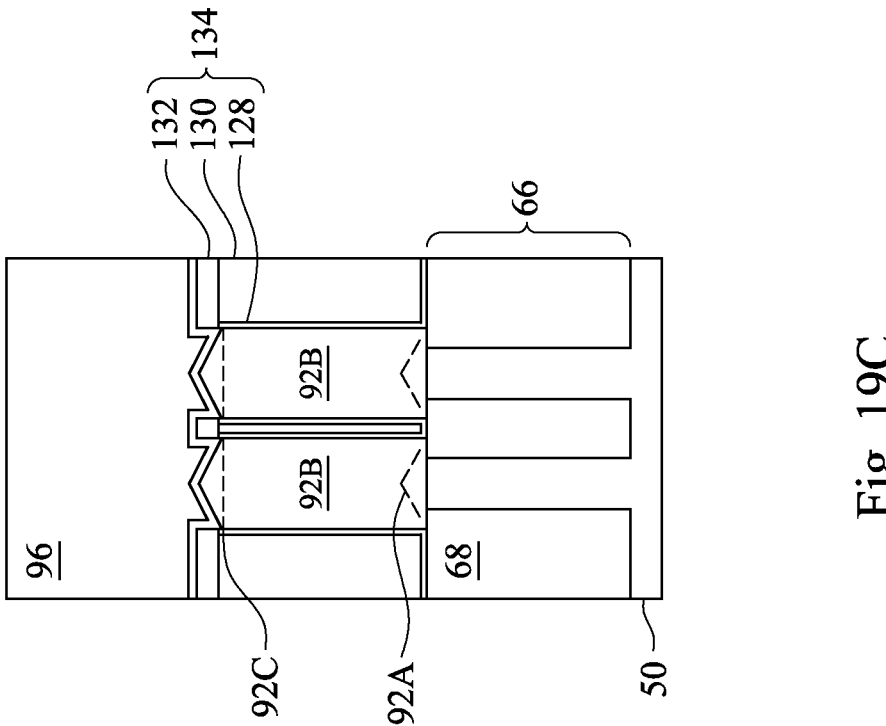

In FIGS. 19A-19C, a first interlayer dielectric (ILD) 96 is deposited over the structure. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the dummy masks 78, the gate spacers 81, and the insulating fins 134. The CESL 94 may comprise a dielectric material, such as, silicon nitride, silicon oxide, silicon oxynitride, or the like, having a different etch rate than the material of the overlying first ILD 96.

Figure 20A:
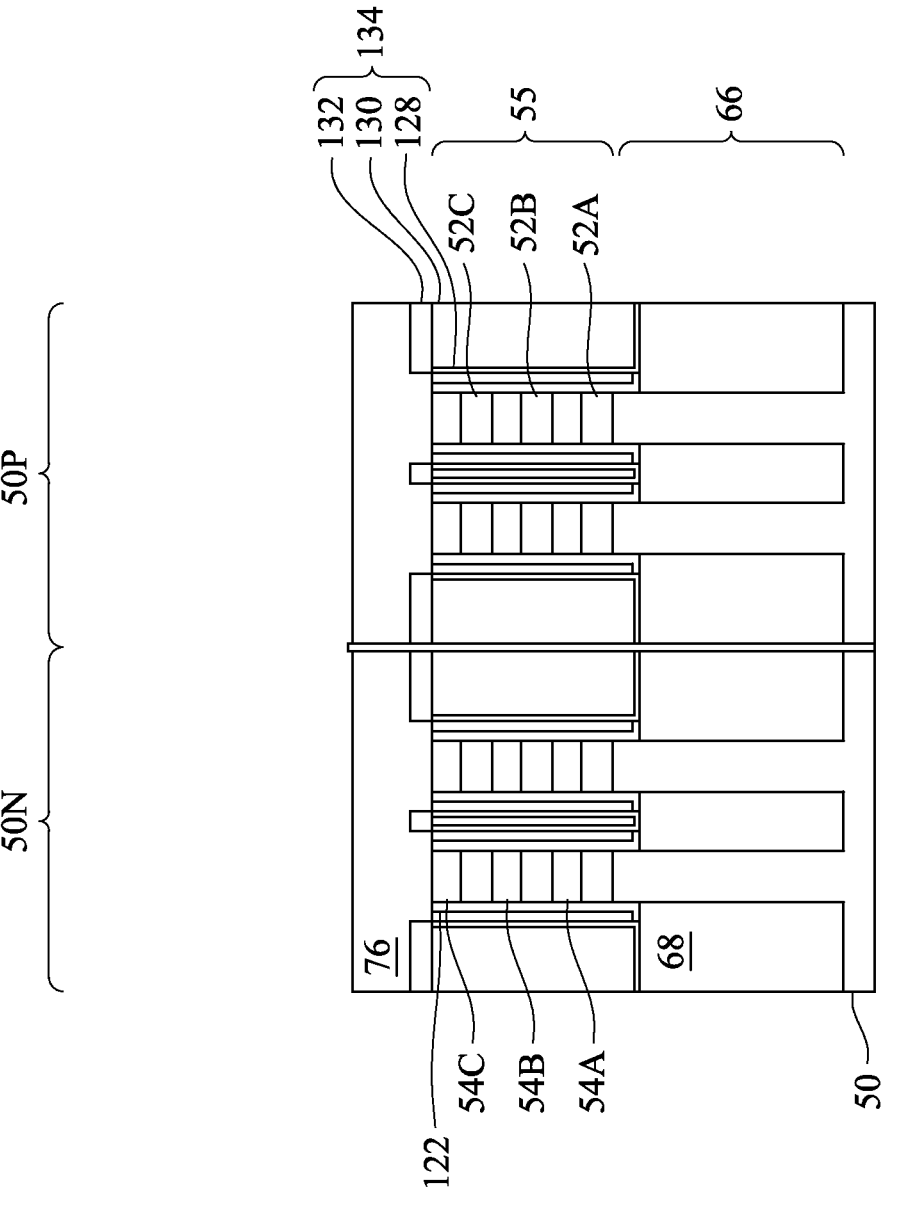
Figure 20B:
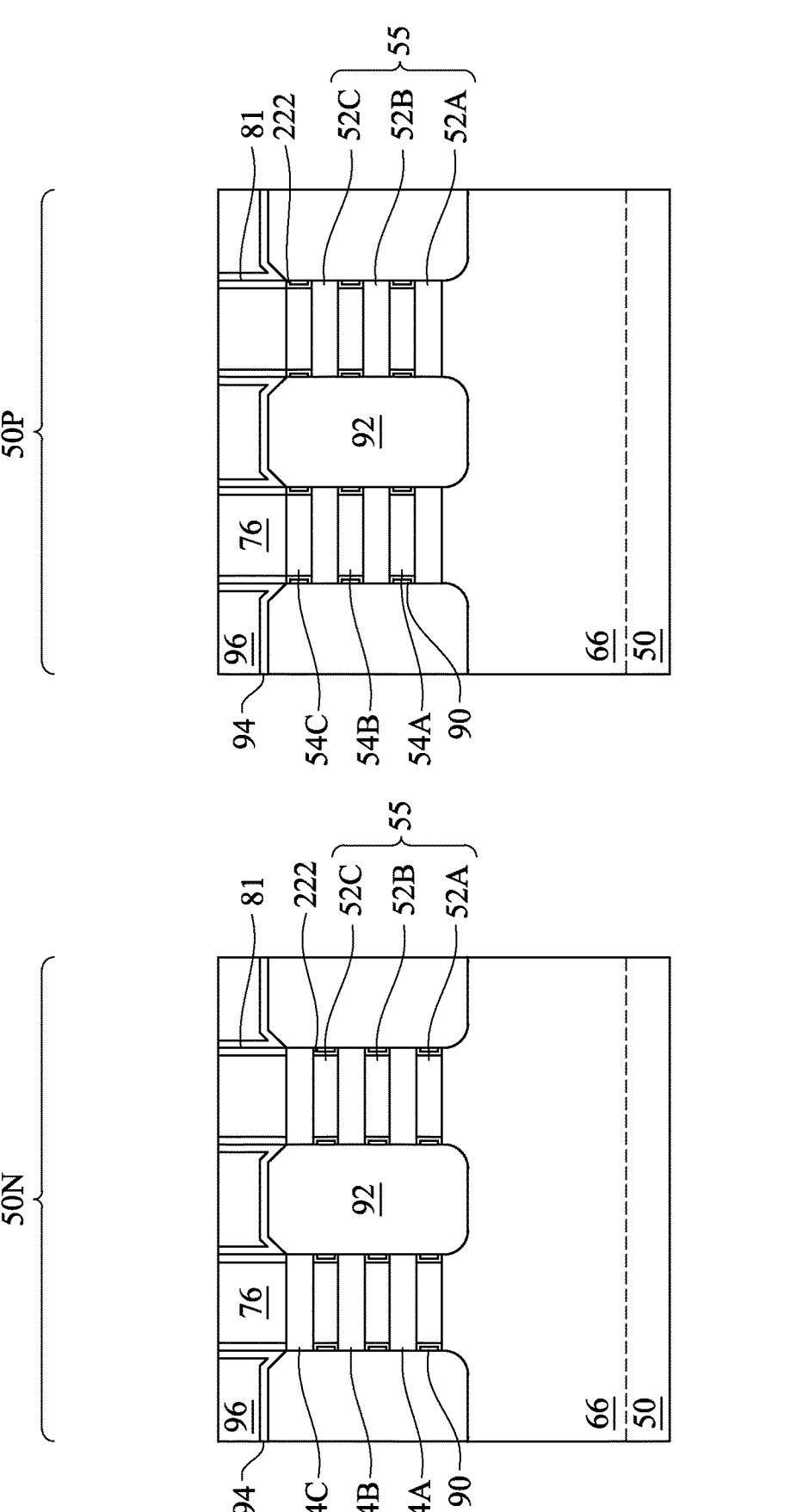
Figure 20C:
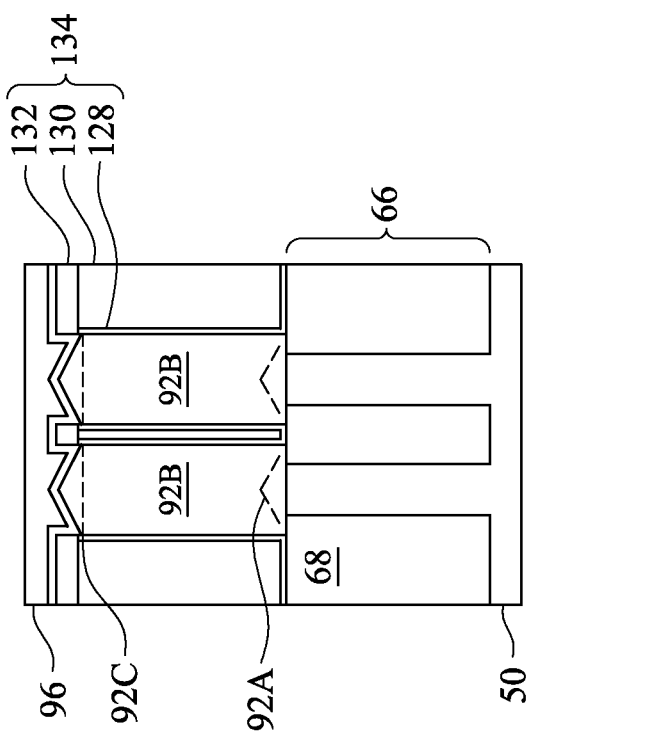

In FIGS. 20A-20C, a planarization process, such as a CMP, may be performed to level a top surface of the first ILD 96 with top surfaces of the dummy gates 76 or the dummy masks 78. The planarization process may also remove the dummy masks 78 on the dummy gates 76, and portions of the gate spacers 81 along sidewalls of the dummy masks 78. After the planarization process, the top surfaces of the dummy gates 76, the gate spacers 81, and the first ILD 96 are level within process variations. Accordingly, the top surfaces of the dummy gates 72 are exposed through the first ILD 96. In some embodiments, the dummy masks 78 may remain, in which case, the planarization process levels the top surface of the first ILD 96 with top surfaces of the dummy masks 78 and the gate spacers 81.

Figure 21A:
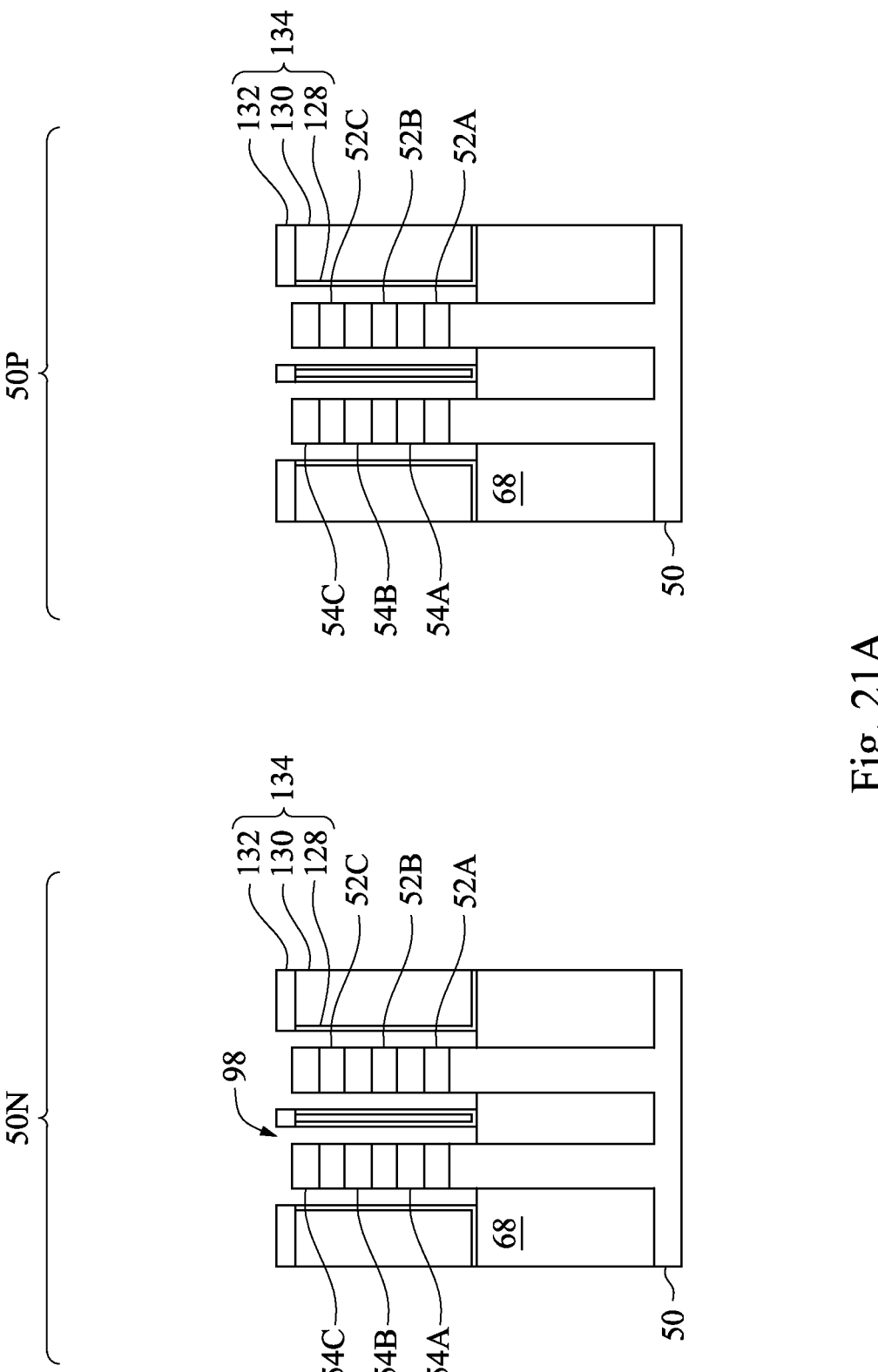
Figure 21B:
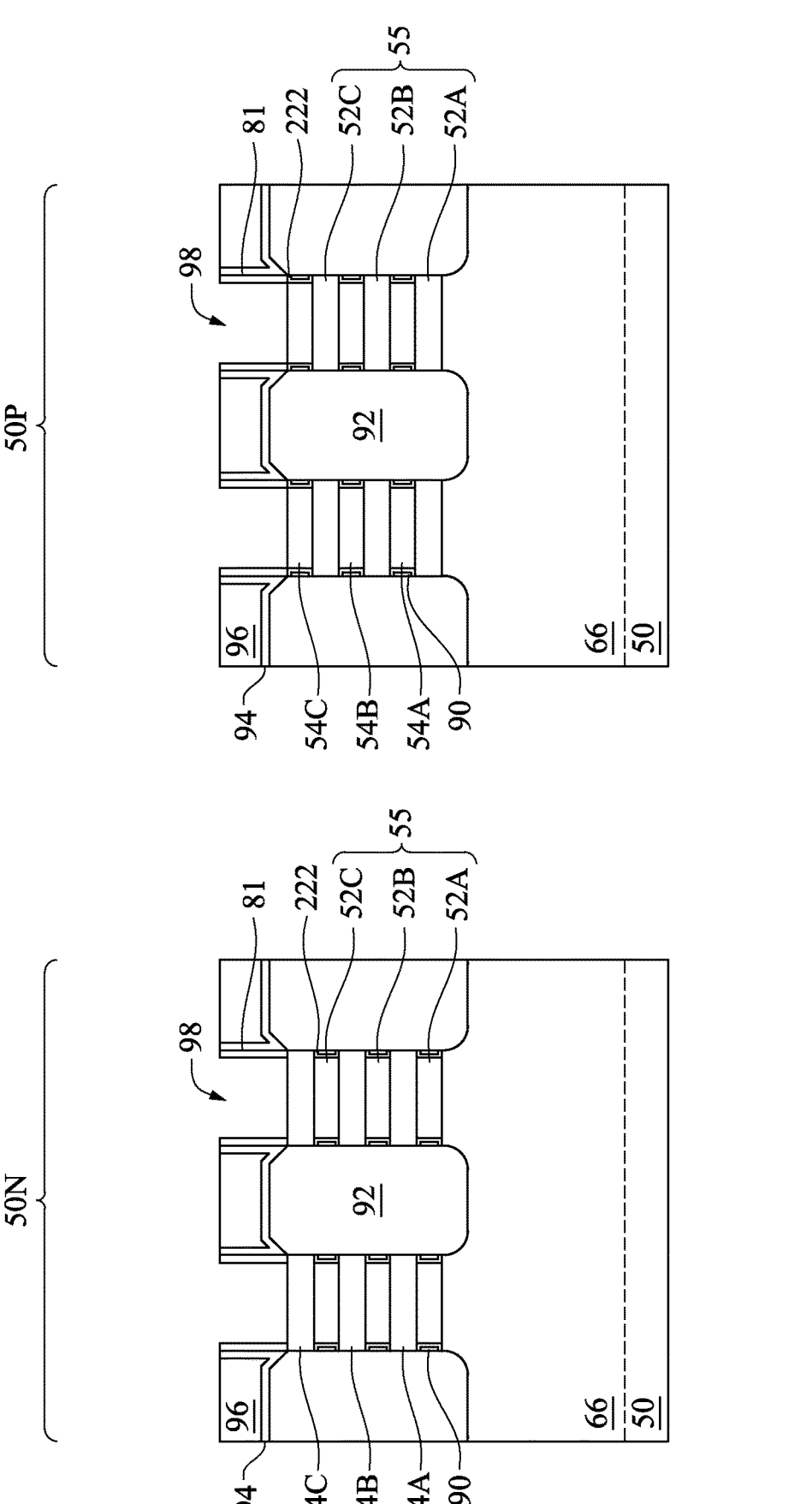
Figure 21C:
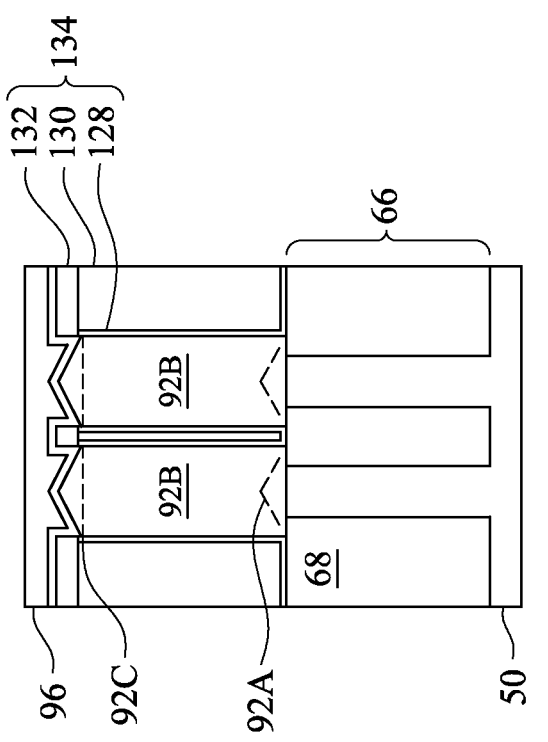

In FIGS. 21A-21C, the dummy gates 76, the dummy masks 78 (if present) the first diffusion barrier layer 122, and the first isolation layer 126 are removed in one or more etching steps to form second recesses 98. In some embodiments, the dummy gates 76, the first diffusion barrier layer 122, and the first isolation layer 126 are removed by one or more anisotropic dry etch processes. For example, the etching process may include a dry etch process using reaction gas(es) that selectively etch the dummy gates 76 at a faster rate than the first ILD 96, the gate spacers 81, or the insulating fins 134. Each second recess 98 exposes and/or overlies portions of nanostructures 55, which act as channel regions in subsequently completed nanostructure devices. Portions of the nanostructures 55 which act as the channel regions are disposed between neighboring pairs of the epitaxial source/drain regions 92. During the removal, first isolation layer 126 and the first diffusion barrier layer 122 may be used as etch stop layers when the dummy gates 76 are etched. As such, the first isolation layer 126 and the first diffusion barrier layer 122 may then be removed using one or more etch processes after the removal of the dummy gates 76.

Figure 22A:
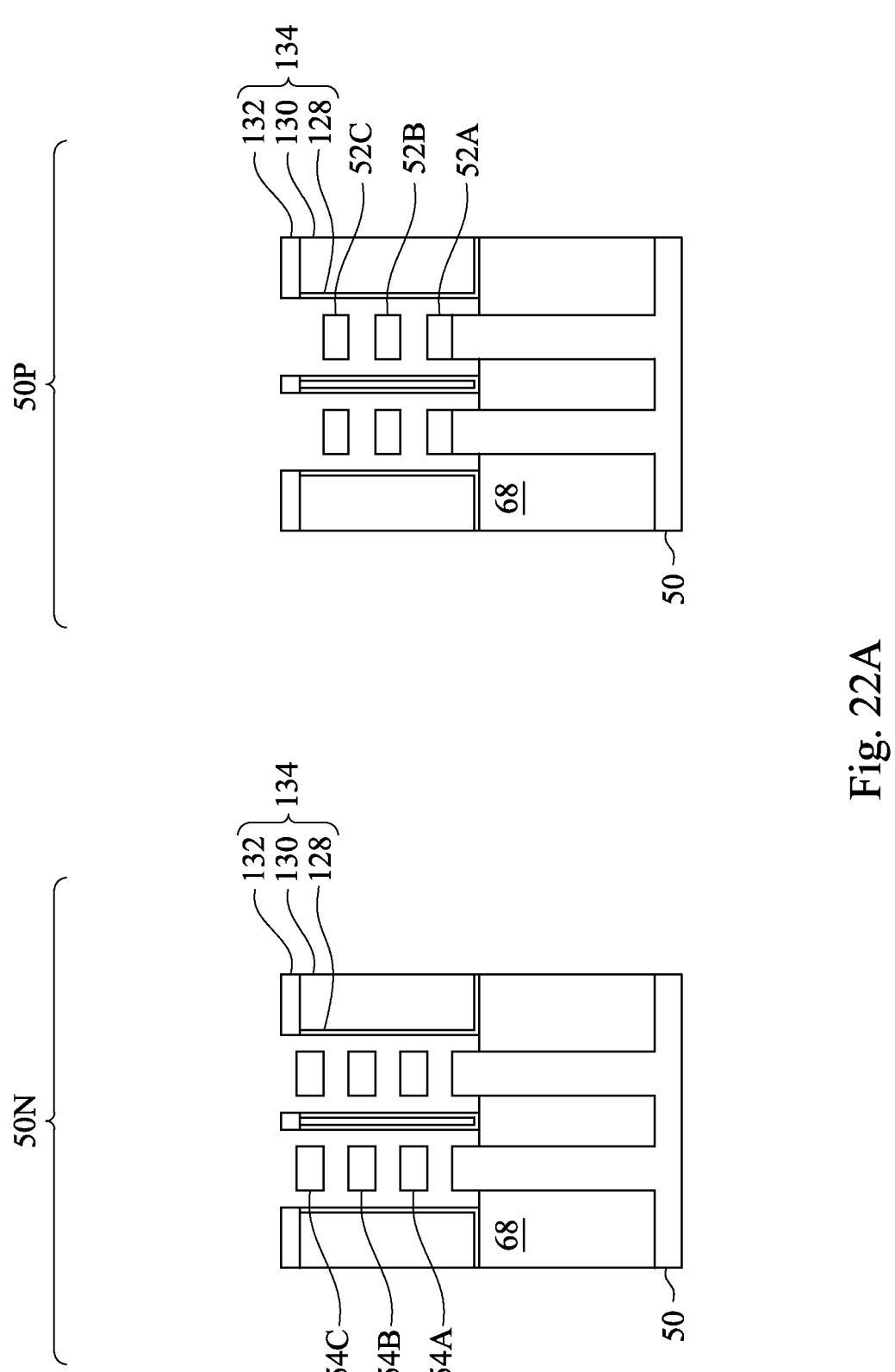
Figure 22B:
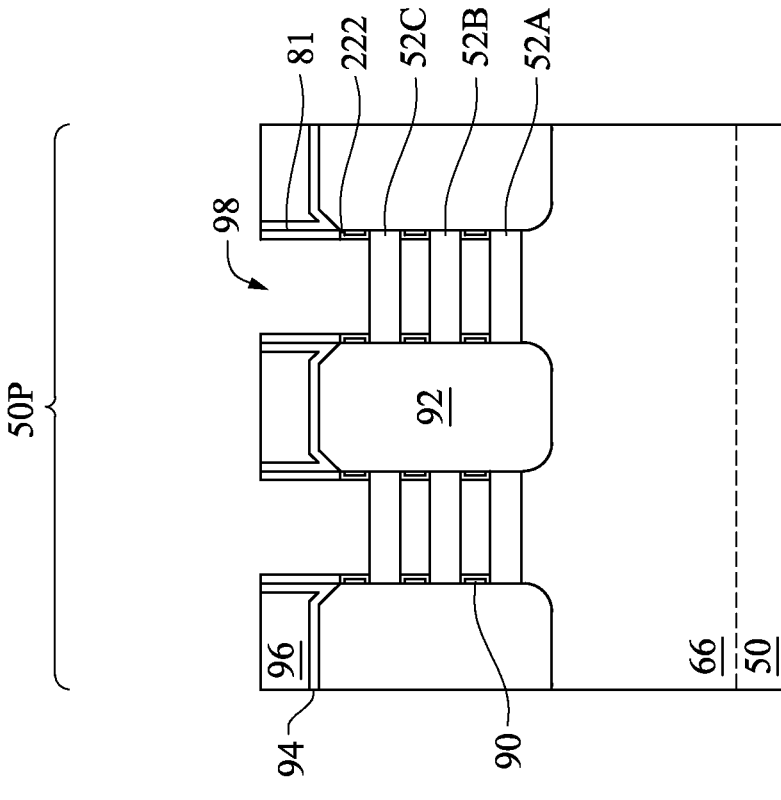
Figure 22B:
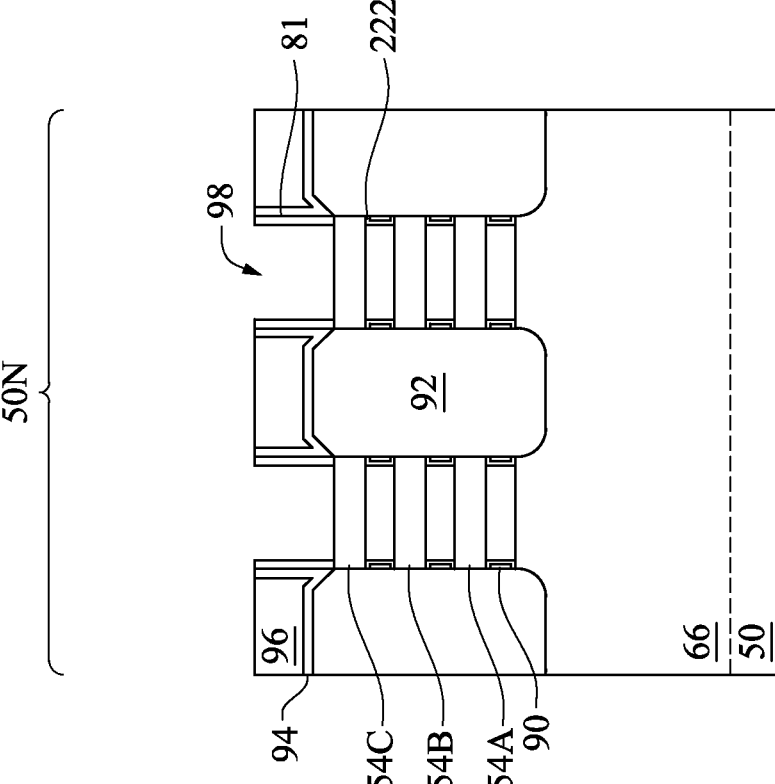
Figure 22C:
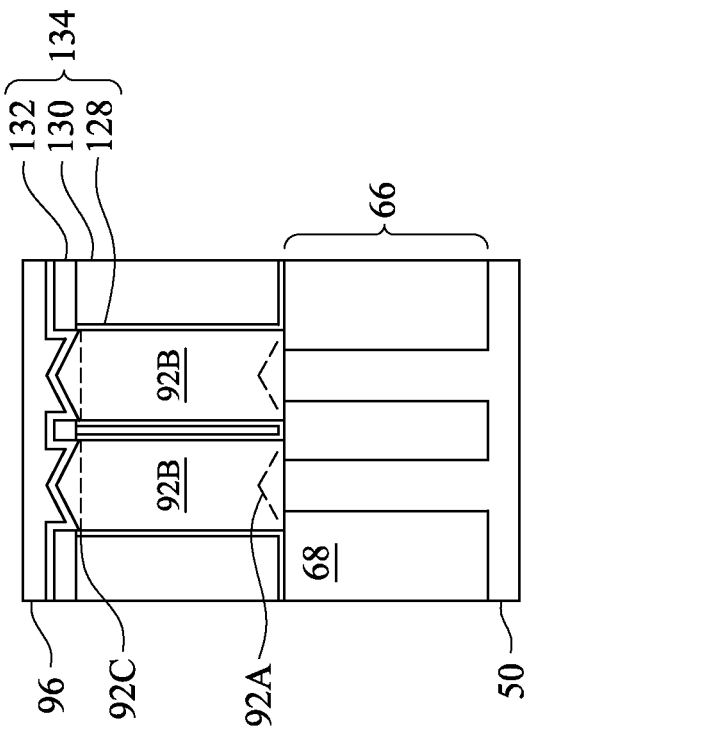

In FIGS. 22A-22C, the first nanostructures 52 in the n-type region 50N and the second nanostructures 54 in the p-type region 50P are removed extending the second recesses 98 between adjacent ones of the remaining nanostructures 55. The first nanostructures 52 in the n-type region 50N may be removed by forming a mask (not shown) over the p-type region 50P and performing an isotropic etching process such as wet etching or the like using etchants which are selective to the materials of the first nanostructures 52, while the second nanostructures 54, the substrate 50, the STI regions 68, and the insulating fins 134 remain relatively unetched as compared to the first nanostructures 52. In embodiments in which the first nanostructures 52 include, e.g., SiGe, and the second nanostructures 54 include, e.g., Si or SiC, tetramethylammonium hydroxide (TMAH), ammonium hydroxide (NH₄OH), or the like may be used to remove the first nanostructures 52 in the n-type region 50N. In addition, portions of the second diffusion barrier layer 222 may be removed after being exposed by removal of the first nanostructures 52 (see FIG. 23B).

The second nanostructures 54 in the p-type region 50P may be removed by forming a mask (not shown) over the n-type region 50N and performing an isotropic etching process such as wet etching or the like using etchants which are selective to the materials of the second nanostructures 54, while the first nanostructures 52, the substrate 50, the STI regions 68, and the insulating fins 134 remain relatively unetched as compared to the second nanostructures 54. In embodiments in which the second nanostructures 54 include, e.g., Si or SiC, and the first nanostructures 52 include, e.g., SiGe, hydrogen fluoride, another fluorine-based etchant, or the like may be used to remove the second nanostructures 54 in the p-type region 50P. In addition, portions of the second diffusion barrier layer 222 may be removed after being exposed by removal of the second nanostructures 54 (see FIG. 23B).

In some embodiments, the channel regions in the n-type region 50N and the p-type region 50P may be formed simultaneously, for example by removing the first nanostructures 52 in both the n-type region 50N and the p-type region 50P or by removing the second nanostructures 54 in both the n-type region 50N and the p-type region 50P. In such embodiments, channel regions of n-type nanostructure devices and p-type nanostructure devices may have a same material composition, such as silicon, silicon germanium, or the like. FIGS. 28A-28C illustrate structures resulting from such embodiments where the channel regions in both the p-type region 50P and the n-type region 50N are provided by the second nanostructures 54 and comprise silicon, for example.

Figure 23A:
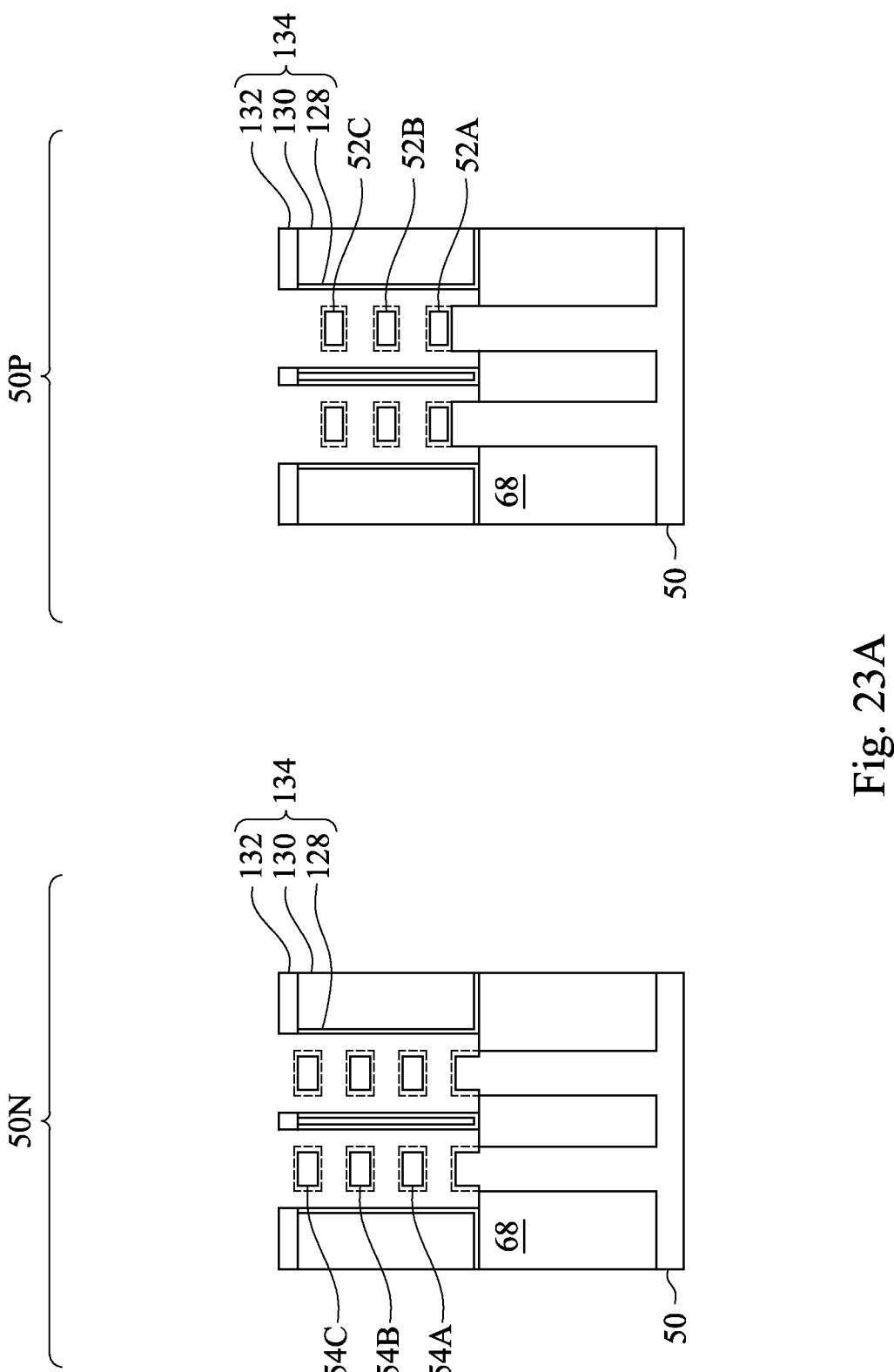
Figure 23B:
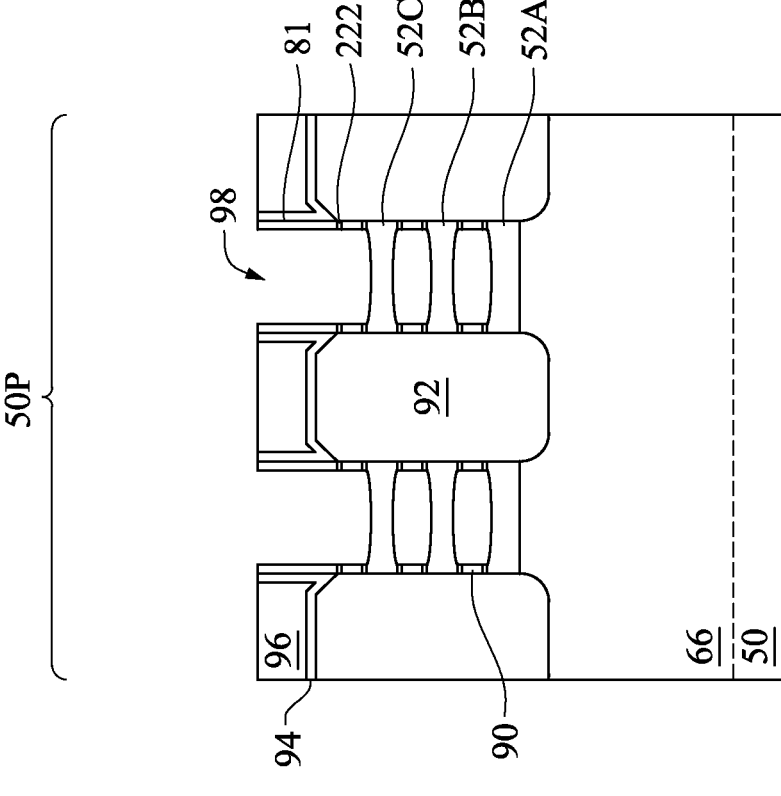
Figure 23B:
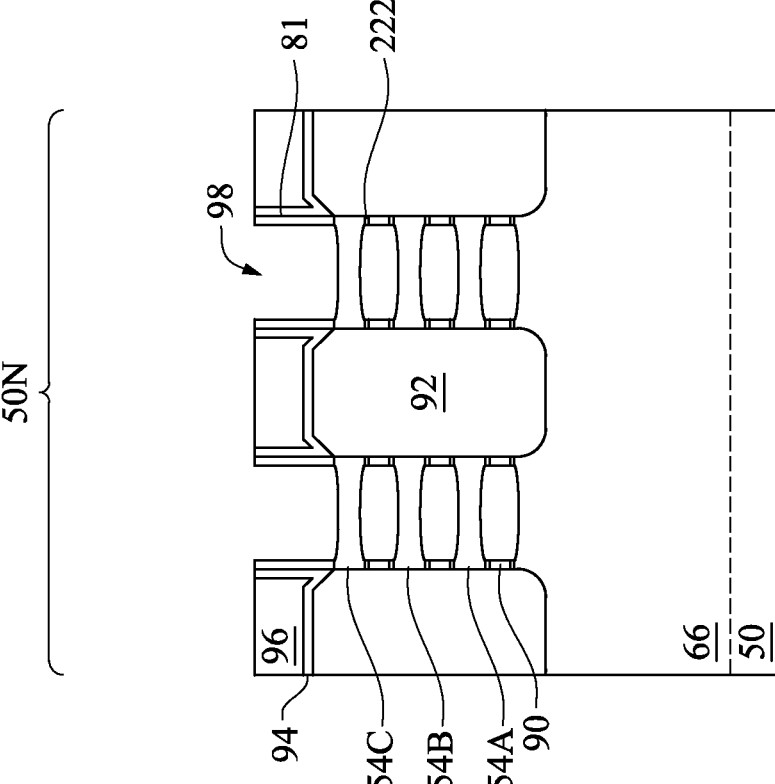
Figure 23C:
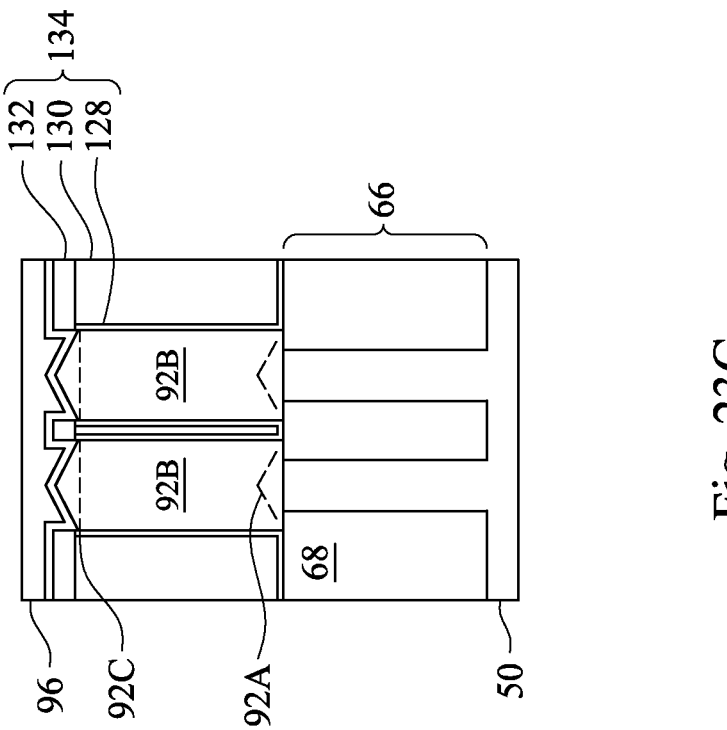

In FIGS. 23A-23C, optionally, the nanostructures 55 in the n-type region 50N and/or in the p-type region 50P may be over-etched to narrow portions of the channel regions while increasing spacing of the second recesses 98 between adjacent channel regions. The over-etch process may be a continuation of the one or more etch processes described above or be an additional etch process. As illustrated, the over-etching may shape the channel regions (e.g., the remaining nanostructures 55) into barbell or dumbbell shapes. In addition, the exposed fins 66 (e.g., the substrate 50), for example, in the n-type region 50N may similarly be over-etched. In some embodiments, the over-etch may remove portions of the second diffusion barrier layer 222 until reaching the inner spacers 90. As illustrated, remaining portions of the second diffusion barrier layer 222 may be vertically interposed between the inner spacers 90 and the remaining nanostructures 55. In some embodiments (not specifically illustrated), other portions of the second diffusion barrier layer 222 may remain covering the inner spacers 90.

Figure 24A:
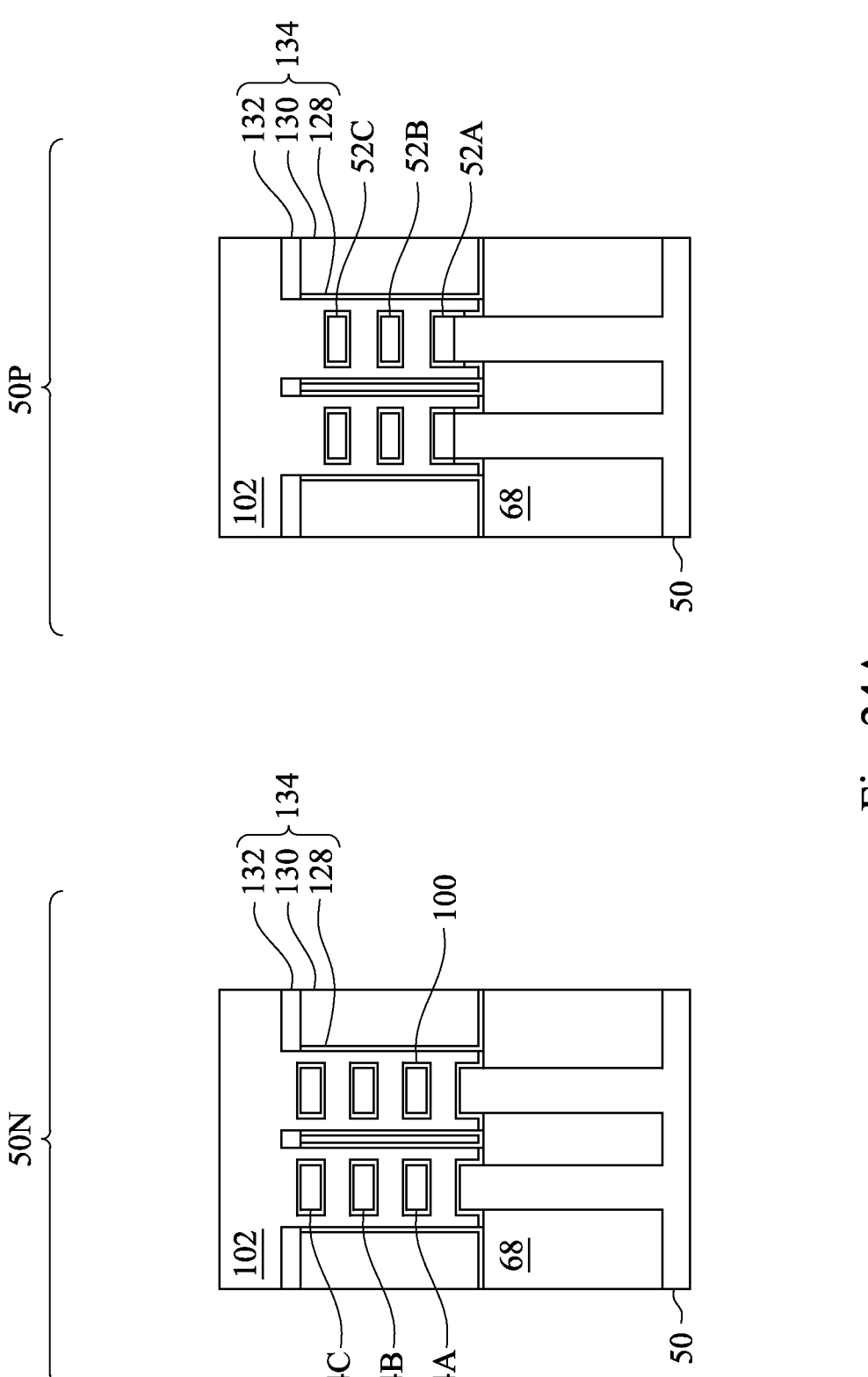
Figure 24B:
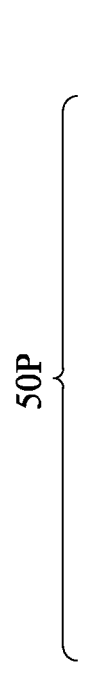
Figure 24B:
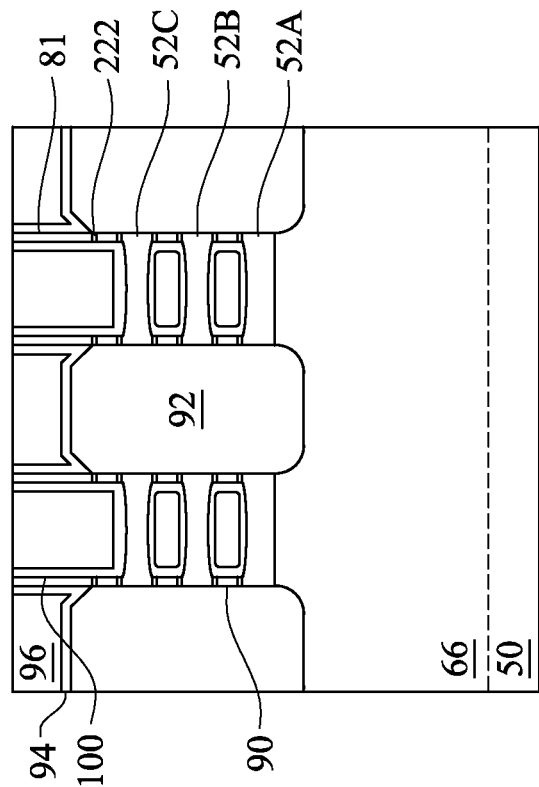
Figure 24B:
Figure 24B:
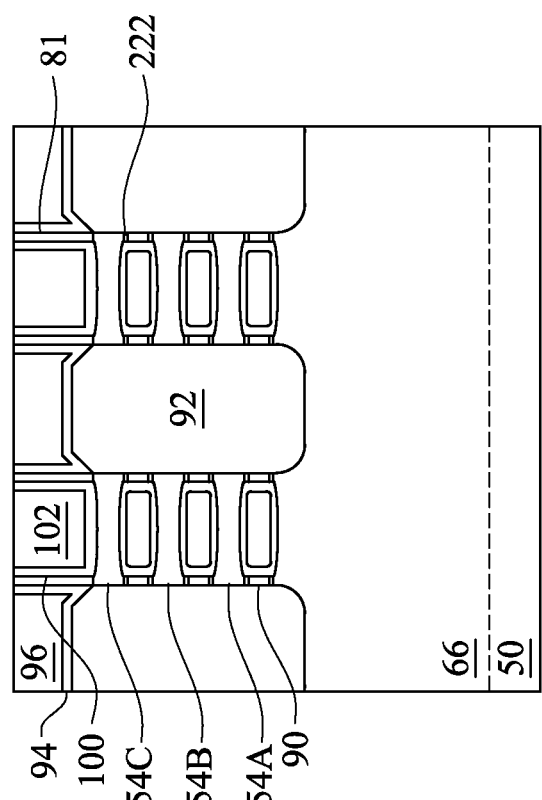
Figure 24C:
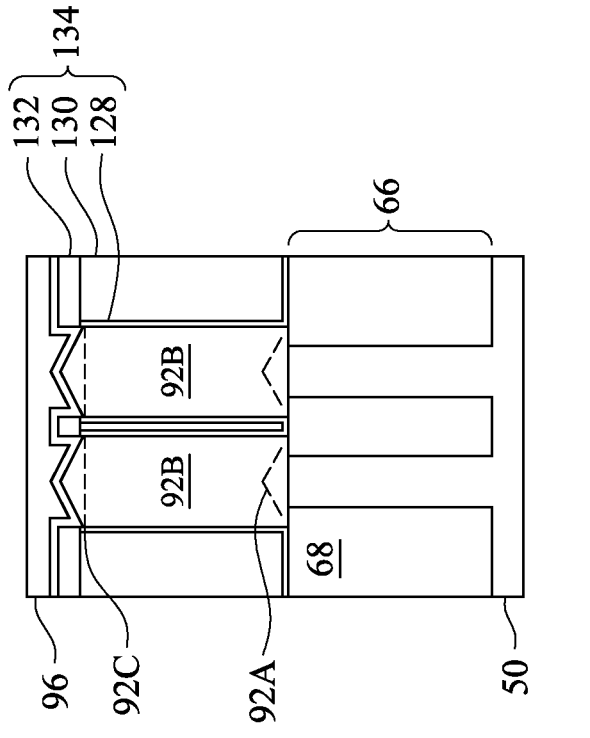

In FIGS. 24A-24C, gate dielectric layers 100 and gate electrodes 102 are formed for replacement gates. The gate dielectric layers 100 are deposited conformally in the second recesses 98. In the n-type region 50N, the gate dielectric layers 100 may be formed on top surfaces and sidewalls of the substrate 50 and on top surfaces, sidewalls, and bottom surfaces of the second nanostructures 54. In the p-type region 50P, the gate dielectric layers 100 may be formed on top surfaces and sidewalls of the substrate 50 and on top surfaces, sidewalls, and bottom surfaces of the first nanostructures 52. The gate dielectric layers 100 may also be deposited on top surfaces of the first ILD 96, the CESL 94, the gate spacers 81, and the STI regions 58 and on sidewalls of the inner spacers 90 and/or the second diffusion barrier layer 222.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nanostructure devices. The gate electrodes 102 and the gate dielectric layers 100 may be collectively referred to as "gate structures."

Figure 25A:
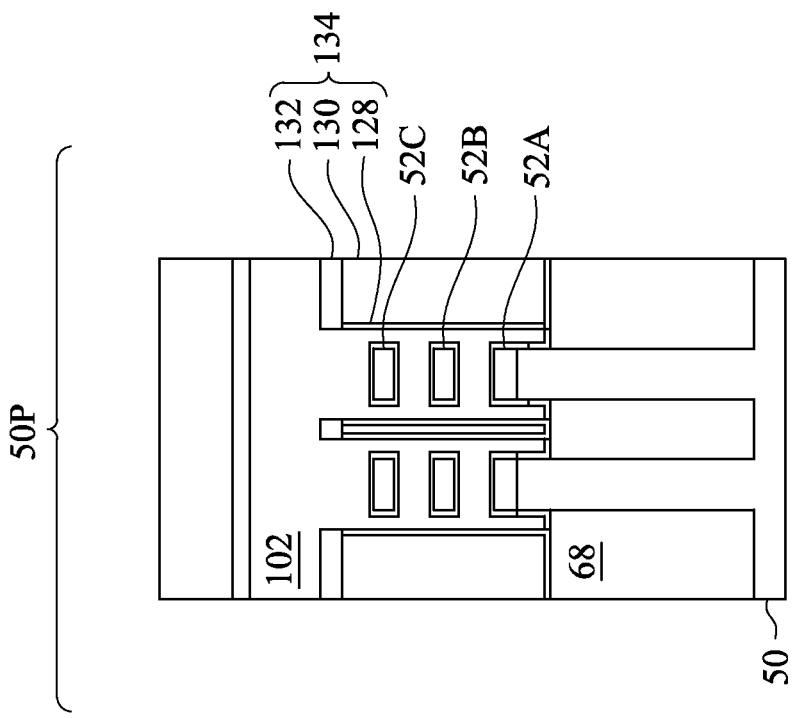
Figure 25A:
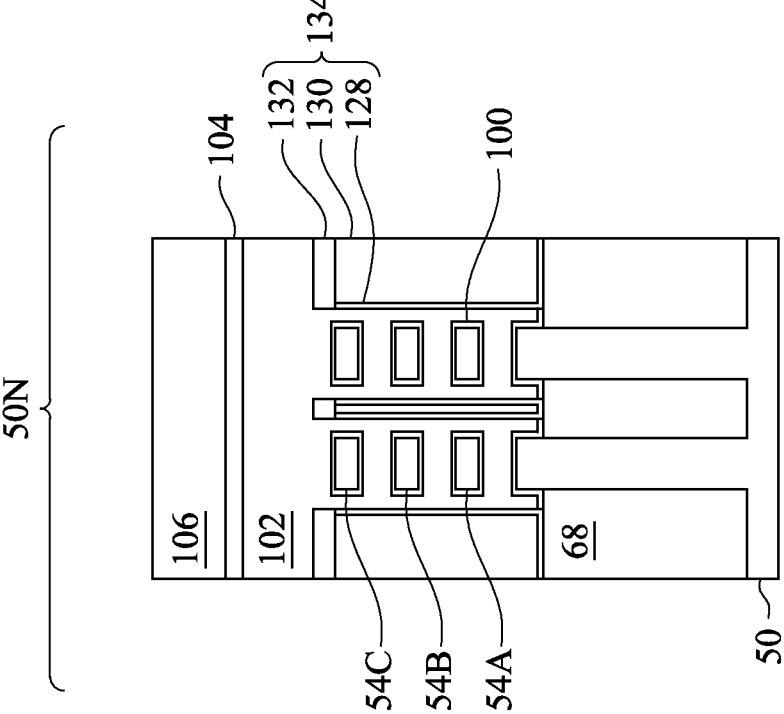
Figure 25B:
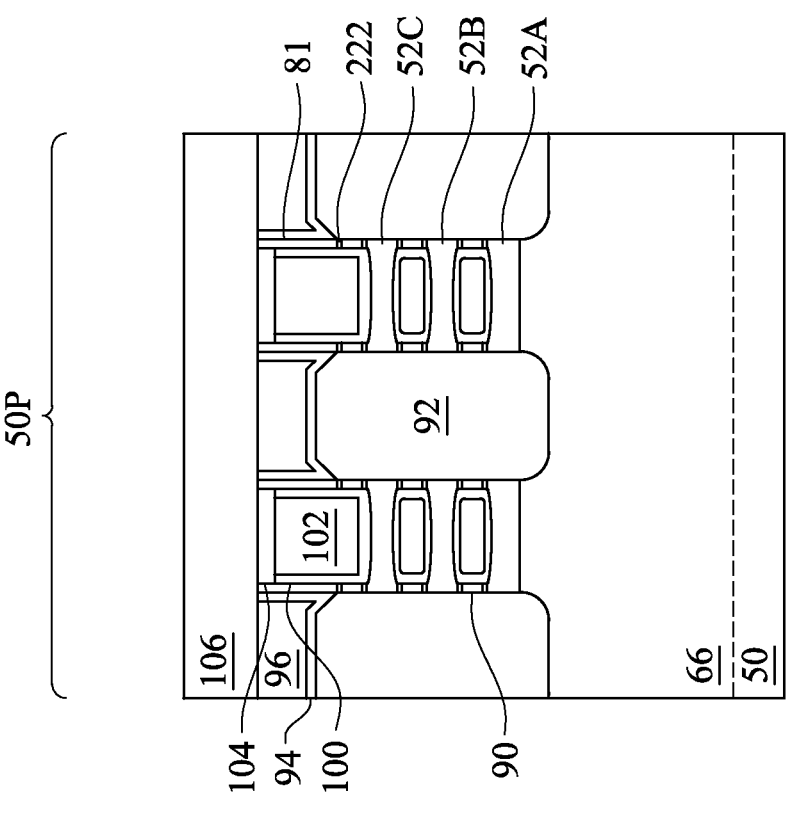
Figure 25B:
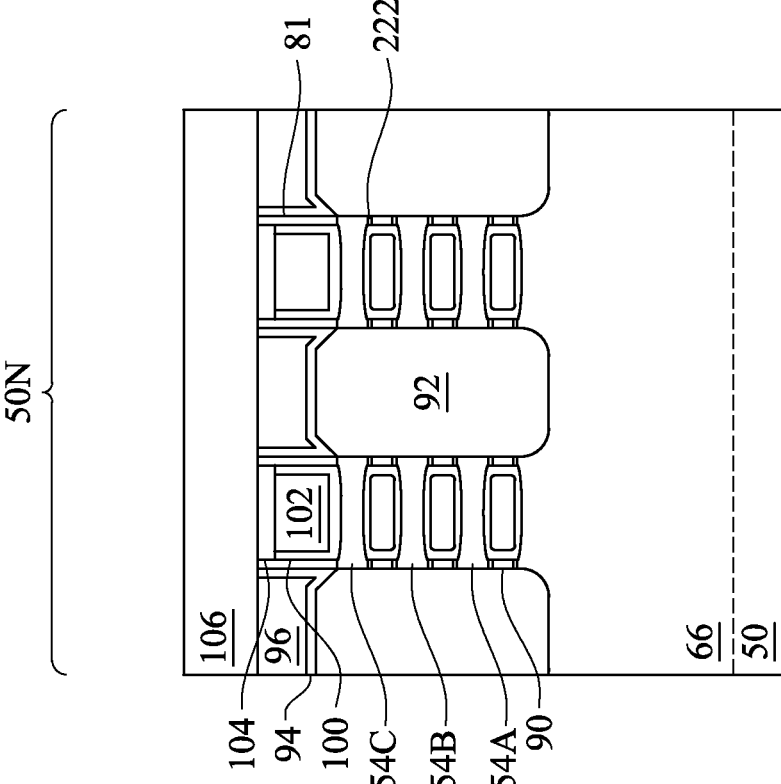
Figure 25C:
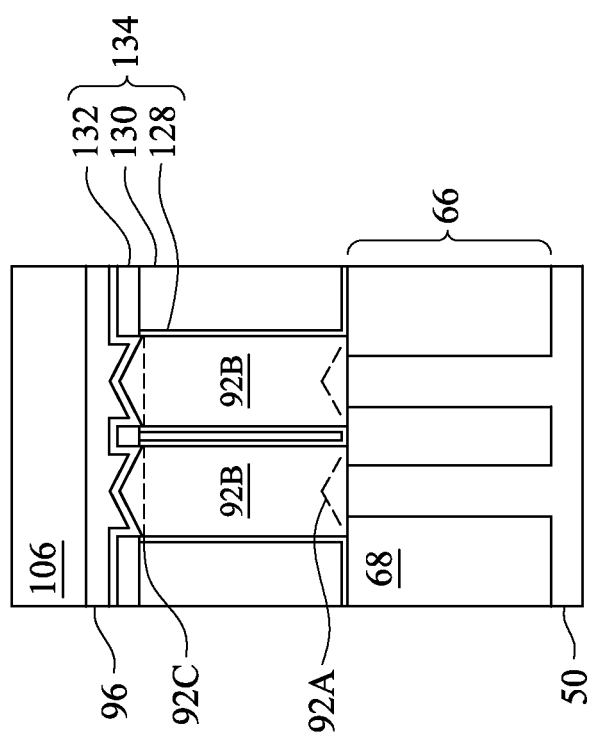

In FIGS. 25A-25C, the gate structure (including the gate dielectric layers 100 and the corresponding overlying gate electrodes 102) is recessed, so that a recess is formed directly over the gate structure and between opposing portions of gate spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 27A-28C) penetrate through the gate mask 104 to contact the top surface of the recessed gate electrodes 102.

As further illustrated, a second ILD 106 is deposited over the first ILD 96 and over the gate mask 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 26A:
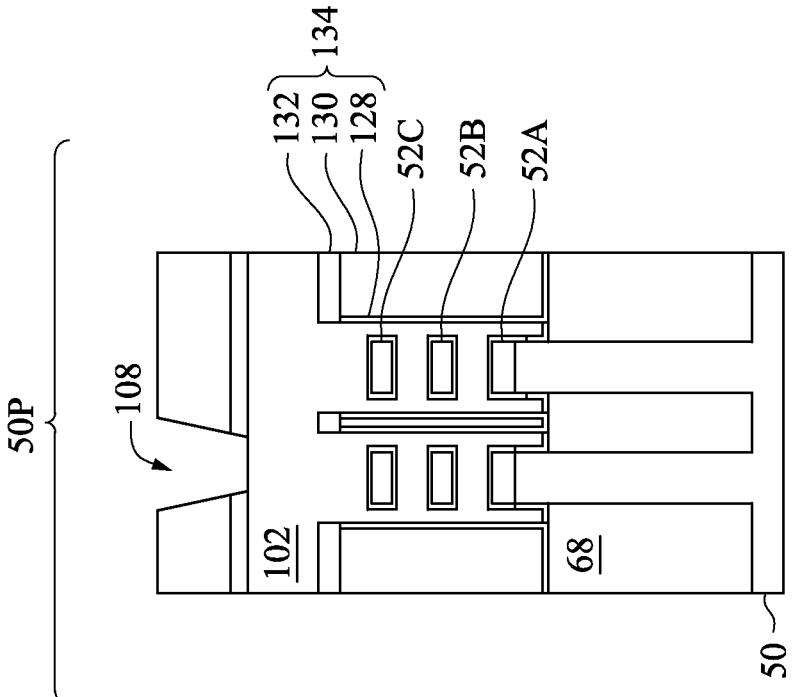
Figure 26A:
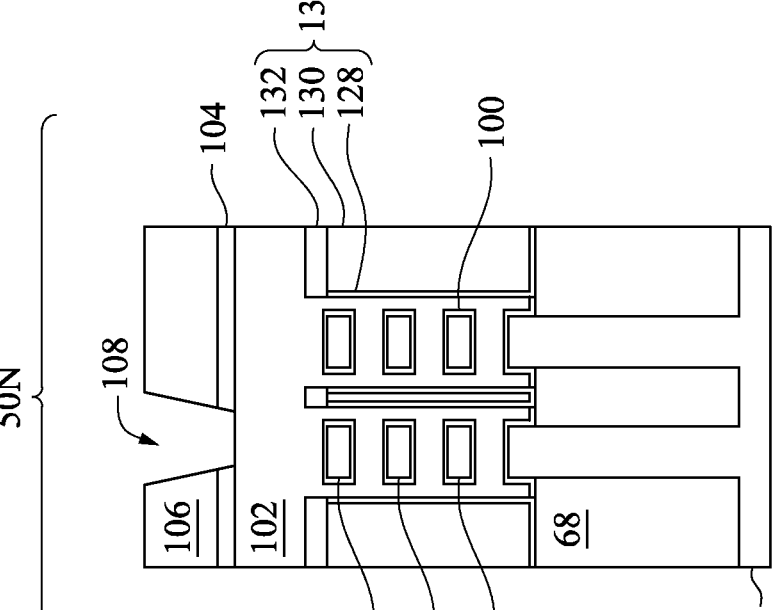
Figure 26B:
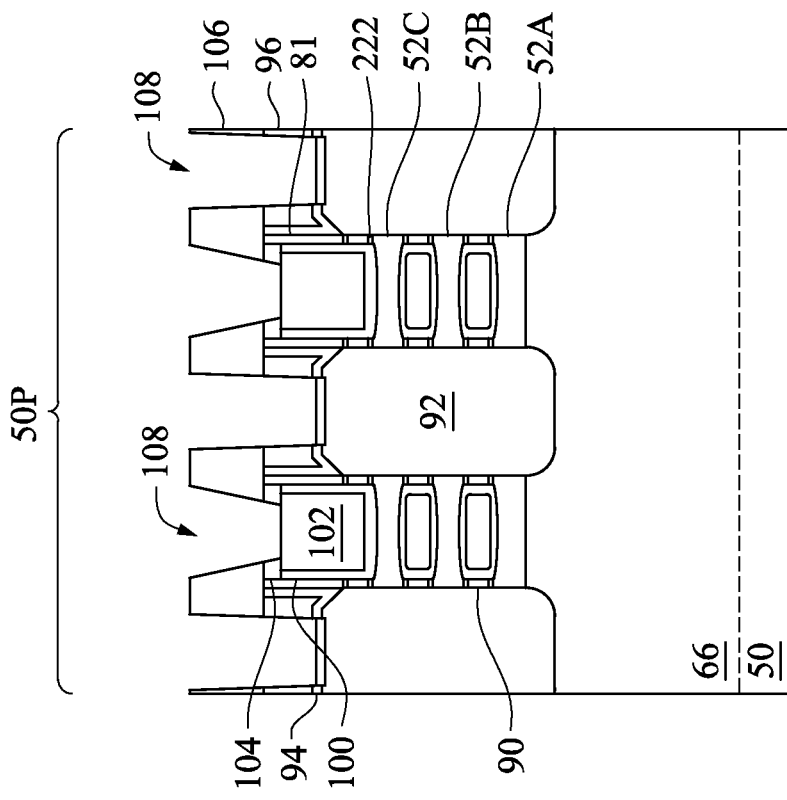
Figure 26B:
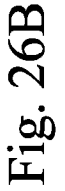
Figure 26B:
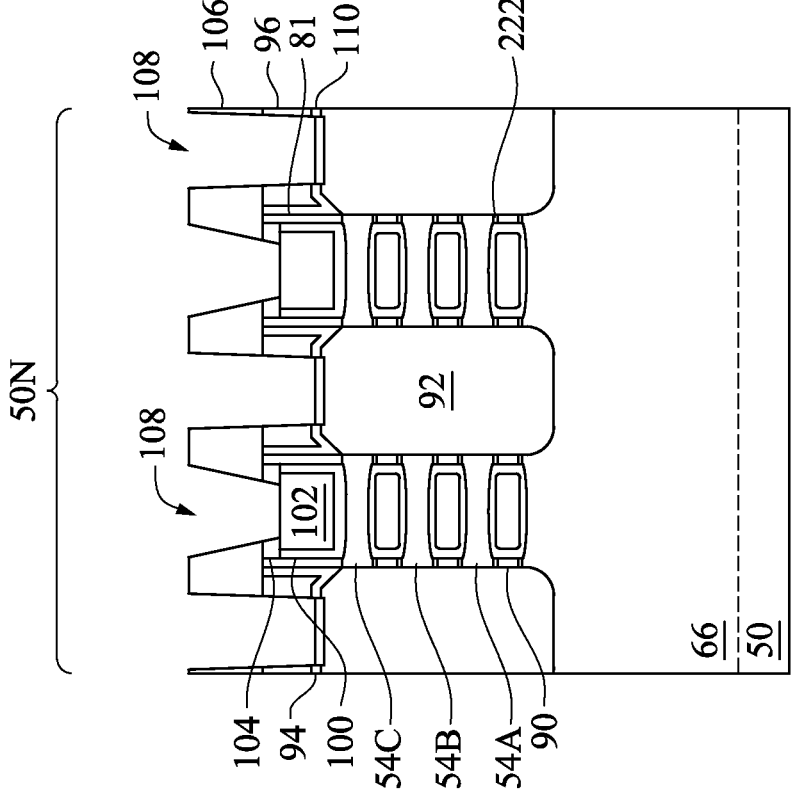
Figure 26C:
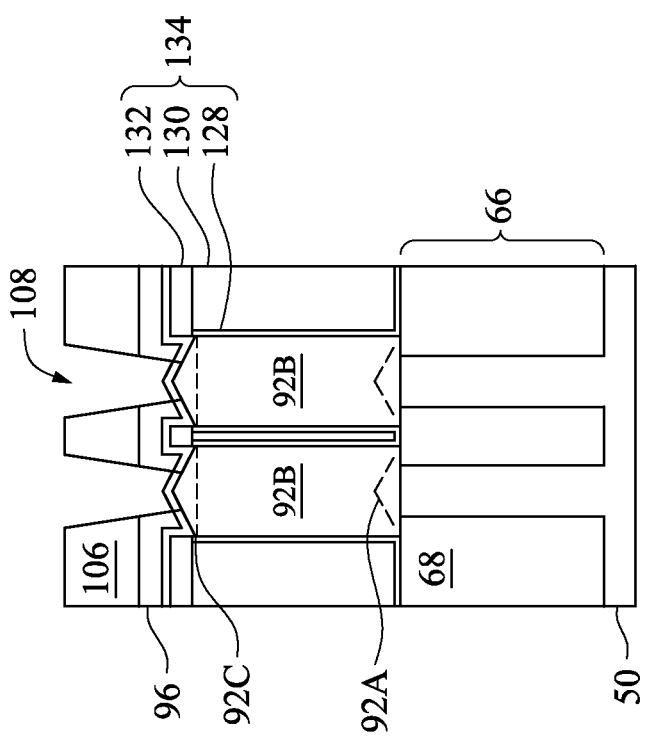

In FIGS. 26A-26C, the second ILD 106, the first ILD 96, the CESL 94, and the gate masks 104 are etched to form third recesses 108 exposing surfaces of the epitaxial source/ drain regions 92 and/or the gate structure. The third recesses 108 may be formed by etching using an anisotropic etching process, such as RIE, NBE, or the like. In some embodiments, the third recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/ drain regions 92 and/or the gate structure, and a bottom of the third recesses 108 may be level with (e.g., at a same level, or having a same distance from the substrate), or lower than (e.g., closer to the substrate) top surfaces of the epitaxial source/drain regions 92 and/or the gate structure. Although FIG. 26B illustrates the third recesses 108 as exposing the epitaxial source/drain regions 92 and the gate structure in same cross-section, in various embodiments, the epitaxial source/drain regions 92 and the gate structure may be exposed by the third recesses 108 in different cross-sections, thereby reducing the risk of shorting subsequently formed contacts.

After the third recesses 108 are formed, silicide regions 110 are formed over the epitaxial source/drain regions 92. In some embodiments, the silicide regions 110 are formed by first depositing a metal (not specifically illustrated) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The unreacted portions of the deposited metal may then be removed, for example, by an etching process. Although silicide regions 110 are referred to as silicide regions, silicide regions 110 may also be germanide regions, or silicon germanide regions (e.g., regions comprising silicide and germanide). In some embodiments, the silicide region 110 comprises TiSi, and has a thickness in a range between about 2 nm and about 10 nm.

In FIGS. 27A-E, contacts 112 and 114 (may also be referred to as contact plugs) are formed in the third recesses 108. The contacts 112 and 114 may each comprise one or more layers, such as barrier layers, diffusion layers, and fill materials. For example, in some embodiments, the contacts 112 and 114 each include a barrier layer and a conductive material, and is electrically coupled to the underlying conductive feature (e.g., the gate electrode 102 and/or silicide region 110 in the illustrated embodiment). The contacts 114 are electrically coupled to the gate electrode 102 and may be referred to as gate contacts, and the contacts 112 are electrically coupled to the silicide regions 110 and may be referred to as source/drain contacts. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106.

Figure 27A:
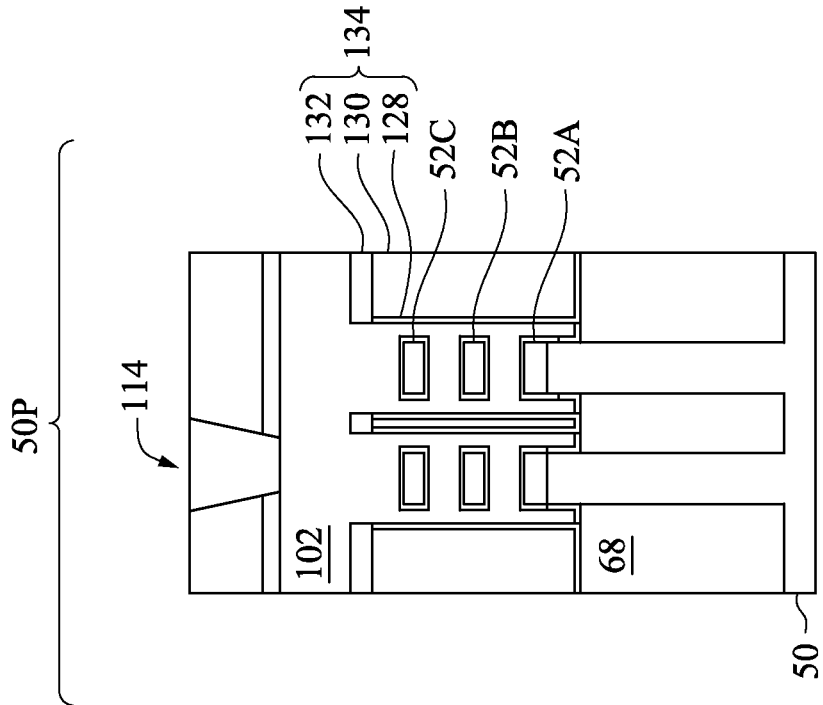
Figure 27A:
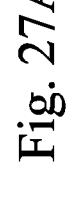
Figure 27A:
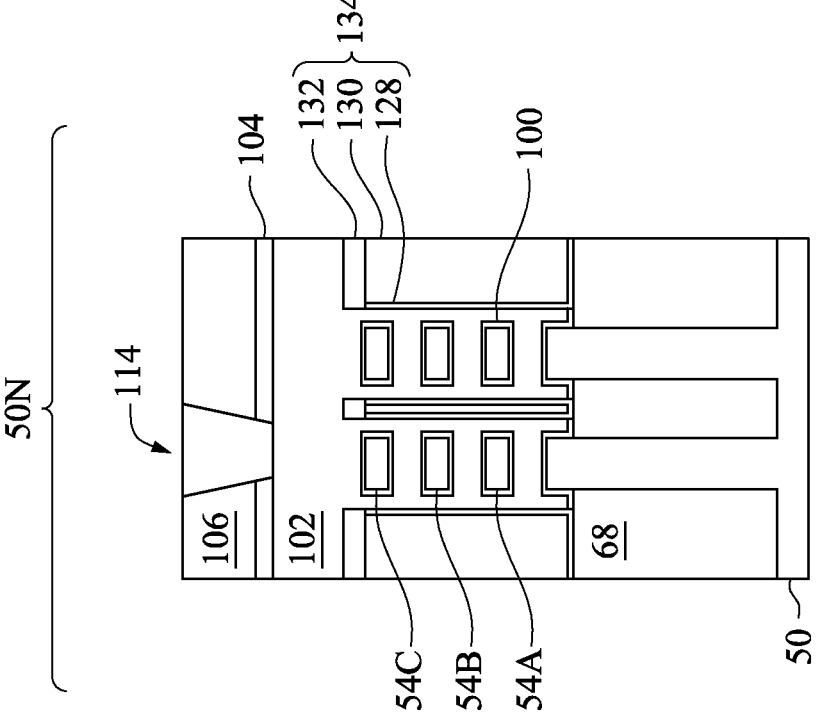
Figure 27B:
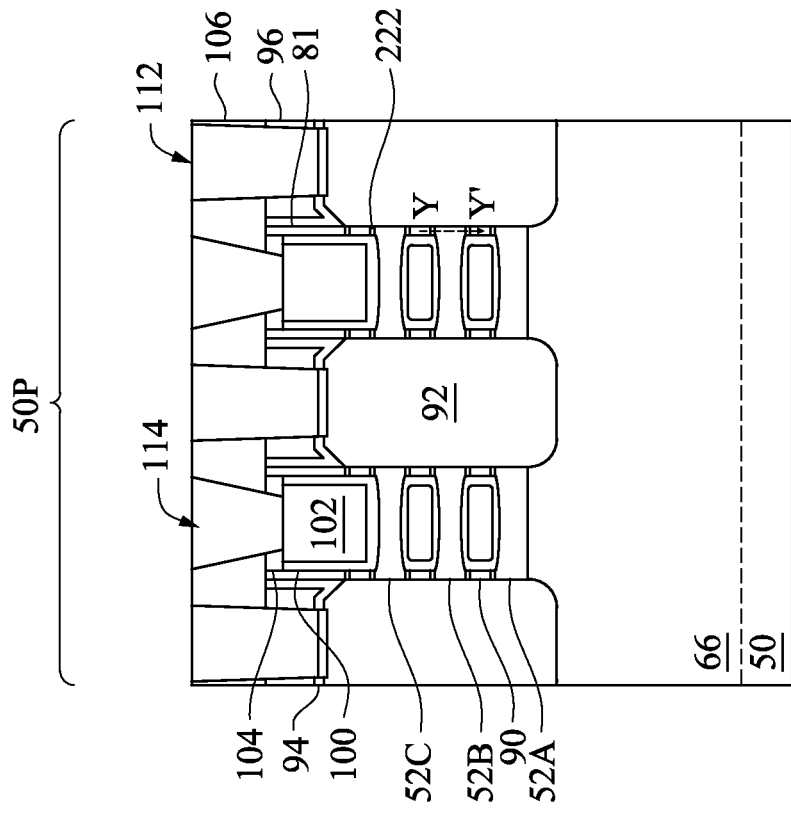
Figure 27B:
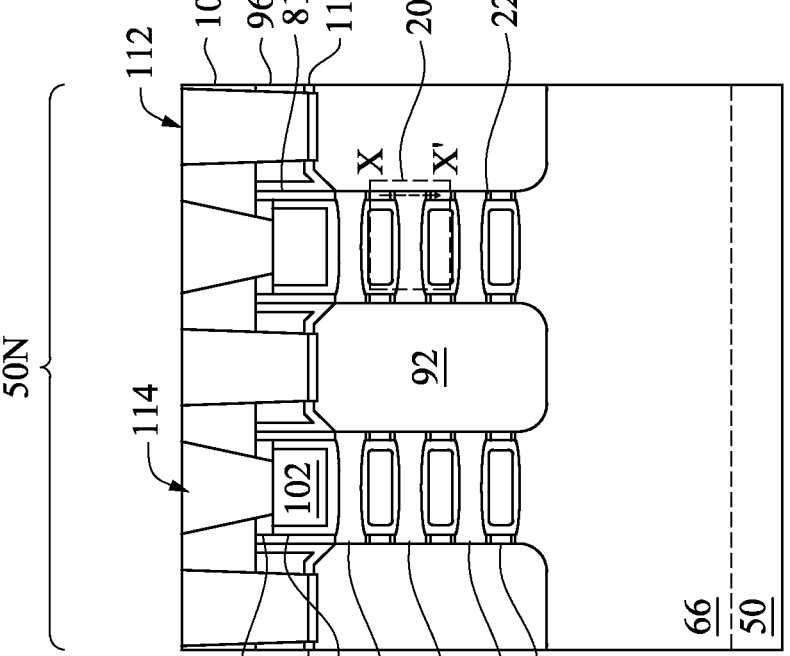
Figure 27C:
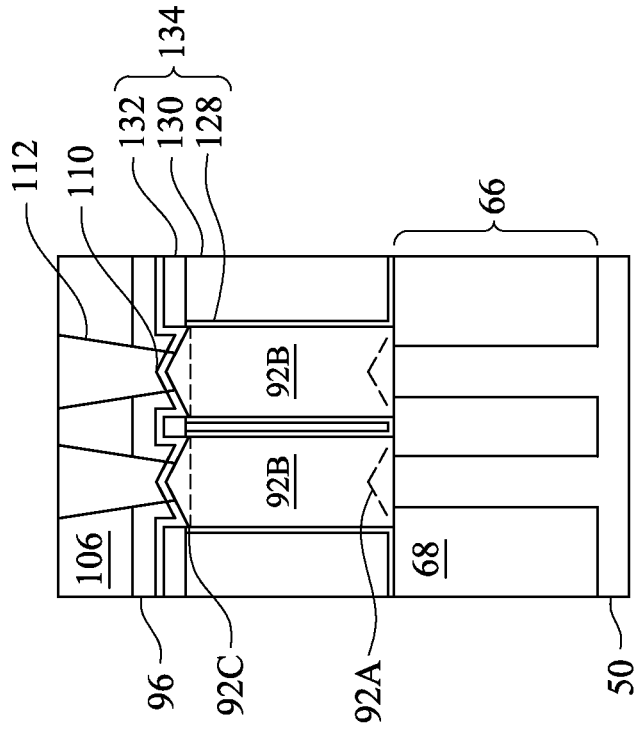
Figure 27E:
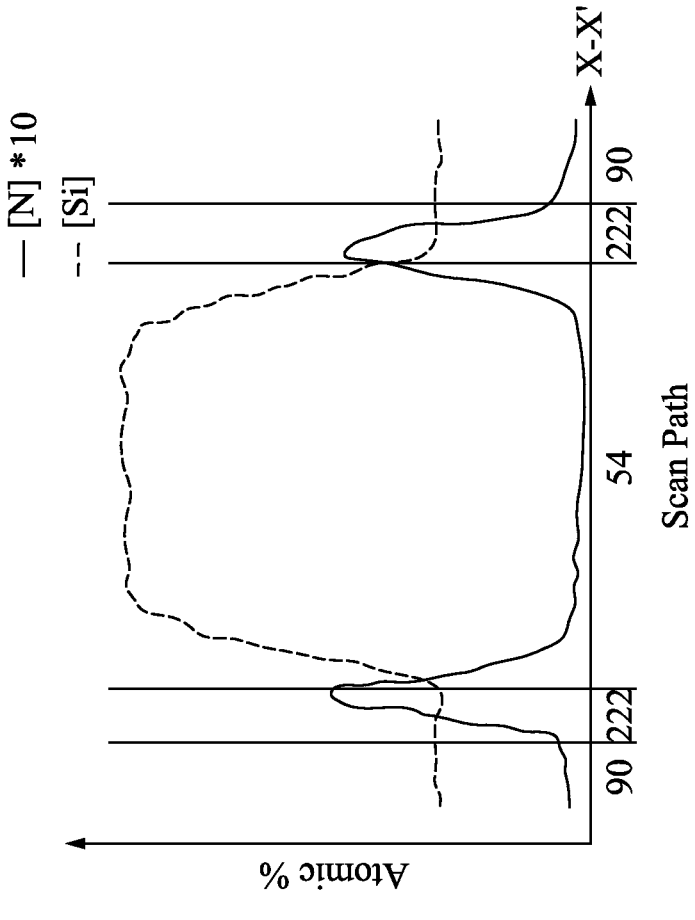
FIG. 27E is a graph depicting relative atomic concentrations in the manufacturing of nanostructure devices, in accordance with some embodiments.
Figure 27D:
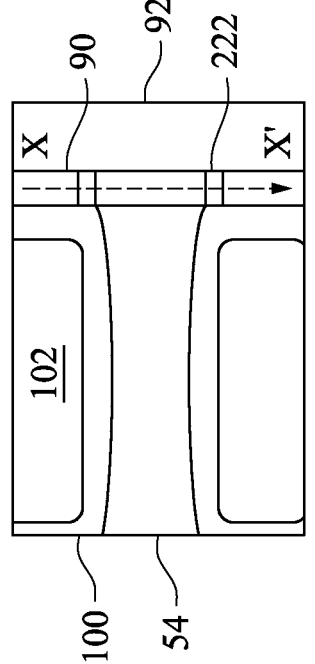

FIG. 27D illustrates a zoomed-in view of region 200 of FIG. 27B, and FIG. 27E is a graph depicting the relative atomic concentrations of nitrogen and silicon along path X-X' as labeled in FIGS. 27B and 27D (see also FIG. 28B). As indicated in the key, the depicted nitrogen concentration is represented ten-fold for the benefit of comparing the nitrogen and silicon concentrations. For example, the graph may represent embodiments in which the inner spacers 90 are silicon oxide, the second nanostructures 54 are silicon, and the second diffusion barrier layer 222 is silicon oxynitride or silicon nitride. In some embodiments, FIG. 27E may also indicate a qualitative depiction of relative atomic concentrations of nitrogen and silicon along path Y-Y' as labeled in FIG. 27B. As further illustrated in FIG. 27E, the nitrogen concentration may range from 2 at. % to 30 at. % depending, for example, on the compositions of adjacent layers.

FIGS. 28A-28C illustrate cross-sectional views of devices according to some embodiments. FIG. 28A illustrates reference cross-section A-A' illustrated in FIG. 1. FIG. 28B illustrates reference cross-section B-B' illustrated in FIG. 1. FIG. 28C illustrates reference cross-section C-C' illustrated in FIG. 1. In addition, like reference numerals indicate like elements formed by like processes as the structure of FIGS. 27A-28C. However, channel regions in the n-type region 50N and the p-type region 50P comprise a same material. For example, the second nanostructures 54 (e.g., comprising silicon) provide channel regions for p-type nanostructure devices in the p-type region 50P and for n-type nanostructure devices in the n-type region 50N. The structure of FIGS. 28A-C may be formed, for example, by removing the first nanostructures 52 from both the p-type region 50P and the n-type region 50N simultaneously; depositing the gate dielectric layers 100 and the gate electrodes 102P (e.g., gate electrode suitable for a p-type nanostructure device) around the second nanostructures 54 in the p-type region 50P; and depositing the gate dielectric layers 100 and the gate electrodes 102N (e.g., a gate electrode suitable for a n-type nanostructure device) around the second nanostructures 54 in the n-type region 50N. In such embodiments, materials of the epitaxial source/drain regions 92 may be different in the n-type region 50N compared to the p-type region 50P as explained above.

Embodiments may achieve advantages. For example, one or more diffusion barrier layers 122/222 formed during fabrication of the semiconductor device may prevent or inhibit diffusion of elements, dopants, and impurities from nearby features into the nanostructures 55 as well as diffusion of elements, dopants, and impurities from the nanostructures 55 into the nearby features. The first diffusion barrier layer 122 may be formed to protect the nanostructures 55 and the fins 66 during, for example, formation of the dummy gate structures. In particular, germanium is inhibited from diffusing toward and building up in regions at or along sidewalls of the nanostructures. In addition, the second diffusion barrier layer 222 may be formed between the endpoints of the nanostructures 55 and the subsequently formed inner spacers 90. In particular, germanium is inhibited from diffusing toward and building up in regions at or along the endpoints of the nanostructures 55 or sidewalls of the subsequently formed epitaxial source/drain regions 92. The resulting semiconductor device (e.g., including one or more nanostructure devices) may be fabricated at increased yield and with improved performance and reliability.

The gate all around (GAA) transistor structures described above may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

In an embodiment, a method of forming a semiconductor device includes: forming a first oxide layer over a semiconductor fin structure; performing a first nitridation process to convert the first oxide layer to an oxynitride layer; depositing a silicon-containing layer over the oxynitride layer; performing a first anneal on the silicon-containing layer, wherein after performing the first anneal, the oxynitride layer has a higher nitrogen atomic concentration at an interface with the semiconductor fin structure than in a bulk region of the oxynitride layer; and forming a dummy gate structure over the silicon-containing layer. In another embodiment, the silicon-containing layer further comprises germanium, and wherein after performing the first anneal the oxynitride layer comprises germanium. In another embodiment, performing the first nitridation process comprises a thermal nitridation performed at temperatures ranging from 700° C. to 1200° C. in an ambient of at least one of $NH_3$, NO, $N_2O$, and $NO_2$. In another embodiment, the method further includes: etching the semiconductor fin structure to form a first recess, a sidewall of the first recess exposing a semiconductor layer and a sacrificial layer of the semiconductor fin structure; etching the sacrificial layer to form a second recess in the sidewall of the first recess; and performing a second nitridation treatment to form a nitrogen-containing layer in the first recess and in the second recess. In another embodiment, the method further includes: forming a dielectric layer over the nitrogen-containing layer in the first recess and in the second recess; etching the nitrogen-containing layer and the dielectric layer, wherein after the etching the nitrogen-containing layer and the dielectric layer, remaining portions of the dielectric layer form an inner spacer in the second recess; and epitaxially growing a source/drain region in the first recess. In another embodiment, the source/drain region comprises germanium, and wherein after the epitaxially growing the source/drain region, the nitrogen-containing layer comprises germanium. In another embodiment, the second nitridation treatment comprises a plasma nitridation performed at a temperature of 20° C. to 700° C. using precursors comprising at least one of $N_2$, $NH_3$, NO, $N_2O$, and $NO_2$.

In an embodiment, a method of forming a semiconductor device includes: forming a fin structure over a substrate, the fin structure comprising a fin and nanostructures disposed over the fin, the nanostructures comprising a sacrificial layer disposed over the fin and a semiconductor layer over the sacrificial layer; etching a first recess in the fin structure to expose a sidewall of the nanostructures; forming a nitrogen-containing layer over a sidewall of the semiconductor layer, and a sidewall of the sacrificial layer; forming a dielectric layer over the nitrogen-containing layer; etching the dielectric layer and the nitrogen-containing layer to expose the sidewall of the semiconductor layer; and forming an epitaxial region in the first recess and directly adjacent to the semiconductor layer. In another embodiment, the method further includes performing a first anneal on the epitaxial region, wherein after the performing the first anneal, the dielectric layer comprises germanium. In another embodiment, the method further includes, prior to forming the nitrogen-containing layer, etching the sacrificial layer to form a second recess in the sidewall of the nano structures, wherein a portion of the nitrogen-containing layer is formed in the second recess, and wherein a portion of the dielectric layer is formed in the second recess. In another embodiment, the method further includes: removing the sacrificial layer to form a third recess interposed between the substrate and the semiconductor layer, wherein the removing the sacrificial layer comprises etching a portion of the nitrogen-containing layer; and forming a gate electrode in the third recess. In another embodiment, the method further includes, before etching the first recess: forming an additional nitrogen-containing layer over the fin structure; forming a germanium-containing layer over the additional nitrogen-containing layer; and forming a dummy gate structure over the fin structure. In another embodiment, the method further includes, after forming the germanium-containing layer and before etching the first recess in the fin, performing a second anneal, wherein after performing the second anneal the additional nitrogen-containing layer comprises germanium. In another embodiment, the method further includes: removing the dummy gate structure; removing the additional nitrogen-containing layer from the fin structure; and forming a replacement gate.

In an embodiment, a semiconductor device includes: a gate dielectric and a conductive material disposed between a first nanostructure and a second nanostructure; a source/drain region physically contacting the first nanostructure and the second nanostructure; a first nitrogen-containing layer disposed adjacent the first nanostructure; a second nitrogen-containing layer disposed adjacent the second nanostructure; and an inner spacer interposed between the gate dielectric and the source/drain region. In another embodiment, the inner spacer is interposed between the first nitrogen-containing layer and the second nitrogen-containing layer. In another embodiment, the first nitrogen-containing layer comprises silicon oxynitride, and wherein the second nitrogen-containing layer comprises silicon oxynitride. In another embodiment, a first portion of the first nitrogen-containing layer at an interface with the first nanostructure has a greater nitrogen concentration than a second portion of the first nitrogen-containing layer distal from the first nanostructure. In another embodiment, the second portion of the first nitrogen-containing layer further comprises germanium. In another embodiment, the inner spacer comprises germanium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:

forming a first oxide layer over a semiconductor fin structure;

performing a first nitridation process to convert the first oxide layer to an oxynitride layer;

depositing a germanium-containing layer over the oxynitride layer;

performing a first anneal on the germanium-containing layer, wherein after performing the first anneal, the oxynitride layer has a higher nitrogen atomic concentration at an interface with the semiconductor fin structure than in a bulk region of the oxynitride layer; and forming a dummy gate structure over the germanium-containing layer.

2. The method of claim 1, wherein after performing the first anneal the oxynitride layer comprises germanium.

3. The method of claim 1, wherein performing the first nitridation process comprises a thermal nitridation performed at temperatures ranging from 700° C. to 1200° C. in an ambient of at least one of $NH_3$, NO, $N_2O$, or $NO_2$.

4. The method of claim 1 further comprising:

etching the semiconductor fin structure to form a first recess, a sidewall of the first recess exposing a semiconductor layer and a sacrificial layer of the semiconductor fin structure;

etching the sacrificial layer to form a second recess in the sidewall of the first recess; and performing a second nitridation treatment to form a nitrogen-containing layer in the first recess and in the second recess.

5. The method of claim 4 further comprising:

forming a dielectric layer over the nitrogen-containing layer in the first recess and in the second recess;

etching the nitrogen-containing layer and the dielectric layer, wherein after the etching the nitrogen-containing layer and the dielectric layer, remaining portions of the dielectric layer form an inner spacer in the second recess; and epitaxially growing a source/drain region in the first recess.

6. The method of claim 5, wherein the source/drain region comprises germanium, and wherein after the epitaxially growing the source/drain region, the nitrogen-containing layer comprises germanium.

7. The method of claim 6, wherein the second nitridation treatment comprises a plasma nitridation performed at a temperature of 20° C. to 700° C. using precursors comprising at least one of $N_2$, $NH_3$, NO, $N_2O$, and $NO_2$.

8. A method of forming a semiconductor device, the method comprising:

forming a fin structure over a substrate, the fin structure comprising a fin and nanostructures disposed over the fin, the nanostructures comprising a sacrificial layer disposed over the fin and a semiconductor layer over the sacrificial layer;

etching a first recess in the fin structure to expose a sidewall of the nanostructures;

forming a nitrogen-containing layer over a sidewall of the semiconductor layer, and a sidewall of the sacrificial layer;

forming a dielectric layer over the nitrogen-containing layer;

etching the dielectric layer and the nitrogen-containing layer to expose the sidewall of the semiconductor layer;

forming an epitaxial region in the first recess and directly adjacent to the semiconductor layer; and performing a first anneal on the epitaxial region, wherein after the performing the first anneal, the dielectric layer comprises germanium.

9. The method of claim 8 further comprising, prior to forming the nitrogen-containing layer, etching the sacrificial layer to form a second recess in the sidewall of the nanostructures, wherein a portion of the nitrogen-containing layer is formed in the second recess, and wherein a portion of the dielectric layer is formed in the second recess.

10. The method of claim 8 further comprising:

removing the sacrificial layer to form a third recess interposed between the substrate and the semiconductor layer, wherein the removing the sacrificial layer comprises etching a portion of the nitrogen-containing layer; and forming a gate electrode in the third recess.

11. The method of claim 8 further comprising, before etching the first recess:

forming an additional nitrogen-containing layer over the fin structure;

forming a germanium-containing layer over the additional nitrogen-containing layer; and forming a dummy gate structure over the fin structure.

12. The method of claim 11 further comprising, after forming the germanium-containing layer and before etching the first recess in the fin, performing a second anneal, wherein after performing the second anneal the additional nitrogen-containing layer comprises germanium.

13. The method of claim 11 further comprising:

removing the dummy gate structure;

removing the additional nitrogen-containing layer from the fin structure; and forming a replacement gate.

14. A method of forming a semiconductor device, the method comprising:

forming a first oxide layer over first sidewalls of a semiconductor fin structure;

performing a first nitridation process to convert the first oxide layer to an oxynitride layer;

depositing a germanium-containing layer over the oxynitride layer;

performing a first anneal on the germanium-containing layer, wherein after performing the first anneal, the oxynitride layer has a higher nitrogen atomic concentration at an interface with the semiconductor fin structure than in a bulk region of the oxynitride layer;

forming a dummy gate structure over the germanium-containing layer;

etching the semiconductor fin structure to form a source/drain recess; and forming a source/drain region in the source/drain recess.

15. The method of claim 14, further comprising, before etching the semiconductor fin structure to form the source/drain recess:

depositing a first gate spacer layer over the oxynitride layer; and etching the first gate spacer layer and the oxynitride layer to expose an upper surface of the semiconductor fin structure.

16. The method of claim 14, further comprising, before forming the source/drain region:

forming a first dielectric layer over second sidewalls of the semiconductor fin structure in the source/drain recess, an exposed surface of the first dielectric layer being a nitride;

forming a second dielectric layer over the first dielectric layer; and etching the second dielectric layer and the first dielectric layer to expose a portion of the second sidewalls of the semiconductor fin structure.

17. The method of claim 16, wherein the first nitridation process comprises a thermal nitridation performed at temperatures ranging from 700° C. to 1200° C.

18. The method of claim 17, wherein the thermal nitridation comprises an ambient of at least one of $NH_3$, NO, $N_2O$, or $NO_2$.

19. The method of claim 16, wherein forming the second dielectric layer comprises:

forming a second oxide layer; and performing a second nitridation process on the second oxide layer.

20. The method of claim 19, wherein the second nitridation process comprises a plasma nitridation performed at temperatures ranging from room temperature to 700° C.

* * * * *